US007090959B2

(12) United States Patent
Shimomura et al.

(10) Patent No.: US 7,090,959 B2
(45) Date of Patent: Aug. 15, 2006

(54) MULTICOLOR IMAGE FORMING MATERIAL AND METHOD OF MULTICOLOR IMAGE FORMING METHOD

(75) Inventors: Akihiro Shimomura, Shizuoka (JP); Yuichi Shirasaki, Shizuoka (JP); Hideyuki Nakamura, Shizuoka (JP); Susumu Sugiyama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/498,992

(22) PCT Filed: Dec. 18, 2002

(86) PCT No.: PCT/JP02/13253

§ 371 (c)(1),
(2), (4) Date: Jun. 18, 2004

(87) PCT Pub. No.: WO03/051646

PCT Pub. Date: Jun. 26, 2003

(65) Prior Publication Data

US 2005/0123869 A1 Jun. 9, 2005

(30) Foreign Application Priority Data

| | | | |
|---|---|---|---|
| Dec. 19, 2001 | (JP) | ............................. | 2001-386295 |
| Dec. 21, 2001 | (JP) | ............................. | 2001-389903 |
| Dec. 21, 2001 | (JP) | ............................. | 2001-390475 |
| Feb. 14, 2002 | (JP) | ............................. | 2002-036566 |
| May 31, 2002 | (JP) | ............................. | 2002-158744 |

(51) Int. Cl.

| | |
|---|---|
| ***G03F 7/34*** | (2006.01) |
| ***G03F 7/09*** | (2006.01) |
| ***B41M 5/00*** | (2006.01) |

(52) U.S. Cl. .................. 430/200; 430/201; 428/32.39; 428/32.5

(58) Field of Classification Search ................ 430/200, 430/201; 428/32.39, 32.5
See application file for complete search history.

(56) References Cited

U.S. PATENT DOCUMENTS

| | | | | |
|---|---|---|---|---|
| 5,580,693 | A | 12/1996 | Nakajima et al. | |
| 5,607,809 | A | 3/1997 | Nakamura et al. | |
| 6,326,055 | B1 * | 12/2001 | Arai et al. .................. | 427/195 |
| 6,326,121 | B1 | 12/2001 | Takahashi | |
| 6,773,860 | B1 * | 8/2004 | Kuroki et al. .............. | 430/200 |
| 2002/0009664 | A1 * | 1/2002 | Wachi et al. ............... | 430/200 |
| 2002/0164461 | A1 * | 11/2002 | Katsuoka et al. ........... | 428/195 |

FOREIGN PATENT DOCUMENTS

| | | | |
|---|---|---|---|
| JP | 6-79980 | A | 3/1994 |
| JP | 6-122280 | A | 5/1994 |
| JP | 8-267944 | A | 10/1996 |
| JP | 9-169165 | A | 6/1997 |
| JP | 10-278442 | A | 10/1998 |
| JP | 11-58999 | A | 3/1999 |
| JP | 11-291647 | A | 10/1999 |

(Continued)

*Primary Examiner*—Richard L. Schilling
(74) *Attorney, Agent, or Firm*—Sughrue Mion, PLLC

(57) ABSTRACT

It is intended to provide a multicolor image forming material for laser heat transfer comprising an image receiving sheet having an image receiving layer and at least four heat transfer sheets having different colors each comprising a substrate and a light-heat conversion layer and an image forming layer provided thereon, characterized in that (a) Ra and Rz showing the surface roughness of the image receiving sheet satisfy the following relationships $3 \leqq Rz/Ra \leqq 20$ and $0.5\ \mu m \leqq Rz \leqq 3\ \mu m$.

3 Claims, 6 Drawing Sheets

FOREIGN PATENT DOCUMENTS

| | | | |
|---|---|---|---|
| JP | 2000-127635 | A | 5/2000 |
| JP | 2000-141722 | A | 5/2000 |
| JP | 2000-351279 | A | 12/2000 |
| JP | 2001-10244 | A | 1/2001 |
| JP | 2001-105752 | A | 4/2001 |
| JP | 2001-199170 | A | 7/2001 |

* cited by examiner

MULTICOLOR IMAGE FORMING MATERIAL AND METHOD OF MULTICOLOR IMAGE FORMING METHOD

TECHNICAL FIELD

This invention relates to a multicolor image formation method whereby a full color image with high resolution is formed by using laser light. More particularly, it relates to a multicolor image forming material and a multicolor image formation method which are useful in forming color proofs (direct digital color proofs (DDCPs)) or mask images form digital image signals by laser recording in the field of printing.

BACKGROUND ART

In the field of graphic arts, a printing plate is produced using a set of color separation films of a color original which are prepared using lithographic films. In general, color proofs are prepared from color separation films in order to inspect for errors in the color separation step and to check the need for color correction and the like before the main printing (practical printing operation). Color proofs are required to realize high resolution enabling accurate half tone reproduction, high processing stability and so on. To obtain color proofs close to actual prints, it is desirable for the materials of color proofs to be the same as those used on press, for example, the same paper as the base and the same pigments as colorants. There is a higher demand for a dry process involving no developing solution for the preparation of color proofs.

With the recent spread of computerized systems in pre-press work, recording systems for preparing color proofs directly from digital signals (dry process) have been developed. Such computerized systems, particularly contemplated for preparing high quality color proofs, are generally capable of reproducing dot images at 150 lines or more per inch. In order to obtain high quality proofs from digital signals, a laser beam is used as a recording head, which is capable of modulation according to digital signals and focusing into a small spot diameter. Hence it is demanded to develop image forming elements that exhibit high recording sensitivity to laser light and high resolution enabling reproduction of highly precise dot images.

Recording materials known useful in laser transfer methods include a heat melt transfer sheet, which comprises a substrate, a light-heat conversion layer capable of absorbing laser light to generate heat, and an image forming layer having a pigment dispersed in a heat fusible component (e.g., a wax or a binder) in the order described, as disclosed in JP-A-5-58045. In the image formation method using such recording materials, a laser-irradiated area of the light-heat conversion layer generates heat to melt the image forming layer corresponding to the area, and the molten part of the image forming layer is transferred to the image receiving sheet laminated on the transfer sheet, thereby forming a transfer image on the image receiving sheet.

JP-A-6-219052 discloses a heat transfer sheet comprising a substrate, a light-heat conversion layer containing a light-heat converting substance, a highly thin heat release layer (0.03 to 0.3 μm), and an image forming layer containing a colorant. In the case of this heat transfer sheet, the heat release layer reduces its bonding strength between the image forming layer and the light-heat conversion layer upon being irradiated with laser light. As a result, a high precision transfer image is formed on an image receiving sheet laminated on the heat transfer sheet to form. The above-described image formation method with the use of a heat transfer sheet utilizes a phenomenon so-called "ablation". That is, a laser-irradiated area of the heat release layer partly decomposes and vaporizes, resulting in reduction of the strength bonding the image forming layer and the light-heat conversion layer in that area. As a result, the image forming layer of that area is transferred to the image receiving sheet having the image receiving layer laminated thereon.

These imaging formation methods are advantageous in that use can be made of printing paper having an image receiving layer (adhesive layer) as an image receiving sheet material, that a multicolor image can easily be obtained by successively transferring images of different colors onto the same image receiving sheet, and so on. The method utilizing ablation is particularly advantageous for ease of forming a highly precise image and is useful to prepare color proofs (DDCPs: direct digital color proofs) or precise mask images.

With the spread of DPT work, printing companies adopting a computer-to-plate (CTP) system have a strong demand for a DDCP system, which eliminates the need of intermediate film or plate output as has been involved in traditional analog proofing. In recent years, DDCPs with higher qualities, higher stability, and larger sizes have been demanded as good approximations to the final prints.

Laser heat transfer systems, whereby images at high resolution can be formed formation, include (1) a laser sublimation system, (2) a laser ablation system, (3) a laser melt system, etc., though each of which has the problem that the recorded dot shape is not sharp enough. In the laser sublimation system (1), dyes are used as colorants, which results in such problems as insufficient final print approximation and blurred dot outlines due to dye sublimation, thereby failing to achieve sufficiently high-resolution. In the laser ablation system, on the other hand, pigments are used as colorants and thus a satisfactory final print approximation can be achieved. However, the dots are also blurred and only insufficient resolution can be obtained similarly to the dye sublimation system because of the involvement of colorant scattering. The laser melt system (3) also fails to create clear dot outlines because the molten colorant flows.

In image recording systems using laser light, use has been recently made of laser light comprising multibeam, i.e., a plurality of laser beams to shorten the recording time. When an image is recorded using multibeam laser light, however, it is sometimes observed that the transferred image formed on an image receiving sheet has an insufficient image density. A particularly remarkable decrease in the image density arises in the case of recording high-energy laser. As the results of discussions by the inventor, it is found out that the decrease in the image density is caused by uneven transfer occurring in high-energy laser irradiation.

The image receiving layer of the image receiving sheet contains a matting agent to ensure vacuum contact to the heat transfer sheet. Thus, the clearance is controlled to prevent transfer errors such as white image spots and dot defects caused by unevenness on the recording drum or dust or debris. However, a liquid coating composition containing the matting agent undergoes sedimentation with the passage of time, which results in unevenness in the performance of the image receiving sheet. As a result, there arises a problem that the transfer errors such as white image spots and dot defects cannot be sufficiently prevented.

There are additional problems such that the transfer properties onto wood-free paper (paper with high surface roughness) still remains insufficient and that the image surface is sticky after transferred onto printing paper.

There is an additional problem that so-called "picking" occurs by image defects or poor transfer release due to dust or debris in transfer onto printing paper.

Furthermore, there is a problem that only an insufficient register accuracy is achieved, thus causing image distortion.

DISCLOSURE OF THE INVENTION

An object of the present invention is to solve the above problems occurring in the prior art and provide a multicolor image forming material and a multicolor image formation method whereby a high quality, high stability, and large size DDCP having a good final print approximation can be obtained. More specifically speaking, an object of the present invention is to provide a multicolor image forming material and a multicolor image formation method having the following characteristics: 1) in thin film transfer of colorants, a heat transfer sheet being excellent in dot sharpness and stability without being affected by an illumination color source when compared with pigment colorants and prints; 2) an image receiving sheet stabilizing the image forming layer of a laser energy heat transfer sheet and ensuring image receiving; 3) enabling transfer onto printing papers including art (coated) paper, mat paper, coated fine paper and so on within range of at least 64 to 157 $g/m^2$ and ensuring the reproduction of delicate textures and accurate paper brightness (high-key parts); and 4) being capable of forming images, which have excellent image qualities and stable transfer density, on an image receiving sheet even in the case of high-energy laser recording with multibeam laser light under various temperature and humidity conditions.

Among all, an object of the present invention is to provide a multicolor image forming material having an image receiving sheet which suffers from little white image spots and dot defects caused by unevenness on the recording drum or dust or debris.

Another object of the present invention is to provide a multicolor image forming material which has favorable transfer properties onto wood-free paper (paper with high surface roughness) employed as printing paper, shows no stickiness on the image surface after transfer onto the printing paper, and is excellent in blocking resistance in the case of piling up transferred images together.

Still another object of the present invention is to provide a multicolor image forming material which suffers from no so-called picking caused by image defects due to dust or debris or insufficient transfer releasing in the step of transfer onto printing paper.

Still another object of the present invention is to provide a multicolor image forming material which is excellent in register accuracy and causes no image distortion.

Moreover, the present invention aims at providing a multicolor mage formation method by using these multicolor image forming materials thus provided.

That is to say, means of achieving the above-described objects are as follows.

<1> A multicolor image forming material for laser heat transfer comprising an image receiving sheet having an image receiving layer and at least four heat transfer sheets having different colors including yellow, magenta, cyan and black each comprising a substrate and a light-heat conversion layer and an image forming layer provided thereon, characterized in that Ra and Rz showing the surface roughness of the image receiving sheet satisfy the following relationships $3 \leqq Rz/Ra \leqq 20$ and $0.5\ \mu m \leqq Rz \leqq 3\ \mu m$.

<2> A multicolor image forming material as described in the above <1> characterized in that the surface roughness of the image receiving sheet is formed by using Benard cells.

<3> A multicolor image forming material as described in the above <1> or <2> characterized in that the image receiving layer of the image receiving sheet is formed by using a liquid coating composition for image receiving layer which contains an organic solvent having a boiling point of 70° C. or lower in an amount of 30% by mass or more based on the total organic solvents employed and has a viscosity of 15 mPa·S or more.

<4> A multicolor image forming material comprising an image receiving sheet having a substrate and a cushion layer and an image receiving layer provided thereon and at least four heat transfer sheets having different colors including yellow, magenta, cyan and black each comprising a substrate and at least a light-heat conversion layer and an image forming layer provided thereon, each of the heat transfer sheets being adapted to be superposed on the image receiving sheet with the image forming layer facing the image receiving layer and irradiated with laser light to transfer the irradiated area of the image forming layer to the image receiving layer to record a multicolor image on the image receiving sheet, characterized in that:

(a) the image forming layer of each of the heat transfer sheets has an optical density (OD) to film thickness ratio (OD/film thickness) of 1.50 or more;

(b) each of the heat transfer sheets has a multicolor image recording area size of from 515 mm×728 mm or more;

(c) the resolution of the image transferred onto the image receiving layer of the image receiving sheet is 2400 dpi or more;

(d) the elastic modulus of the image receiving layer of the image receiving sheet is from 2 to 1200 MPa; and (e) the elastic modulus of the cushion layer of the image receiving sheet is from 10 to 300 MPa.

<5> A multicolor image forming material as described in the above <4> characterized in that the image forming layer in the laser-irradiated area is transferred in the sate of a thin film onto the image receiving sheet.

<6> A multicolor image forming material as described in the above <4> or <5> characterized in that the heat transfer sheets comprise at least four heat transfer sheets of yellow, magenta, cyan and black.

<7> A multicolor image forming material as described in any of the above <4> to <6> characterized in that the resolution of the transferred image is 2600 dpi or more.

<8> A multicolor image forming material as described in any of the above <4> to <7> characterized in that the image forming layer of each of the heat transfer sheets has an optical density (OD) to film thickness ratio (OD/film thickness) of 1.80 or more.

<9> A multicolor image forming material as described in the above <8> characterized in that the image forming layer of each of the heat transfer sheets has an optical density (OD) to film thickness ratio (OD/film thickness) of 2.50 or more.

<10> A multicolor image forming material as described in any of the above <4> to <9> characterized in that the image forming layer of each of the heat transfer sheets and the image receiving layer of the image receiving sheet have each a contact angle to water ranging from 7.0 to 120.0°.

<11> A multicolor image forming material as described in any of the above <4> to <10> characterized in that each of the heat transfer sheets has a multicolor image recording area size of from 594 mm×841 mm or more.

<12> A multicolor image forming material as described in any of the above <4> to <11> characterized in that the image forming layer of each of the heat transfer sheets has an optical density (OD) to film thickness ratio (OD/film thickness) of 1.80 or more and the image receiving sheet has a contact angle to water of 86° or less.

<13> A multicolor image forming material comprising an image receiving sheet having a substrate and a cushion layer and an image receiving layer provided thereon and at least four heat transfer sheets having different colors including yellow, magenta, cyan and black each comprising a substrate and at least a light-heat conversion layer and an image forming layer provided thereon, each of the heat transfer sheets being adapted to be superposed on the image receiving sheet with the image forming layer facing the image receiving layer and irradiated with laser light to transfer the irradiated area of the image forming layer to the image receiving layer to record a multicolor image on the image receiving sheet, characterized in that:

(a) the image forming layer of each of the heat transfer sheets has an optical density (OD) to film thickness ratio (OD/film thickness) of 1.50 or more;

(b) each of the heat transfer sheets has a multicolor image recording area size of from 515 mm×728 mm or more;

(c) the resolution of the image transferred onto the image receiving layer of the image receiving sheet is 2400 dpi or more;

(d) the elastic modulus of the cushion layer of the image receiving sheet is from 10 to 1000 MPa; and (e) the interlayer adhesion force between the image receiving layer and the cushion layer of the image receiving sheet is from 1 to 10 g/cm (0.0098 to 0.098 N/cm).

<14> A multicolor image forming material as described in the above <13> characterized in that the image forming layer in the laser-irradiated area is transferred in the sate of a thin film onto the image receiving sheet.

<15> A multicolor image forming material as described in the above <13> or <14> characterized in that the heat transfer sheets comprise at least four heat transfer sheets of yellow, magenta, cyan and black.

<16> A multicolor image forming material as described in any of the above <13> to <15> characterized in that the resolution of the transferred image is 2600 dpi or more.

<17> A multicolor image forming material as described in any of the above <13> to <16> characterized in that the image forming layer of each of the heat transfer sheets has an optical density (OD) to film thickness ratio (OD/film thickness) of 1.80 or more.

<18> A multicolor image forming material as described in the above <17> characterized in that the image forming layer of each of the heat transfer sheets has an optical density (OD) to film thickness ratio (OD/film thickness) of 2.50 or more.

<19> A multicolor image forming material as described in any of the above <13> to <18> characterized in that the image forming layer of each of the heat transfer sheets and the image receiving layer of the image receiving sheet have each a contact angle to water ranging from 7.0 to 120.0°.

<20> A multicolor image forming material as described in any of the above <13> to <19> characterized in that each of the heat transfer sheets has a multicolor image recording area size of from 594 mm×841 mm or more.

<21> A multicolor image forming material as described in any of the above <13> to <20> characterized in that the image forming layer of each of the heat transfer sheets has an optical density (OD) to film thickness ratio (OD/film thickness) of 1.80 or more and the image receiving sheet has a contact angle to water of 86° or less.

<22> A material for forming a multicolor image comprising an image receiving sheet having an image receiving layer and at least four heat transfer sheets having different colors including yellow, magenta, cyan and black each comprising a substrate and at least a light-heat conversion layer and an image forming layer provided thereon, each of the heat transfer sheets being adapted to be superposed on the image receiving sheet with the image forming layer facing the image receiving layer and irradiated with laser light to transfer the irradiated area of the image forming layer to the image receiving layer to record a multicolor image on the image receiving sheet, characterized in that:

(a) the image forming layer of each heat transfer sheet has a film thickness of 0.01 to 1.5 μm;

(b) the yield stress in the machine direction (M) and the yield stress in the transverse direction (T) of the image receiving sheet are both from 30 to 100 MPa;

(c) the ratio of the yield stress in the machine direction (M) to the yield stress in the transverse direction (T) of the image receiving sheet (M/T) is from 0.9 to 1.20; and (d) the elongation in the machine direction and the elongation in the transverse direction of the image receiving sheet are both from 1 to 5%.

<23> A multicolor image forming material as described in the above <22> characterized in that the ratio of the elongation in the machine direction to the elongation in the transverse direction of the image receiving sheet is 1.2 or less.

<24> A multicolor image forming material as described in the above <22> or <23> characterized in that the resolution of the transferred image is 2400 dpi or more.

<25> A multicolor image forming material as described in the above <22> or <23> characterized in that the resolution of the transferred image is 2600 dpi or more.

<26> A multicolor image forming material as described in any of the above <22> to <25> characterized in that the heat transfer sheets comprise at least four heat transfer sheets of yellow, magenta, cyan and black.

<27> A multicolor image forming material as described in any of the above <22> to <26> characterized in that the image forming layer of each of the heat transfer sheets has an optical density (OD) to film thickness ratio (OD/film thickness) of 1.50 or more.

<28> A multicolor image forming material as described in the above <27> characterized in that the image forming layer of each of the heat transfer sheets has an optical density (OD) to film thickness ratio (OD/film thickness) of 1.80 or more.

<29> A multicolor image forming material as described in the above <27> characterized in that the image forming layer of each of the heat transfer sheets has an optical density (OD) to film thickness ratio (OD/film thickness) of 2.50 or more.

<30> A multicolor image forming material as described in any of the above <22> to <29> characterized in that the image forming layer of each of the heat transfer sheets and the image receiving layer of the image receiving sheet have each a contact angle to water ranging from 7.0 to 120.0°.

<31> A multicolor image forming material as described in any of the above <22> to <30> characterized in that each of the heat transfer sheets has a multicolor image recording area size of from 515 mm×724 mm or more.

<32> A multicolor image forming material as described in the above <31> characterized in that each of the heat transfer sheets has a multicolor image recording area size of from 594 mm×841 mm or more.

<33> A multicolor image forming material as described in any of the above <22> to <32> characterized in that the image forming layer of each of the heat transfer sheets has an optical density (OD) to film thickness ratio (OD/film thickness) of 1.80 or more and the image receiving sheet has a contact angle to water of 86° or less.

<34> A multicolor image forming material as described in any of the above <22> to <33> characterized in that the image receiving sheet comprises a substrate and a cushion layer and an image receiving layer provided thereon and the elastic modulus of the cushion layer ranges from 100 to 300 MPa.

<35> A multicolor image formation method comprising the step of using a multicolor image forming material comprising an image receiving sheet having an image receiving layer and at least four heat transfer sheets having different colors including yellow, magenta, cyan and black each comprising a substrate and at least a light-heat conversion layer and an image forming layer provided thereon; superposing each of the heat transfer sheets being on the image receiving sheet with the image forming layer facing the image receiving layer; and irradiating with laser light to transfer the irradiated area of the image forming layer to the image receiving layer to record a multicolor image on the image receiving sheet, characterized in that the multicolor image forming material is a multicolor image forming material as described in any of the above <1> to <34>.

<36> A multicolor image formation method as described in theabove<35> characterized in that the light-heat conversion layer of each heat transfer sheet is softened by the laser irradiation and thus the image forming layer on the light-heat conversion layer is pushed up and transferred as a thin film onto the image receiving layer of the image receiving sheet.

BEST MODE FOR CARRYING OUT THE INVENTION

Figure 1A:
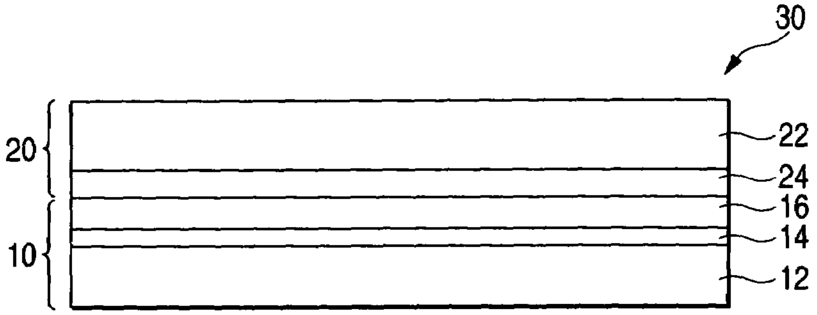
FIG. 1 provides a drawing showing a scheme for the mechanism of forming a multicolor image by the then film heat transfer using laser light.

We previously studied to provide DDCPs of B2/A2 or larger sizes and even of B1/A1 or larger sizes while retaining high image quality, high quality stability, and satisfactory approximation to an actual finished level. As a result, we developed a laser heat transfer recording system for DDCP, which uses an image forming element characterized by capability of image transfer to the same paper as printing paper, capability of outputting true halftone dots, use of pigments as a colorant, and large sizes of B2 or larger together with an output device and a high quality CMS software.

Performance features, system configuration and technical merits of the laser heat recording system developed by us reside in: (1) sharp dot formation, which offers a favorable approximation to final prints; (2) a satisfactory hue approximation to final prints; (3) stable proof quality owing to performance stability scarcely affected by environmental temperature and humidity and high repetition reproducibility; and (4) an image receiving sheet capable of stably and surely receiving an image forming layer of a laser energy heat transfer sheet. From the viewpoint of material design, technical key points that allow the achievement of these characteristics in performance are establishment of thin film transfer technology and improvements in the capability of holding vacuum contact, follow-up property for high resolution recording and heat resistance required in laser heat transfer system materials More specifically, the following points may be cited: (1) introduction of an infrared absorbing colorant, which permits thickness reduction of a light-heat conversion layer; (2) introduction of a high-Tg polymer, which enhances heat resistance of a light-heat conversion layer; (3) introduction of a heat-resistant pigment, which leads to hue stabilization; (4) addition of a low-molecular component, such as a wax and an inorganic pigment, which controls adhesion and cohesion forces; (5) addition of a matting agent to a light-heat conversion layer, which ensures intimate adhesion to an image receiving sheet without causing image quality deterioration, and so on. From the viewpoint of system design, on the other hand, technical key points reside in: (1) an air ejection system adopted to a recording apparatus, with which a plurality of sheets can be stacked; (2) the manner of inserting a sheet of printing paper a heat transfer apparatus, which is effective to prevent the printing paper from curling after heat transfer; (3) connection to a general-purpose output drive which allows broadening of system configuration freedom, and so on.

Significance of the present invention in the above-mentioned system developed by us resides in providing a multicolor image forming material and a multicolor image formation method suited to the above-described system. Among all, the first aspect of the present invention is of high importance particularly in providing a multicolor image forming material comprising an image receiving sheet with little transfer errors such as white image spots and dot defects caused by unevenness on the recording drum or dust or debris.

The multicolor image forming material according to the first aspect of the present invention is a multicolor image forming material for laser heat transfer which is specified depending on the surface unevenness, i.e., surface roughness defined by the values Ra and Rz.

The surface roughness Ra means a center-line average surface roughness Ra which is measured in accordance with JIS B0601. On the other hand, Rz is a 10 point height parameter corresponding to the Rz (maximum height) specified in JIS B 0601. The surface roughness Rz is obtained by computing the average height difference between the five highest peaks and the five lowest valleys with respect to the mean plane within an evaluation area. A stylus type 3D roughness meter (Surfcom 570A-3DF, available from Tokyo Seimitsu Co., Ltd.) is used for measuring Ra and Rz. The measurement is performed in the longitudinal direction, the cut-off length is 0.08 mm, the evaluation area is 0.6 mm by 0.4 mm, the sampling pitch is 0.005 mm, and the speed of measurement is 0.12 mm/sec. In the description of the present case, Ra and Rz are defined in the same manner as described above.

In the present invention, the image receiving sheet surface is controlled so as to satisfy the following relationships, i.e., $3 \leqq Rz/Ra \leqq 20$ and $0.5\ \mu m \leqq Rz \leqq 3\ \mu m$, preferably $2 \leqq Rz/Ra \leqq 10$ and $0.7\ \mu m \leqq Rz \leqq 2\ \mu m$, still preferably $4 \leqq Rz/Ra \leqq 8$ and $0.8\ \mu m \leqq Rz \leqq 1.5\ \mu m$.

By controlling the surface unevenness of the image receiving sheet, the adhesion between the image receiving sheet and the heat transfer sheets can be enhanced. As a result, white image spots caused by unevenness on the recording drum or dust or debris scarcely occur and dot defects are lessened, thereby achieving a clearance with improved uniformity.

The Ra and Rz values as described above may be controlled by arbitrary methods without restriction. Generally known methods therefor include post-treatments such as embossing, addition of a matting agent to a coating layer, and use of Benard cells. The method with the use of Benard cells is preferred. This is because in the method with the use of Benard cells, sedimentation of particles in a liquid coating composition can be well prevented and a stable image receiving sheet can be obtained compared with the method of adding a matting agent or the like. It is preferable that the surface unevenness of the image receiving sheet is provided on the surface of the image receiving layer.

The term "Benard cells" as used herein means a phenomenon giving a not smooth but uneven coating face just like orange peel in the case of coating (Toso no Jiten, Asakura Shoten).

In the present case, it is assumed that, in the drying step for forming the image receiving layer, there arises' a difference in concentration within the liquid coating composition due to convention and, in its turn, there also arises a difference in surface tension which results in the cell-like unevenness on the surface.

Concerning a method of forming Benard cells on the image receiving layer surface, desired uneven Benard cells can be obtained by appropriately controlling the surface tension, viscosity, solvent boiling point, solid content, coating amount, etc. of the liquid coating composition for forming the image receiving layer. It is preferable not to use a fluorine-based surfactant or a silicone-based surfactant which enhance the leveling effect of the liquid coating composition.

Now, the liquid coating composition for forming the image receiving layer will be illustrated. The surface tension is preferably 20 mN/m or more, still preferably from 22 to 25 mN/m. The viscosity is preferably from 15 mPa·S or more, still preferably from 15 to 40 mPa·S and particularly preferably from 20 to 30 mPa·S. The solid content is preferably from 3 to 10%, still preferably from 5 to 8%. The coating amount preferably ranges from 30 to 100 ml/$m^2$, still preferably from 40 to 70 ml/$m^2$. Concerning the organic solvent to be employed, it is preferable to use an organic solvent having a boiling point of 70° C. or lower in an amount of 30% by mass or more, still preferably 40% by mass or more, based on the total organic solvents employed.

As the second aspect of the present invention, it is intended to provide a multicolor image forming material suitable for the above-described system having been developed by us. Significance of the second aspect of the present invention resides in providing a multicolor image forming material which has favorable transfer properties onto wood-free paper (paper with high surface roughness) employed as printing paper, shows no stickiness on the image surface after transfer onto the printing paper, and is excellent in blocking resistance in the case of piling up transferred images together.

In the second aspect of the present invention, the elastic modulus of the image receiving layer of the image receiving sheet ranges from 2 to 1200 MPa and preferably from 600 to 1000 MPa at room temperature. In the case where the elastic modulus of the image receiving layer falls within the range as specified above, coupled with the factor relating to the elastic modulus of the cushion layer as will be described hereinafter, the transfer properties onto wood-free paper employed as the printing paper are improved and the stickiness of the image face after the transfer onto the printing paper is largely relieved. When the elastic modulus of the image receiving layer exceeds 1200 MPa, defects caused by dust or debris become serious due to the hardness and the adhesion is worsened. When it is less than 2 MPa, on the other hand, the transfer properties and stickiness are not improved. The elastic modulus of the image receiving layer can be controlled by altering the ratio of a binder, etc.

The elastic modulus of the cushion layer ranges from 10 to 300 MPa and preferably from 40 to 250 MPa at room temperature. In the case where the elastic modulus of the cushion layer falls within the range as specified above, coupled with the factor relating to the elastic modulus of the image receiving layer as described above, the transfer properties onto wood-free paper employed as the printing paper are improved and the stickiness of the image face after the transfer onto the printing paper is largely relieved. When the elastic modulus of the cushion layer exceeds 300 MPa, the transfer properties and defects caused by dust or debris are worsened. On the other hand, an elastic modulus of the cushion layer less than 10 MPa causes poor sliding properties and stickiness. The elastic modulus of the cushion layer can be controlled depending on the type of a plasticizer or a binder.

In the second aspect of the present invention, the image receiving sheet is provided with the cushion layer having an appropriate elastic modulus and the image receiving layer having an appropriate elastic modulus. Thus, the transfer properties of a multicolor image, which has been transferred onto the image receiving sheet, to wood-free paper employed as the printing paper are improved and the problem of the stickiness of the image face after the transfer onto the printing paper is solved. As a result, there arises no blocking in the case of piling up transferred image faces of printing paper sheets.

In the third aspect of the present invention, furthermore, it is intended to provide a multicolor image forming material appropriate for the system having been developed by us. Among all, significance of the third aspect of the present invention resides in providing a multicolor image forming material which suffers from no so-called picking caused by image defects due to dust or debris or insufficient transfer releasing in the step of transfer onto printing paper.

In the multicolor image forming material according to the third aspect of the present invention, the cushion layer of the image receiving sheet has an elastic modulus of from 10 to 1000 MPa, preferably from 100 to 1000 MPa and still preferably from 100 to 300 MPa at room temperature. In the case where the elastic modulus of the cushion layer falls within the range as specified above, defects due to dust and debris are lessened and, moreover, the occurrence of so-called "picking" caused by the interlayer adhesion force in the image receiving side overwhelming the cohesive force of paper is prevented. The elastic modulus of the cushion layer can be controlled by altering the binder/plasticizer ratio. In addition, use can be preferably made of a surfactant and so on.

The image receiving layer adheres to the cushion layer until the laser recording step. To easily release the image receiving layer from the cushion layer in the step of transferring an image to the printing paper, it is desirable that the interlayer adhesion force between the image receiving layer and the cushion layer ranges at least from 1 to 10 g/cm (≈0.0098 to 0.098 N/cm) even in the case of forming an intermediate release layer as will be described hereinafter. In the case where the interlayer adhesion force between the image receiving layer and the cushion layer falls within the range as specified above, the transfer of an image onto wood-free paper can be improved. The interlayer adhesion force between the image receiving layer and the cushion layer can be controlled by altering the binder/plasticizer ratio.

In the third aspect of the present invention, the image receiving sheet is provided with the cushion layer having an appropriate elastic modulus as described above and the interlayer adhesion force between the image receiving layer and the cushion layer is adequately set to thereby improve the transfer properties of an image, which has been transferred onto the image receiving sheet, onto wood-free paper.

In the fourth aspect of the present invention, significance of the present invention in the above-mentioned system developed by us resides in providing a multicolor image forming material suited to the above-described system. Among all, the fourth aspect of the present invention is of high importance particular in providing a multicolor image forming material which is excellent in register accuracy and causes no image distortion.

In the multicolor image forming material according to the fourth aspect of the present invention, the image receiving sheet satisfies the following requirements in tensile properties.

(1) The yield stress in the machine direction (M) and the yield stress in the transverse direction (T) of the image receiving sheet are both from 40 to 70 MPa.

(2) The ratio of the yield stress in the machine direction (M) to the yield stress in the transverse direction (T) of the image receiving sheet (M/T) is from 0.9 to 1.20 and preferably from 0.95 to 1.15.

(3) The elongation in the machine direction and the elongation in the transverse direction of the image receiving sheet are both from 1 to 5% and preferably from 2 to 4%.

It is still preferable that the ratio of the elongation in the machine direction to the elongation in the transverse direction is 1.2 or less, still preferably 1.1 or less.

By appropriately setting the yield stress in the machine direction (M) and the yield stress in the transverse direction (T) of the image receiving sheet above, the ratio of these values and the elongations in respective directions as described above, the register accuracy of the transferred image can be improved and image distortion is regulated. In addition, defects due to dirt or debris can be lessened, thereby providing a transferred image of high qualities.

The present invention further provides a multicolor image formation method using the multicolor image forming materials according to the first to fourth aspects of the present invention. Namely, the multicolor image formation method according to the present invention is a multicolor image formation method comprising the step of using a multicolor image forming material comprising an image receiving sheet having an image receiving layer and at least four heat transfer sheets having different colors each comprising a substrate and at least a light-heat conversion layer and an image forming layer provided thereon; superposing each of the heat transfer sheets being on the image receiving sheet with the image forming layer facing the image receiving layer; and irradiating with laser light to transfer the irradiated area of the image forming layer to the image receiving layer to record a multicolor image on the image receiving sheet, characterized in that the multicolor image forming material is a multicolor image forming material according to any of the first to fourth aspects of the present invention as described above.

Next, the whole system developed by us, including the contents of the present invention, will be described. The system according to the present invention adopts a newly developed thin film heat transfer system to accomplish high resolution and high image qualities. The system is capable of producing a transfer image at a high resolution of 2400 dpi or more, preferably 2600 dpi or more. The thin film heat transfer system is such that an image forming layer having a thickness of form 0.01 to 0.9 μm is transferred to an image receiving sheet in the state not melted or hardly melted. In other words, the irradiated area of the image forming layer is transferred while keeping its shape as thin film so that an extremely high resolution is achieved. In order to carry out thin film transfer effectively, it is preferred that the light-heat conversion layer is thermally deformed into a dome shape by photo recording. The dome-shaped light-heat conversion layer pushes the image forming layer outward, whereby the adhesion force of the image forming layer to the image receiving layer is enhanced and thus transfer is facilitated. Great deformation generates a great force pushing the image forming layer toward the image receiving layer and results in easy transfer. Small deformation produces only a small pushing force and fails to accomplish perfect transfer in some parts. Hence, preferable deformation in thin film transfer, which is observed with a color laser microscope (VK8500 supplied by Keyence Corp), should be quantified as a measure of transfer capabilities. The degree of deformation is represented by a deformation percentage obtained by dividing the sum of the cross-sectional area (a) of the layer after irradiation and the cross-sectional area (b) of the light-heat conversion layer before irradiated by the cross-section area (b) of the light-heat conversion layer before irradiated and multiplying the quotient by 100. That is, deformation percentage (%)=$\{(a+b)/(b)\}\times 100$. A deformation percentage preferred for thin film transfer is 110% or higher, preferably 125% or higher, still preferably 150% or higher. While the deformation percentage could exceed 250% as long as the heat-light conversion layer has an increased elongation at break, a preferred upper limit is usually about 250%.

The technical key points of image forming materials in the thin film heat transfer recording system are as follows.

1. Balance Between High-Temperature Response and Storage Stability

In order to attain high image qualities on transfer, the image forming layer must have a small thickness on the order of submicrons. However, the layer should contain a pigment in a high concentration enough to give a desired image density, which conflicts with fast heat response. Besides, heat response properties also conflict with storage (adhesion) stability. These conflicting problems are settled by development of novel polymers and additives.

2. Ensure High Vacuum Contact

In the thin film transfer technique in pursuit of high resolution, it is desirable that the transfer interface is as smooth as possible. However, such surface smoothness interferes with sufficient vacuum contact. Therefore, departing from the common knowledge relating to vacuum contact, a relatively large amount of a matting agent having a relatively small particle size is incorporated into a layer located under the image forming layer to thereby maintain a moderate uniform gap between the transfer sheet and the image receiving sheet. As a result, vacuum contact capabilities are achieved without causing any white spots due to the matting agent and without ruining the advantages of the thin film transfer technology.

3. Use of Heat-Resistant Organic Materials

On laser recording, the temperature of the light-heat conversion layer which converts laser light energy to heat energy attains about 700° C., while the temperature of the image forming layer containing a pigment attains about 500° C. We have developed a denatured polyimide usable in organic solvent coating techniques as a material of the light-heat conversion layer. We have also developed a pigment as a colorant of the image forming layer which is superior in heat-resistance, safety and fit for color matching to printing pigments.

4. Ensure Surface Cleanness

Debris or dust present between the heat transfer sheet and the image receiving sheet leads to serious image defects in thin film transfer, thereby causing a serious problem. Since dust outside the equipment can enter or dust can occur during sheet cutting operation, material management alone is insufficient to keep the elements clean. It has therefore been necessary to fit the equipment with a dust removing mechanism. However, we have found a material with moderate tackiness whereby the surface of the image forming elements can be cleaned. Thus, it has been successfully achieved to remove dust without accompanying productivity reduction by using sheet feed rollers made of this material.

The whole system according to the present invention will hereinafter be described in greater detail.

In the present invention, it is preferred to produce a heat transfer image of sharp dots, to re-transfer the transfer image to printing paper, and to achieve recording over B2 or larger sizes (515 mm×728 mm or more). It is still preferable to provide a system allowing recording over B2 (543 mm×765 mm) or larger sizes.

One of the performance features of the system developed by us is capability of forming sharp dots. The resolution achievable with this system is 2400 dpi or higher, and a transfer image having a resolution according to a desired number of lines per inch (lpi) can be obtained by the system. The individual dots have very sharp edges substantially free from blur or deficiency. Full range of dots from highlights to shadows can be formed clearly. As a result, the system is capable of outputting high quality dots at the same level of resolution as obtained with an image setter or a CTP setter to give an approximation to dots and gradation of final printed products.

A second performance feature of the system developed by the present invention is satisfactory cyclic reproducibility (repeatability). Since a heat transfer image with sharp dots can be obtained, dots are reproduced in good agreement with a laser beam. Additionally, because of very small environmental dependency of recording characteristics, the results of repetition are stable in hue and density in a wide range of environmental conditions.

A third performance feature of the system developed by the present invention is satisfactory color reproducibility. Since the system employs the same pigments as used in printing inks and has satisfactory cyclic reproducibility, highly accurate color management system (CMS) can be realized.

The heat transfer image obtained substantially matches the color hues of final prints, i.e., the hues of Japan-colors or SWOP colors and shows the same change in what it looks like with a change of lighting (e.g., a fluorescent lamp and an incandescent lamp) as the final printed product.

A fourth performance feature of the system developed by the present invention is satisfactory text qualities. Owing to the sharp dot shape, the system reproduces fine lines of letters with sharp edges.

Next, features of the material technology adopted in the system according to the present invention will be described in greater detail. Laser heat transfer techniques for DDCP include (1) a laser sublimation system, (2) a laser ablation system, and (3) a laser melt system. In the systems (1) and (2), dot outlines are blurred due to dye sublimation or scattering. In the system (3), no clear dot outlines can be obtained because the molten colorant flows. Based on the thin film transfer techniques, we have conceived the following techniques to clear new problems occurring in the laser heat transfer systems and attain further improved image qualities.

A first material feature of the system is a sharper dot edge. In the light-heat conversion layer, laser light is converted to heat and the heat is transmitted to the adjacent image forming layer, and the image forming layer adheres to the image receiving layer to conduct recording. In order to make sharp dots, it is required that the heat generated by laser light is transmitted right to the transfer interface without being diffused in the planar direction so that the image forming layer may be cut sharply along the heated area/non-heated area interface. For this purpose, the light-heat conversion layer of the heat transfer sheet should be reduced in thickness, and the dynamic characteristics of the image forming layer should be so controlled.

Accordingly, a first technique for accomplishing dot sharpening is thickness reduction of the light-heat conversion layer. As simulated, the temperature of a light-heat conversion layer is assumed to instantaneously attains about 700° C. so that a thin light-heat conversion layer is liable to undergo deformation or destruction. A deformed or destroyed thin light-heat conversion layer would be transferred to an image receiving sheet together with an image receiving layer or result in an uneven transfer image. Beside this problem, a light-heat conversion layer must have a light-heat converting substance in a high concentration so as to attain a prescribed temperature, which would cause additional problems such as colorant's precipitation or migration to an adjacent layer. Thus, the heat transfer sheet herein employs an infrared absorbing colorant as a light-heat converting substance which is effective at a reduced amount compared with carbon that has been often used as a light-heat converting substance. With respect to a binder, a resin which retains sufficient mechanical strength even at high temperatures and has satisfactory ability to hold an infrared absorbing colorant is selected.

That is to say, it is preferred to reduce the light-heat conversion layer thickness to about 0.5 μm or smaller by selecting an infrared absorbing colorant exhibiting excellent light-heat conversion characteristics and a heat-resistant binder such as a polyamide-imide resin.

A second technique for dot sharpening is for improving the characteristics of the image forming layer. In the case where the light-heat conversion layer is deformed or the image forming layer itself undergoes deformation due to high temperature, the image forming layer transferred onto the image receiving layer suffers from thickness unevenness in response to the slow scanning pattern of a laser beam. It follows that the transfer image becomes non-uniform with a decrease in apparent transfer densities. This tendency becomes conspicuous with a decrease in image forming layer thickness. On the other hand, a thick image forming layer has poor dot sharpness and reduced sensitivity.

In order to achieve both of these contradict purposes, it is preferred to reduce transfer unevenness by adding a low-melting substance, such as a wax, to the image forming layer. Furthermore, fine inorganic particles can be added in place of part of binders to increase the layer thickness to a proper degree so that the image forming layer may be sharply cut along the heated area/non-heated area interface. As a result, uniform recording can be accomplished without impairing dot sharpness and sensitivity.

In general, low-melting substances such as waxes tend to bleed on the surface of the image forming layer or to crystallize, which can result in impairment of image qualities or deterioration of stability of the heat transfer sheet with time.

To cope with this problem, it is preferred to select a low-melting substance with a small difference in Sp value from the polymer of the image forming layer. Such a substance exhibits improved compatibility with the polymer and can be prevented from releasing from the image forming layer. It is also preferred to prevent crystallization by using an eutectic mixture of a plurality of low-melting substances having different structures. As a result, an image of sharp dots free from unevenness can be obtained.

A second material feature of the system resides in the finding that heat transfer recording sensitivity depends on temperature and humidity. In general, the heat transfer sheet changes its mechanical and thermal characteristics on moisture absorption by its coating layer, which means environmental humidity dependence of recording.

In order to reduce the temperature and humidity dependence, it is preferred to employ organic solvent systems as the colorant/binder system of the light-heat conversion layer and the binder system of the image forming layer respectively. It is also preferred to choose polyvinyl butyral as a binder of the image receiving layer and to introduce a polymer hydrophobilization technique for reducing the water absorption of polyvinyl butyral. Available polymer hydrophobilization techniques include causing a hydroxyl group of a polymer to react with a hydrophobic group as taught in JP-A-8-238858 and crosslinking two or more hydroxyl groups of a polymer with a hardening agent.

A third material feature of the system lies in improvement on hue approximation to the final print. In the system of the present invention, the following problem that has arisen in the laser thermal transfer system has been solved in addition to the color matching management and stable dispersing technique amassed through the development of a thermal head type color proofer (e.g., First Proof supplied by Fuji Photo Film Co., Ltd.). Namely, a first technique for achieving improved hue approximation to the final print consists in use of a highly heat-resistant pigment. The temperature of an image forming layer generally attains about 500° C. or higher in heat transfer recording by laser light. Some of traditionally employed pigments decompose at such high temperatures. This problem is averted by using highly heat-resistant pigments in the image forming layer.

A second technique realizing improved hue approximation to the final print resides in prevention of the infrared absorbing colorant from diffusing. If the infrared absorbing colorant used in the light-heat conversion layer migrates to the image forming layer due to the high recording temperature and, in its turn, the hue of a resultant transfer image differs from what is expected. To prevent this phenomenon, the light-heat conversion layer is preferably made of the infrared absorbing colorant combined with the above-described binder capable of securely holding the infrared absorbing colorant.

A fourth material feature of the system is achievement of high sensitivity. In high-speed recording with laser light, shortage of light energy often occurs to cause gaps, particularly gaps corresponding to the scanning pitch in the slow scanning direction. To solve the problem, the high concentration of a colorant in the light-heat conversion layer and the reduced thicknesses of the light-heat conversion layer and the image forming layer serve to increase the efficiency of heat generation and heat conduction as previously stated. Additionally, it is preferred to incorporate a low-melting substance into the image forming layer so that the image forming layer becomes slightly flowable so as to fill the gaps, and the adhesion of the image forming layer to the image receiving layer is improved. It is also preferred to use, for example, polyvinyl butyral, which is a preferred binder for use in the image forming layer, as a binder of the image receiving layer so as to increase the adhesion between the image receiving layer and the image forming layer and to ensure the film strength of the transfer image.

A fifth material feature of the system is improvement on vacuum contact. The image receiving sheet and the heat transfer sheet are preferably held on a recording drum by vacuum contact. The vacuum contact between these sheets is of great significance because image transfer depends on control of adhesion between the image receiving layer of the image receiving sheet and the transfer behavior is very sensitive to the clearance between the image receiving face of the image receiving layer and the image forming layer face of the transfer sheet. An increased gap between the two sheets due to dust or debris results in image defects or transfer unevenness.

To prevent such image defects and transfer unevenness, it is preferred to give uniform surface roughness to the heat transfer sheet thereby allowing entrapped air to escape, thereby making a uniform clearance between the two sheets.

First technique for improving vacuum contact comprises giving surface roughness to the heat transfer sheet. To achieve a sufficient effect of improving vacuum contact even in the case of overprinting two or more color images, the heat transfer sheet is made uneven. Common methods of making the heat transfer sheet uneven include post-treatments such as embossing and addition of a matting agent. Addition of a matting agent is preferred for the sake of process simplification and in view of material stability with time. A matting agent to be added should have a particle size larger than the thickness of a coating layer to which it is added. Addition of a matting agent directly to the image forming layer would result in missing of dots from the part where the matting agent particles fall off. This is the reason why a matting agent of an optimum particle size is preferably added to the light-heat conversion layer. As a result, the image forming layer provided thereon has an almost uniform thickness and is capable of transferring a defect-free image to the image receiving sheet.

Next, characteristics of the systematization of the techniques according to the present invention will be described. A first feature of the systematization techniques is configuration of the recording apparatus. In order to duly reproduce sharp dots as discussed above, the recording apparatus should be designed precisely. The recording apparatus which can be used has the same basic configuration as conventional thermal transfer recorders. This configuration is a so-called heat mode outer drum recording system in which a heat transfer sheet and an image receiving sheet held on a drum are irradiated with a recording head having a plurality of high power lasers. The following embodiments are preferred among others.

Firstly, the recording apparatus is designed to avoid contamination with dust. The image receiving sheet and the heat transfer sheet are supplied by a full-automatic roll supply system so as to avoid contamination with dust or debris that might enter if the recording apparatus is manually loaded with a stack of cut sheets.

A loading unit containing rolls of the heat transfer sheets of four colors, i.e., one roll for one color, rotates to switch the rolls. During the rotation, each roll is cut at a prescribed length with a cutter, and the cut sheet is held onto a recording drum. Secondly, the recording apparatus is designed to bring the image receiving sheet and the heat transfer sheet into intimate adhesion on the recording drum. The image receiving sheet and the heat transfer sheet are held to the drum by vacuum suction. Since a sufficiently strong adhesion force cannot be mechanically established between the image receiving sheet and the heat transfer sheet, vacuum suction is employed. A large number of vacuum suction holes are formed on the recording drum, and the inside of the drum is evacuated with a blower or a vacuum pump thereby to hold the sheets onto the drum. The image receiving sheet is the first to be held by suction, and the heat transfer sheet is superposed thereon. Therefore, the heat transfer sheet is made larger than the image receiving sheet. Air between the heat transfer sheet and the image receiving sheet, which greatly influences the image transfer, is sucked from the extension area of the heat transfer sheet extending from the underlying image receiving sheet.

Thirdly, the recording apparatus is designed to allow a plurality of output sheets to be stacked stably on an output tray. In the present invention, the recording apparatus is contemplated to provide output sheets of B2 or larger sizes being stacked on the output tray. When a sheet B is outputted and superposed on the image receiving layer of a film A that has already been discharged, the two sheets can stick to each other because of the heat stickiness of the image receiving layer. If this happens, the next sheet is not discharged in good order to cause jamming. To prevent phenomenon, it is the best to prevent the output sheet B from coming into contact with the film A. Known means for preventing the contact include (a) a level difference made on the output tray, by which the film is placed non-flat, and a gap is created between adjacent films, (b) a slot for output exit positioned higher than the output tray so that an output film discharged through the slot drops on the output tray, and (c) air ejected between adjacent films to float the upper film. Since the sheet size is as large as B2, application of the means (a) or (b) will make the apparatus considerably larger. Therefore, the means (c), i.e., an air ejection method is employed in this system. That is to say, the means of ejecting air between sheets to float the sheet discharged later.

Figure 2:
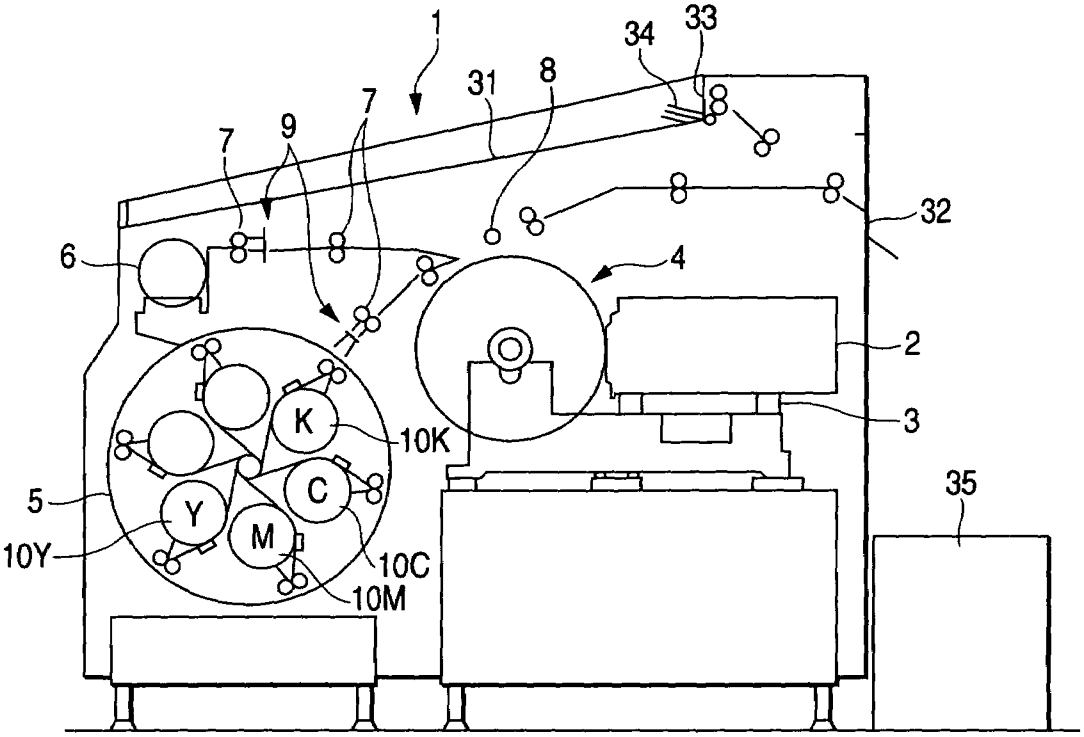
FIG. 2 provides a drawing showing an example of the configuration of a laser heat transfer recording apparatus.

FIG. 2 shows an example of the recording apparatus.

Now, steps for full color image formation by use of the image forming material and the above-described recording apparatus will be illustrated in sequence (hereinafter referred to as the image formation sequence of the system).

1) In a recording apparatus 1, a recording head 2 which slides on rails 3 in the slow scan (sub-scan) direction, a recording drum 4 which rotates in the fast scan (main scan) direction, and a heat transfer sheet loading unit 5 return to their starting positions.
2) An image receiving sheet is unrolled from an image receiving sheet roll 6 with feed rollers 7, and the leading end of the image receiving sheet is fixed by suction onto the recording drum 4 through suction holes (vacuum suction holes) of the recording drum.
3) A squeeze roller 8 comes down and presses the leading end of the image receiving sheet onto the recording drum 4. When the image receiving sheet in a given length is fed due to the rotation of the drum 4, the drum stop rotating, and a cutter 9 cuts the sheet.
4) The recording drum 4 further turns to makes one revolution to complete image receiving sheet loading.
5) A heat transfer sheet of the first color, e.g., black (K), is unrolled from a heat transfer sheet roll 10K and cut into a sheet of prescribed length according to the same sequence as for the image receiving sheet.
6) Subsequently, the recording drum 4 starts to rotate at high speed, and the recording head 2 starts to move on the rails 3. When the recording head 2 arrives at a record starting position, item its writing laser beams to irradiate the recording drum 4 according to recording signals. The irradiation is stopped at a recording terminal position, and the operations of the rails 3 and the drum 4 stop. The recording head 2 on the rails 3 returns to its starting position.
7) Only the heat transfer sheet K is peeled off with the image receiving sheet left on the recording drum. The leading end of the heat transfer sheet K is caught in claws, pulled apart from the image receiving sheet, and discarded through a discard slot 32 into a waste box 35.
8) The steps (5) to (7) are repeated for each of the heat transfer sheets of the other three colors. Recording is performed in the order of black, cyan, magenta and yellow. That is, a heat transfer sheet of the second color (cyan) (C), a heat transfer sheet of the third color (magenta) (M) and a heat transfer sheet of the fourth color (yellow) (Y) are successively fed from rolls 10C, 10M and 10Y respectively. The order of color superimposition in the recording apparatus is the reverse of the general printing order because the resulting color image is reversed on re-transfer to paper to give a color proof.
9) After completion of the above steps, the recorded image receiving sheet is discharged on an output tray 31. The image receiving sheet is separated from the recording drum in the same manner as for the heat transfer sheets (as described in step (7)) but is not discarded. When it comes near the discard slot 232, it changes its direction by a switchback mechanism and is forwarded to the output tray. When the image receiving sheet exits through the discharge slot 33, air 34 is blown from under the slot 33 to allow a plurality of sheets to be stacked without sticking to each other.

Figure 5:
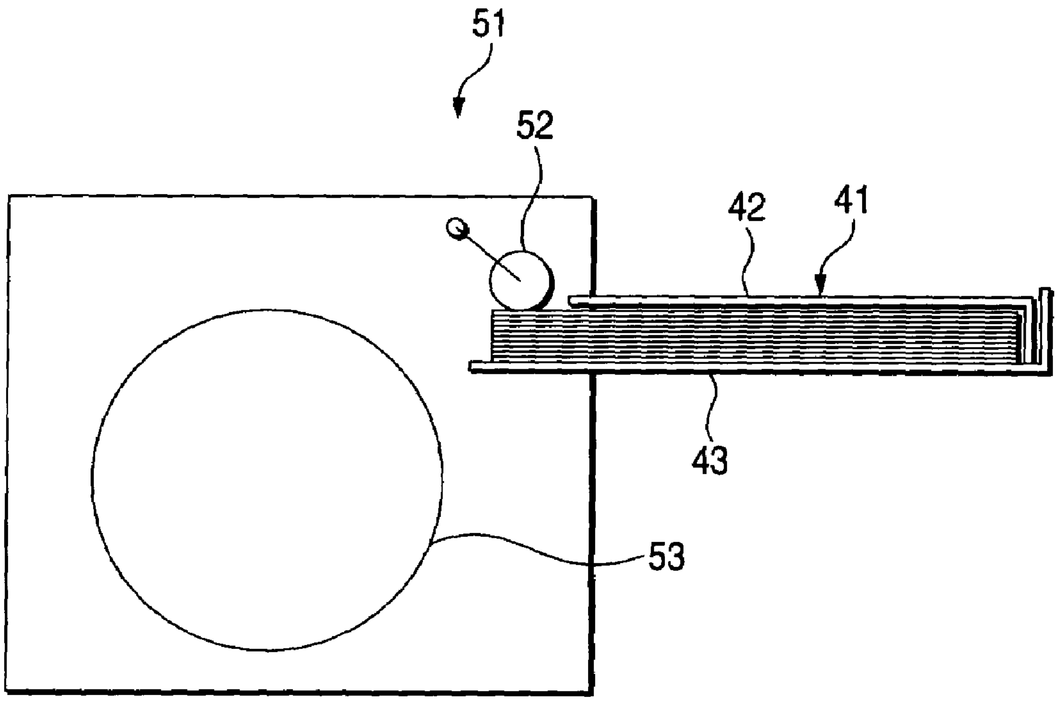
FIG. 5 provides a drawing showing an example of the configuration of a laser heat transfer recording apparatus using a simplified recording medium cassette.
Figure 6:
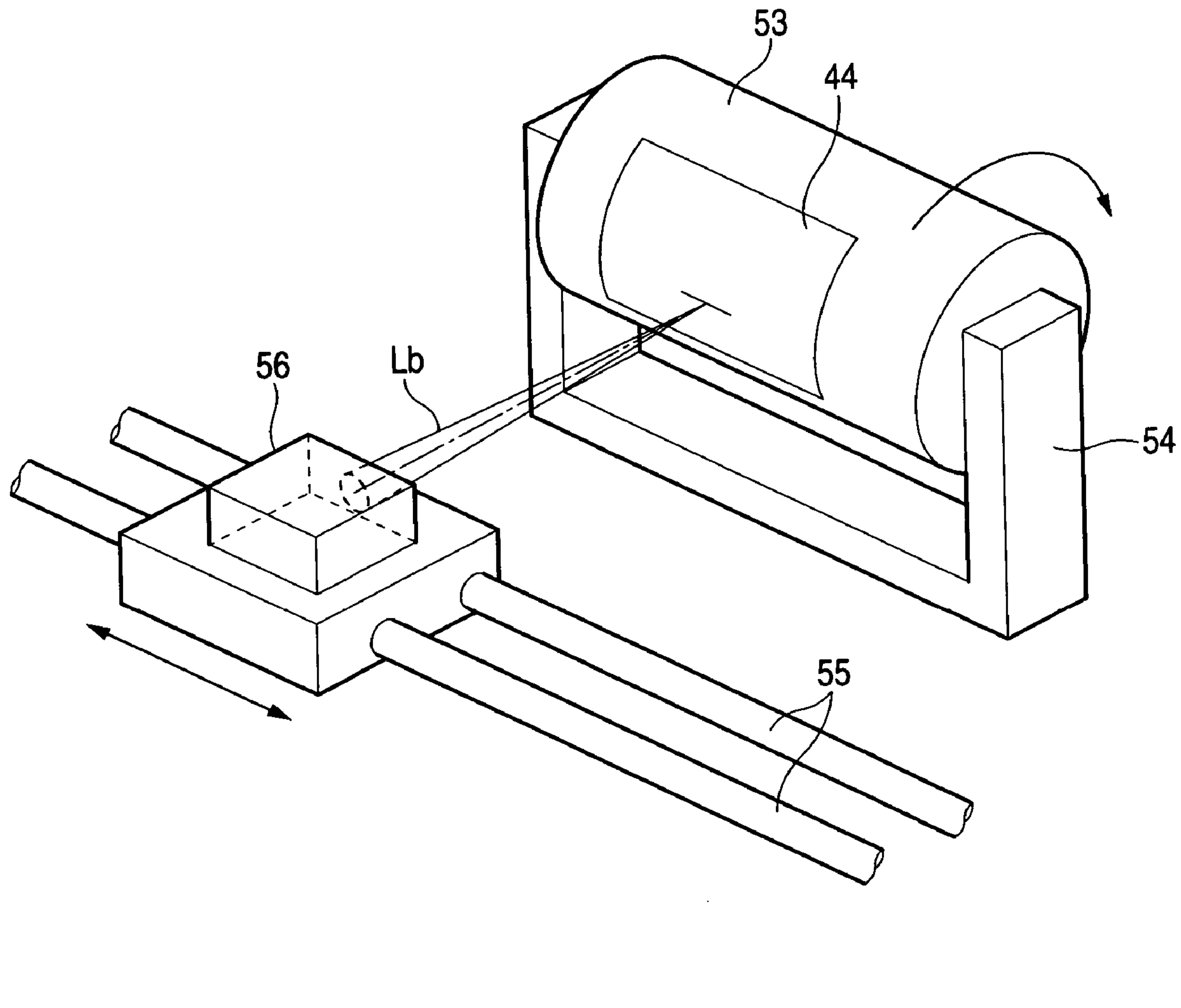
FIG. 6 provides a drawing particularly showing an example of the laser irradiation unit of a laser heat transfer recording apparatus using a simplified recording medium cassette.

To discharge and stack the above-described heat transfer sheet and image receiving sheet, use may be made of discharging and stacking mechanisms as will be shown in FIGS. 5 and 6.

It is preferred to use an adhesive roller having a pressure-sensitive adhesive on the surface thereof as one of paired feed rollers 7 disposed on any site for supplying or feeding the above-described heat transfer sheets and image receiving sheet.

By providing the adhesive roller, the surface of the heat transfer sheet and the image receiving sheet can be cleaned.

The pressure-sensitive adhesive provided on the surface of the adhesive roller may be any pressure-sensitive adhesive material. Examples thereof include an ethylene-vinyl acetate copolymer, an ethylene-ethyl acrylate copolymer, a polyolefin resin, a polybutadiene resin, a styrene-butadiene copolymer (SBR), a styrene-ethylene-butene-styrene copolymer (SEBS), an acrylonitrile-butadiene copolymer (NBR), a polyisoprene resin (IR), a styrene-isoprene copolymer (SIS), an acrylic ester copolymer, a polyester resin, a polyurethane resin, an acrylic resin, butyl rubber, and polynorbornene.

The surface of the heat transfer sheet and the image receiving sheet can be cleaned on contact with the adhesive roller. The contact pressure is not particular limited so long as cleaning can be made.

It is preferred that the pressure-sensitive adhesive used in the adhesive roller has a Vickers hardness Hv of 50 $kg/mm^2$ (≈490 MPa) or less for thoroughly removing dust and thereby preventing image defects caused by dust.

"Vickers hardness" is a hardness measured by applying a static load to a quadrilateral diamond indenter having an angle of 136° between the opposite faces. Vickers hardness Hv is obtained from equation:

$$Hv=1.854P/d^2(kg/mm^2)\approx 18.1692P/d^2(MPa)$$

where P is a load (kg) applied, and d is the length (mm) of a diagonal of a square indentation.

In the present invention, it is also preferred for the pressure-sensitive adhesive material to be used in the above adhesive roller to have an elastic modulus of 200 $kg/cm^2$ (≈19.6 MPa) or less at 20° C. for sufficiently remove dust and control image defects.

Next, an example of the constitution of a preferred embodiment of the present invention wherein an image receiving sheet and a heat transfer sheet are cut into desired size and then supplied from a cassette will be illustrated by referring to FIGS. 5 and 6.

As shown in FIGS. 5 and 6, a rotating drum for recording 53, which serves as a recording medium-supporting member, is provided in the recording unit of a recording apparatus 51. This rotating drum for recording 53 is a hollow cylinder and held by a frame 54 in a rotatable manner as shown in FIG. 6. In the recording apparatus 51, the rotation direction of this rotating drum for recording 53 corresponds to the main scan direction. The rotating drum for recording 53 is connected to a motor rotation axis and driven and rotated by the motor. The recording apparatus 51 is also provided with a cassette body 42.

The recording unit is further provided with a recording head 56. The rotating drum for recording 53 emits laser beam Lb. In the part irradiated with the laser beam Lb, the toner layer of a heat transfer sheet 44 is transferred onto the surface of an image receiving sheet 45. By a driving mechanism which is not shown in the figure, the recording head 56 linearly moves on guide rails 55 in the direction parallel to the rotation axis of the rotating drum for recording 53. This moving direction corresponds to the sub scan direction. By appropriately combining the rotation movement of the rotating drum for recording 53 with the linear movement of the recording head 56, a desired part of the heat transfer sheet 44 covering the image receiving sheet 45 can be irradiated with laser. Namely, a desired image can be transferred onto the image receiving sheet 45 by scanning the heat transfer sheet 44 with the writing laser beam Lb and irradiating exclusively necessary positions in accordance with image signals.

A cassette holder 43 is attached to the recording medium loading unit of the recording apparatus 51. A recording medium cassette 41 having the cassette body 42 which contains a multicolor image forming material (also called a recording medium) comprising an image receiving sheet 45 and a heat transfer sheet 44 is directly attached/detached to the cassette holder 43. In the recording apparatus 51 which has the recording medium cassette 41 loaded on the cassette holder 43, the recording medium is taken out from the recording medium cassette 41 and fed into the recording medium supporting unit 53 of the recording apparatus 51 by the feed roller 52.

It is preferred to use an adhesive roller having a pressure-sensitive adhesive material on the surface as the feed roller 52. By providing the adhesive roller, the surface of the heat transfer sheet and the image receiving sheet can be cleaned.

The pressure-sensitive adhesive material and its properties such as hardness and elastic modulus are the same as discussed above with respect to FIG. 2.

A second feature of the systematization is configuration of a heat transfer apparatus.

A heat transfer apparatus is used to carry out the step of transferring the image printed on the image receiving sheet by the recording apparatus to a sheet of the same paper as used in final printing (hereinafter simply referred to as "a paper sheet"). This step is entirely identical to that carried out in First Proof™. A paper sheet is superposed on the image receiving sheet, and heat and pressure are applied thereto to adhere the two sheets together. Then, the image receiving sheet is stripped off, whereby only the substrate and a cushioning layer of the image receiving sheet are removed to leave the image and the adhesive layer on the paper sheet. This practically means that the image is transferred from the image receiving sheet to the printing paper sheet.

Figure 3:
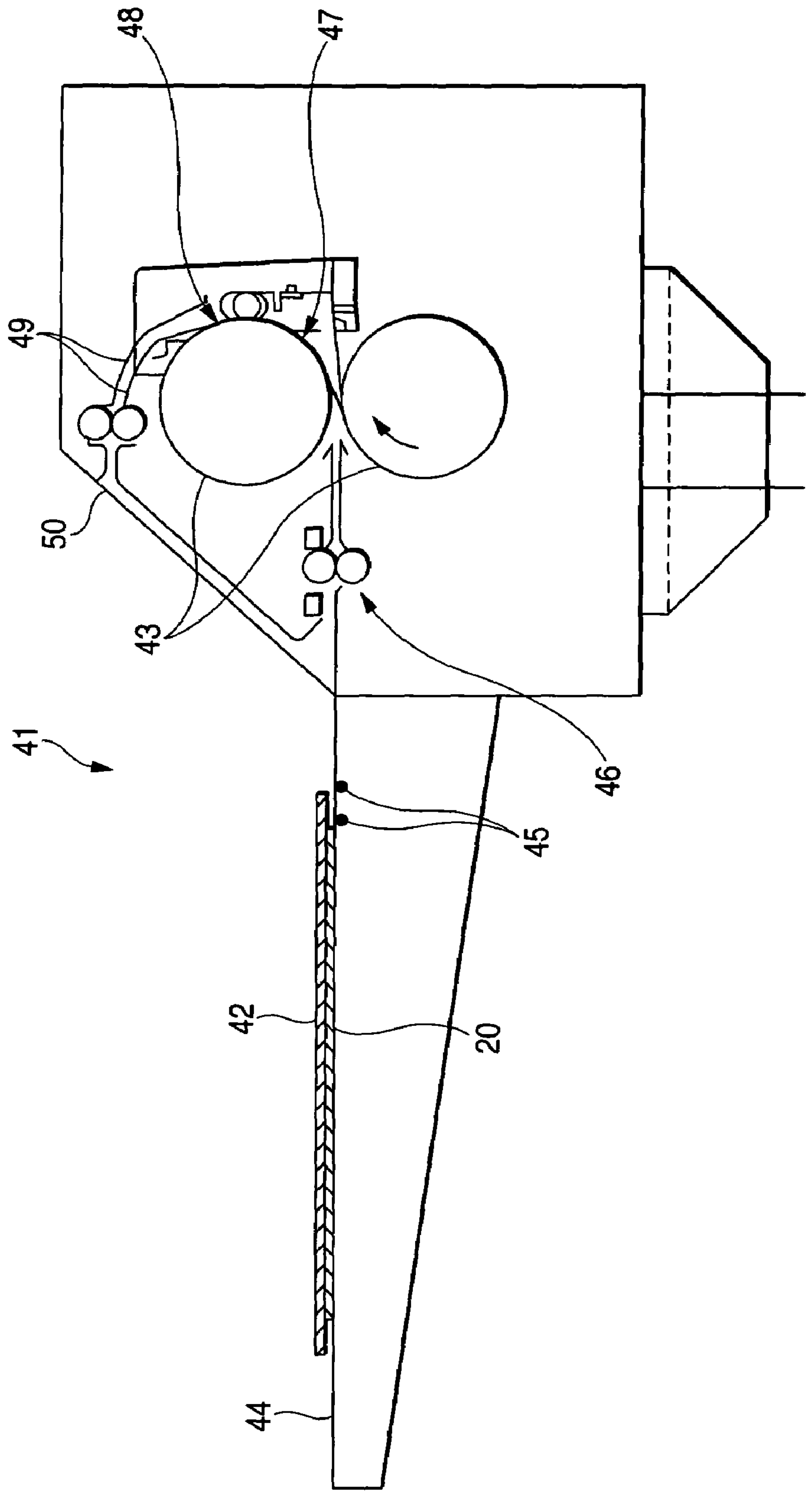
FIG. 3 provides a drawing showing an example of the configuration of a heat transfer apparatus.

In First Proof™, image transfer is performed by superposing a paper sheet and the image-receiving sheet on an aluminum guide plate and passing them through heat rollers. The aluminum guide plate serves to prevent the paper from deformation. If this design is applied as such to the system for B2 size output, the aluminum guide plate should be larger than a B2 size, which results in the problem that a large installation space is required. Accordingly, the system of the present invention does not use such an aluminum guide plate. Instead, the carrier path turns 180° so that the sheets are discharged toward the loading side. As a result, the installation space can be largely saved (see FIG. 3). However, there arises another problem that the paper sheet is curled in the absence of an aluminum guide plate. The facing couple of the paper sheet and the image-receiving sheet curls with the image-receiving sheet inward and rolls on the output tray. It is very difficult to separate the image receiving sheet from the curled paper.

In the present invention, this curling phenomenon is averted by taking advantage of the bimetallic effect due to the difference in shrinkage between printing paper and the image receiving sheet and the ironing effect of the heat roller. Where an image receiving sheet is superposed on according to a paper sheet as in a conventional way, the two sheets curl with the image receiving sheet inward by the bimetallic effect upon heating because the image receiving sheet shows larger thermal shrinkage in the direction of insertion than printing paper. The direction of curling by the bimetallic effect is the same as the direction of curling by the ironing effect of the heat roller around which the two sheets are wound. As a result, the curling becomes serious by synergism. In contrast, when the paper sheet is superposed on an image receiving sheet, downward curling by the bimetallic effect occurs whereas upward curling is caused by ironing effect so that the curls of opposite directions are offset by each other.

Transfer to printing paper is carried out according to the following sequence (which will be referred to as the printing paper transfer method to be used in this system). A thermal transfer apparatus shown in FIG. 3, 41 which can be used for this method, is manually operated unlike the recording apparatus.

1) To begin with, dials (not shown) are turned to set the temperature of heat rollers 43 (100 to 110° C.) and the transfer speed according to the kind of printing paper 42.
2) An image receiving sheet 20 is put on and the dust on the image is removed by an antistatic brush (not shown). A paper sheet 42 from which dust has been removed is superposed thereon. Because the upper paper sheet 42 is larger than the lower image receiving sheet 20, it is difficult to position the paper sheet 42 on the image receiving sheet 20 hidden from the eye. For improving the ease of the positioning work, marks 45 indicating the positions of placement for an image receiving sheet 20 and a paper sheet 45 are made on an insertion table 44. The reason the paper sheet is larger than the image-receiving sheet 20 is to prevent image receiving sheet 20 from coming out under the paper sheet 42 and staining heat roller 43.
3) The image receiving sheet and the paper sheet are inserted into an insert port, and insert rollers 46 rotate to feed them to heat rollers 43.
4) When the leading end of the paper sheet 42 reaches the heat rollers 43, the heat rollers nip the two sheets to start heat transfer. The heat rollers are heat resisting silicone rubber rollers. Pressure and heat are applied simultaneously to the image receiving sheet and thus the image receiving sheet and the paper sheet adhere together. A heat-resistant guide sheet 47 is provided in the downstream of the heat roller. The image receiving sheet and the paper sheet are carried upward through between the upper heat roller and the guide sheet 47 while being heated, separated from the upper heat roller by separation claw 48, and guided to an output slot 50 along a guide plates 49.
5) The image receiving sheet and the paper sheet coming out of the output slot 50 is discharged on the insertion table while being adhered. Thereafter, the image receiving sheet 20 is separated from the paper sheet 42 manually.

The third feature of the systematization technique resides in the system configuration.

The above-illustrated apparatus are connected to a plate-making system to perform the function as a color proofer. A color proofing system is required to output a color proof as an approximation to final prints outputted based on certain page data. Therefore, software for approximating dots and colors to the final prints is necessary. A specific example of connection is shown below.

When a proof is to be prepared for the final printing product outputted from a plate-making system Celebra™ (from Fuji Photo Film Co., Ltd.), a CTP (Computer to Plate) system is connected to Celebra. A printing plate outputted from this connection is mounted on a press to carry out actual printing. To Celebra is connected to the above-illustrated thermal transfer recording apparatus as a color proofer, e.g., Luxel FINALPROOF 5600 from Fuji Photo Film Co., Ltd. (hereinafter simply referred to as FINALPROOF), and proof drive software PD SYSTEM™ available from Fuji Photo Film is installed between Celebra and FINALPROOF for approximating dots and colors to the final output.

Figure 4:
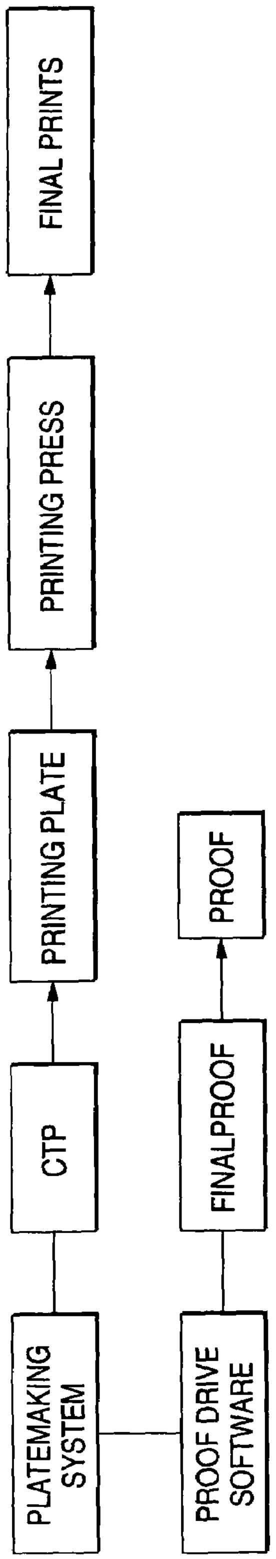
FIG. 4 provides a drawing showing an example of the system configuration using a laser heat transfer recording apparatus FINALPROOF.

Contone data (continuous tone data) converted to raster data by Celebra are converted to binary data for dots, outputted to the CTP system, and finally printed. On the other hand, the same contone data are also sent to PD SYSTEM. PD SYSTEM converts the received data according to a four-dimensional (black, cyan, magenta and yellow) table so that the colors may agree with the final output. Finally the data are converted to binary data for dots so as to agree with the dots of the final output, which are sent to FINALPROOF (FIG. 4).

The above-described four-dimensional table for each color is experimentally prepared in advance and stored in the system. The experiment for the preparation of the multi-dimensional table is as follows. Date of an important color are outputted via the CTP system to prepare a printed image. The same data are also outputted from FINALPROOF via PD SYSTEM to prepare a proof image. The measured color values of these images are compared, and a table is prepared so as to minimize the difference.

Thus, the system configuration is set up so that the performance of the high-resolution image forming elements of the invention may be exhibited to the full.

Next, the heat transfer sheet which is a material to be used in the system according to the present invention will be described.

It is preferred that the absolute value of the difference between the surface roughness Rz of the front face of the image forming layer and the surface roughness Rz of the back face thereof of the heat transfer sheet is 3.0 μm or smaller and that the absolute value of the difference between the surface roughness Rz of the front face of the image receiving layer and the surface roughness Rz of the back face thereof of the image receiving sheet is 3.0 μm or smaller. Owing to such a constitution combined with the above-described cleaning means provided by the adhesive roll, image defects and jamming in the sheet path can be prevented and dot gain stability can be improved. The surface roughness Rz is as defined above.

For enhancing the above-described effects, it is still preferred that the absolute difference between the surface roughness Rz of the front face of the image forming layer and the surface roughness Rz of the back face thereof of the heat transfer sheet image receiving sheet 1.0 μm or smaller and that the absolute difference between the surface roughness Rz of the front face of the image receiving layer and the surface roughness Rz of the back face thereof of the image receiving sheet is 1.0 μm or smaller.

It is preferred for the image forming layer of each heat transfer sheet to have a gloss of 80 to 99.

The gloss of the image forming layer largely depends on the smoothness of the layer and relates to the thickness uniformity of the layer. An image forming layer with a higher gloss has higher thickness uniformity and is more suited for high precision image formation. However, higher smoothness leads to higher resistance in sheet transportation, i.e., being in trade-off. Where the surface gloss ranges 80 to 99, a balance between smoothness and transportation resistance will be achieved.

Next, the scheme of multicolor image formation by thin film heat transfer using a laser will be described by referring to FIG. 1.

Figure 1B:
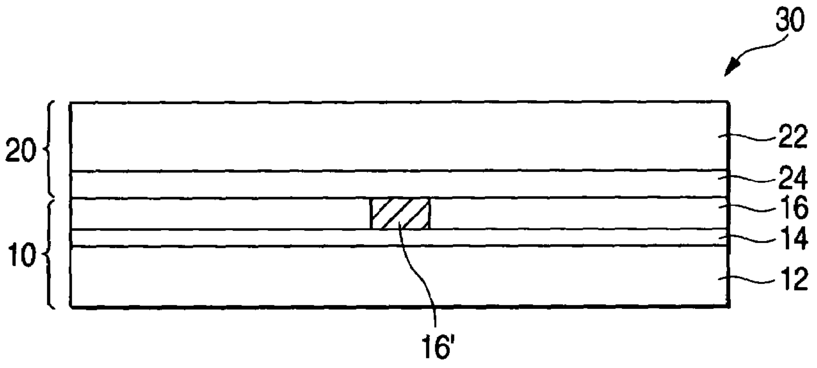
Figure 1C:
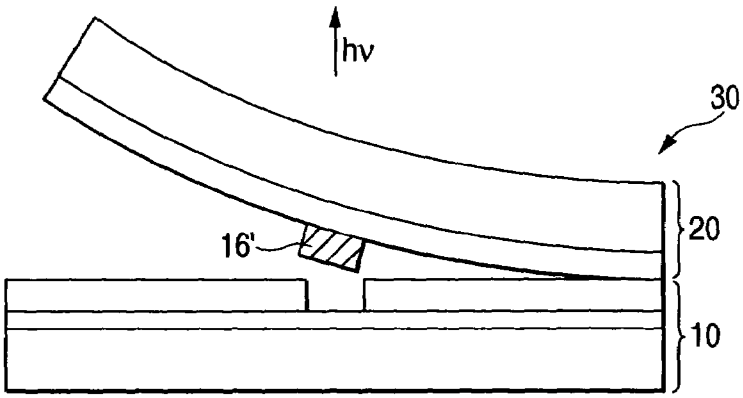

An image forming laminate 30 composed an image receiving sheet 20 piled on the surface of an image forming layer of a heat transfer sheet 10 containing a black (K), cyan (C), magenta (M) or yellow (Y) pigment is prepared (see FIG. 1(*a*)). The heat transfer sheet 10 comprises a substrate 12, a light-heat conversion layer 14 provided thereon, and an image forming layer 16 further provided thereon. The image receiving sheet 20 has a substrate 22 and an image receiving layer 24 provided thereon. The two sheets are superposed with the image receiving layer 24 facing the image forming layer 16 of the heat transfer sheet 10 (FIG. 1(*a*)). On imagewise irradiating the laminate 30 with a laser beam from the side of the substrate 12 of the heat transfer sheet 10 in a time series, the irradiated area of the light-heat conversion layer 14 of the heat transfer sheet 10 generates heat to and thus the adhesion force to the image forming layer 16 is lowered (FIG. 1(*b*)). Then, the heat transfer sheet 10 is stripped off from the image receiving sheet 20 while leaving the irradiated area 16' of the image forming layer 16 on the image receiving layer 24 of the image receiving sheet 20 (FIG. 1(*c*)).

In multicolor image formation, the laser light for the irradiation preferably comprises multibeams, particularly multibeams of two-dimensional array. Multibeams of two-dimensional array are a plurality of laser beams arranged in a two-dimensional array such that the spots of these laser beams form a plurality of lines in the main scan direction and a plurality of rows in the sub scan direction.

By using multibeams in a two-dimensional array, the time required for laser recording can be shortened.

Laser beam of any kind can be used in recording with no limitation, including direct laser beams such as gas laser beams, e.g., an argon ion laser beam, a helium neon laser beam, and a helium cadmium laser beam, solid state laser beams, e.g., a YAG laser beam, a semiconductor laser beam, a dye laser beam, and an excimer laser beam. Light rays obtained by converting these laser beams to half the wavelength through a second harmonic generation device can also be used. In multicolor image formation, it is preferable to use semiconductor laser beams, taking the output power and ease of modulation into consideration. A laser beam is preferably emitted to give a spot diameter of 5 to 50 μm (particularly 6 to 30 μm), on the light-heat conversion layer. The scanning speed is preferably 1 m/sec or higher (still preferably 3 m/sec or higher).

In multicolor image formation, it is preferred that the thickness of the black image forming layer in the black heat transfer sheet is larger than that of the other image forming layers of the other heat transfer sheets (e.g., yellow, magenta, and cyan) and preferably ranges from 0.5 to 0.7 μm in general, still preferably from 0.5 to 0.7 μm. Owing to such constitution, density reduction due to non-uniform transfer of the black image forming layer can be lessened in the step of laser irradiation.

In the case where the thickness of the image forming layer in the black heat transfer sheet as described above is lower than 0.5 μm, it is sometimes observed that the image density is largely lowered due to uneven transfer in high-energy recording thereby failing to attain a satisfactory image density necessary as a color proof for printing. Since this tendency becomes conspicuous under high humidity conditions, density varies widely depending on environment in some cases. In the case where the above-described layer thickness exceeds 0.7 μm, on the other hand, the transfer sensitivity is lowered in laser recording and reproducibility of small dots and fine lines is worsened in some cases. This tendency becomes conspicuous under low humidity conditions. It is also observed in some cases that the resolution is worsened. The layer thickness of the black image forming layer of the black heat transfer sheet as described above is still preferably 0.55 to 0.65 μm, particularly preferably 0.60 μm.

In addition to the black image forming layer thickness ranging 0.5 to 0.7 μm, it is preferred that the other color image forming layers of the other heat transfer sheets (e.g., yellow, magenta and cyan) have thickness of from 0.2 to less than 0.5 μm.

In the case where the thickness of these image forming layers (e.g., yellow, magenta, cyan, etc.) is less than 0.2 μm, it is sometimes observed that density is lowered due to transfer unevenness in laser recording. In the case where the layer thickness exceeds 0.5 μm, on the other hand, the transfer sensitivity is lowered or resolution is worsened in some cases. A still preferred thickness thereof is from 0.3 to 0.45 μm.

It is preferred for the image forming layer of the black heat transfer sheet to contain carbon black. The carbon black to be incorporated preferably comprises at least two kinds different in tinting strength from the viewpoint of ease of controlling reflection density while maintaining a P/B (pigment/binder) ratio within a specific range.

The tinting strength of carbon black can be represented in various terms, for example, PVC blackness disclosed in JP-A-10-140033. PVC blackness of carbon black is determined as follows. Carbon black to be evaluated is dispersed in a PVC resin by a two-roll mill and molded into a sheet. The blacknesses of Carbon Black #40 and #45, both available from Mitsubishi Chemicals Co., Ltd. being taken as 1 point and 10 points, respectively, the PVC blackness of the sample sheet is rated by visual observation on a 10 point scale. Two or more carbon blacks having different PVC blacknesses can be used in an appropriate combination according to the purpose.

Next, a specific method of preparing a sample will be illustrated.

<Method of Preparing Sample>

In a 250 cc Banbury mixer, an LDPE (low-density polyethylene) resin is blended with 40% by mass of a carbon black sample and kneaded at 115° C. for 4 minutes.

Blending Condition:

| | |
|---|---|
| LDPE | 101.89 g |
| Calcium stearate | 1.39 g |
| Irganox 1010 | 0.87 g |
| Sample carbon black | 69.43 g |

Then the blend is diluted in a two-roll mill at 120° C. to prepare a compound having a carbon black content of 1% by mass.

Compound dilution condition:

| | |
|---|---|
| LDPE | 58.3 g |
| Calcium stearate | 0.2 g |
| Resin blend containing 40% by mass of carbon black | 1.5 g |

The resulting compound is extruded through a slit width of 0.3 mm, and the extruded sheet is cut into chips and molded into a film having a thickness of 65±3 μm on a hot plate set at 240° C.

To form a multicolor image, use may be made the above-described method comprising successively transferring a plurality of image layers (image forming layers having images formed thereon) on the same image receiving sheet by using the heat transfer sheets to form a multicolor image on the image. Alternatively, a multicolor image may be formed by once forming images on image receiving layers of a plurality of image receiving sheets and then re-transferring onto according to a paper sheet or the like.

The latter method is carried out, for example, as follows. Heat transfer sheets having image forming layers containing colorants of different hues are prepared. Then, four types (four colors: cyan, magenta, yellow and black) of laminates are independently produced by combining these heat transfer sheets with an image receiving sheet. Each laminate is irradiated with laser light in accordance with the respective digital signals, i.e., through a color separation filter, and the heat transfer sheet is stripped off from the image receiving sheet to obtain a color separated image for each color on the image receiving sheet. Thereafter, the color separated images thus formed are successively laminated on an actual support, such as printing paper or an equivalent, to form a multicolor image.

In each case, a resolution as high as 2400 dpi or more, still preferably as high as 2600 dpi or more can be achieved in the image transferred from the image forming layer of the heat transfer sheet onto the image receiving layer of the image receiving sheet.

In the heat transfer recording with laser irradiation, changes in the states of a pigment, a colorant and an image forming layer are not particularly restricted, so long as a laser beam is converted into heat and then, using the heat energy, an image forming layer containing a pigment is transferred onto an image receiving sheet. That is to say, the present invention includes in its scope any of solid, softened, liquid and gas states, though a solid or softened state is preferred. Heat transfer recording with laser irradiation includes known techniques such as melt transfer recording, ablation transfer recording and sublimation transfer recording.

Among all, the thin film transfer recording and melt/ablation transfer recording are preferable from the viewpoint of forming an image approximate to prints.

Next, heat transfer sheets and image receiving sheets appropriately usable in the recording apparatus of the above-described system will be described.

[Heat Transfer Sheet]

The heat transfer sheets each comprises at least a substrate, a light-heat conversion layer, and an image forming layer together with an optional layer if needed.

(Substrate)

The substrate of the heat transfer sheet can be of any material of choice without particular restriction. Namely, various substrate materials are usable depending on the purpose. It is desirable for the substrate to have stiffness, dimensional stability, and heat resistance withstanding the heat of laser recording. Preferred substrate materials include synthetic resins, such as polyethylene terephthalate, polyethylene-2,6-naphthalate, polycarbonate, polymethyl methacrylate, polyethylene, polypropylene, polyvinyl chloride, polyvinylidene chloride, polystyrene, styrene-acrylonitrile copolymers, polyamide (aromatic or aliphatic), polyimide, polyamide-imide and polysulfone. A biaxially stretched polyethylene terephthalate film is preferred among all from the standpoint of mechanical strength and dimensional stability against heat. In the preparation of color proofs by laser recording, the substrate of the heat transfer sheet is preferably made of a transparent synthetic resin which transmits laser beams. The thickness of the substrate is preferably 25 to 130 μm, still preferably 50 to 120 μm. The substrate preferably has an Ra of less than 0.1 μm on its image forming layer side. The substrate preferably has a Young's modulus of 200 to 1200 kg/mm2 (≈2 to 12 GPa) in the machine direction and of 250 to 1600 kg/mm$^2$ (≈2.5 to 16 GPa) in the transverse direction. The F-5 value of the substrate in the machine direction is preferably 5 to 50 kg/mm$^2$ (≈0.49 to 490 MPa), and that in the transverse direction is preferably 3 to 30 kg/mm$^2$ (≈29.4 to 294 MPa). The F-5 value in the machine direction is generally higher than that in the transverse direction, but this is not the case when the substrate is required to be stronger in the transverse direction. The thermal shrinkage of the substrate when treated at 100° C. for 30 minutes is preferably 3% or less, still preferably 1.5% or less, in both machine direction and transverse direction. The thermal shrinkage at 80° C. for 30 minutes is preferably 1% or less, still preferably 0.5% or less, in both machine direction and transverse direction. The substrate preferably has a breaking strength of 5 to 100 kg/mm$^2$ (≈49 to 980 MPa) in both directions and an elastic modulus of 100 to 2,000 kg/mm$^2$ (≈0.98 to 19.6 GPa).

In order to improve adhesion between the substrate and the light-heat conversion layer, the substrate may be subjected to a surface activation treatment and/or be provided with one or more undercoating layers. The surface activation treatment includes glow discharge treatment and corona discharge treatment. The material of the undercoating layer is preferably selected from those having high adhesion to both the substrate and the light-heat conversion layer, low heat conductivity, and high heat resistance. Examples of such materials include styrene, a styrene-butadiene copolymer, and gelatin. The total thickness of the undercoating layers is generally 0.01 to 2 μm. If desired, the opposite side of the substrate may also be surface-treated or provided with a functional layer, such as an antireflection layer or an antistatic layer.

(Backcoating Layer)

It is particularly desirable to provide a backcoating layer on the face opposite to the light-heat conversion layer of the substrate of the heat transfer sheet to be used in the present invention. The backcoating layer preferably comprises a first backcoating layer adjacent to the substrate and a second backcoating layer provided on the first backcoating layer. It is preferred that the weight ratio of the antistatic agent B contained in the second backcoating layer to the antistatic agent A contained in the first backing layer, B/A, is less than 0.3. In the case where the B/A ratio is 0.3 or more, there arises a tendency toward worsening in sliding properties and powder fall-off from the backcoating layer.

The thickness C of the first backcoating layer is preferably 0.01 to 1 μm, still preferably 0.01 to 0.2 μm. The thickness D of the second backcoating layer is preferably 0.01 to 1 μm, still preferably 0.01 to 0.2 μm. The thickness ratio of these first and second backcoating layers C:D is preferably 1:2 to 5:1.

The antistatic agents which can be used in the first and second backcoating layers include nonionic surface active agents, e.g., polyoxyethylene alkylamines and glycerol fatty acid esters; cationic surface active agents, e.g., quaternary ammonium salts; anionic surface active agents, e.g., alkylphosphates; amphoteric surface active agents; and electrically conductive resins.

Fine electrically conductive particles can also be used as an antistatic agent. Examples of such fine electrically conductive particles include oxides, e.g., ZnO, $TiO_2$, $SnO_2$, $Al_2O_3$, $In_2O_3$, MgO, BaO, CoO, CuO, $Cu_2O$, CaO, SrO, $BaO_2$, PbO, $PbO_2$, $MnO_3$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$, and $MgB_2O_5$; sulfides, e.g., CuS and ZnS; carbides, e.g., SiC, TiC, ZrC, VC, NbC, MoC, and WC; nitrides, e.g., $Si_3N_4$, TiN, ZrN, VN, NbN, and $Cr_2N$; borides, e.g., $TiB_2$, $ZrB_2$, $NbB_2$, $TaB_2$, CrB, MoB, WB, and $LaB_5$; suicides, e.g., $TiSi_2$, $ZrSi_2$, $NbSi_2$, $TaSi_2$, $CrSi_2$, $MoSi_2$, and $WSi_2$; metal salts, e.g., $BaCO_3$, $CaCO_3$, $SrCO_3$, $BaSO_4$, and $CaSO_4$; and composites, e.g., $SiN_4$/SiC and $9Al_2O_3/2B_2O_3$. These electrically conductive substances may be used either alone or in a combination of two or more thereof. Preferred of them are $SnO_2$, ZnO, $Al_2O_3$, $TiO_2$, $In_2O_3$, MgO, BaO, and $MoO_3$. Still preferred are $SnO_2$, ZnO, $In_2O_3$, and $TiO_2$, with $SnO_2$ being particularly preferred.

In using the heat transfer material according to the present invention in the laser heat transfer recording method, the antistatic agents used in the backcoating layer are preferably substantially transparent so as to transmit laser beams.

In using an electrically conductive metal oxide as the antistatic agent, the particle size is preferably as small as possible to minimize light scattering, but the particle size should be determined based on the ratio of the refractive index of the particles to that of the binder as a parameter, which can be obtained according to Mie theory. The average particle size generally ranges from 0.001 to 0.5 μm, preferably from 0.003 to 0.2 μm. The term "average particle size" as used herein is intended to cover not only primary particles but agglomerates.

The first and second backcoating layers may further contain a binder and various other additives, such as surface active agents, slip agents, and matting agents. The amount of the antistatic agent contained in the first backcoating layer is preferably 10 to 1,000 parts by mass, still preferably 200 to 800 parts by mass, per 100 parts by mass of the binder. The amount of the antistatic agent in the second backcoating layer is preferably 0 to 300 parts by mass, still preferably 0 to 100 parts by mass, per 100 parts by mass of the binder.

The binders which can be used in the first and second backcoating layers include homopolymers and copolymers of acrylic monomers, e.g., acrylic acid, methacrylic acid, acrylic esters and methacrylic esters; cellulosic polymers, e.g., nitrocellulose, methyl cellulose, ethyl cellulose, and cellulose acetate; polymers of vinyl compounds, e.g., polyethylene, polypropylene, polystyrene, vinyl chloride copolymers, vinyl chloride-vinyl acetate copolymers, polyvinyl pyrrolidone, polyvinyl butyral, and polyvinyl alcohol; condensed polymers, e.g., polyester, polyurethane, and polyamide; elastic thermoplastic polymers, e.g., butadiene-styrene copolymers; polymers obtained by polymerization or crosslinking of photopolymerizable or heat polymerizable compounds, e.g., epoxy compounds; and melamine compounds.

(Light-Heat Conversion Layer)

The light-heat conversion layer comprises a light-heat converting substance and a binder optionally together with a matting agent, if needed. It may further contain other additives, if desired.

The light-heat converting substance is a substance capable of converting light energy to heat energy when irradiated with light. This substance is generally a colorant (inclusive of a pigment, the same will apply hereinafter) capable of absorbing laser light. In infrared laser recording, infrared absorbing colorants are preferably used. Useful infrared absorbing colorants include black pigments, e.g., carbon black; macrocyclic compound pigments showing absorption in the visible to near-infrared region, such as phthalocyanine pigments and naphthalocyanine pigments; organic dyes used in high-density laser recording media exemplified by optical disks (such as cyanine dyes e.g., indolenine dyes, anthraquinone dyes, azulene dyes, and phthalocyanine dyes); and organometallic colorants, such as dithiol nickel complexes. Among all, cyanine dyes have a high absorptivity coefficient in the infrared region. Use of the cyanine dyes as a light-heat converting substance makes it feasible to reduce the thickness of the light-heat conversion layer, which leads to improved recording sensitivity of the heat transfer sheet.

As the light-heat converting substances, use can be made of not only the colorants but also inorganic materials such as particulate metallic materials, e.g., blackened silver.

The binder which can be used in the light-heat conversion layer is preferably a resin having strength enough to form a layer on the substrate and a high heat conductivity, still preferably a resin having such heat resistance so as not to decompose by the heat generated by the light-heat converting substance. A heat-resistant resin maintains the surface smoothness of the light-heat conversion layer after irradiation with high energy light. Specifically, the binder resin preferably has a heat decomposition temperature of 400° C. or higher, particularly 500° C. or higher, as measured by TGA (thermogravimetric analysis; temperature at which a sample reduces its weight by 5% when heated in an air stream at a temperature rise rate of 10° C./min). The binder resin preferably has a glass transition temperature of 200 to 400° C., particularly 250 to 350° C. In the case of a glass transition temperature lower than 200° C., there arises a tendency to cause fogging in the formed image. In the case of a glass transition temperature higher than 400° C., the solubility of a resin is lowered in a solvent, which sometimes results in reduction of productivity.

It is preferred for the binder of the light-heat conversion layer to have higher heat resistance (e.g., heat deformation temperature and heat decomposition temperature) than the materials used in other layers provided on the light-heat conversion layer.

Preferred examples of the above-described binder resins include acrylic resins, e.g., polymethyl methacrylate; polycarbonate; vinyl resins, e.g., polystyrene, vinyl chloride-vinyl acetate copolymers, and polyvinyl alcohol; polyvinyl butyral, polyester, polyvinyl chloride, polyamide, polyimide, polyether imide, polysulfone, polyether sulfone, aramid, polyurethane, epoxy resins, and urea-melamine resins. Polyimide resins are especially preferred of them.

In particular, polyimide resins represented by formulae (I) to (VII) shown below are preferred, because of being soluble in organic solvents. By using these polyimide resins, the productivity of the heat transfer sheets can be improved. These polyimide resins are also preferred for obtaining improvements on viscosity stability, long-term preservability and moisture resistance of a coating composition for heat-light conversion layer.

(I)
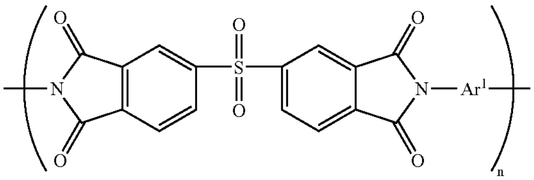
(II)
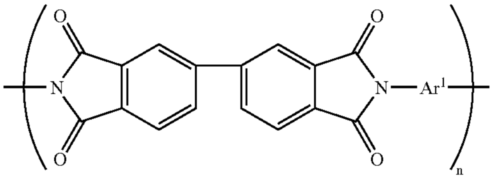
In the above general formulae (I) and (II) $Ar^1$ represents an aromatic group represented by the following structural formulae (1) to (3); and n represents an integer of from 10 to 100.
(1)
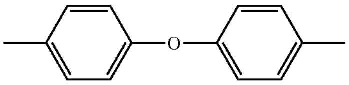
(2)
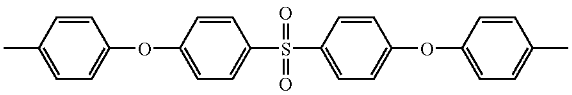
-continued
(3)
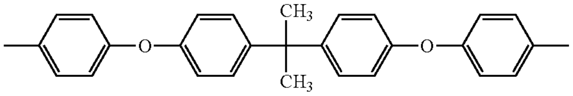
(III)
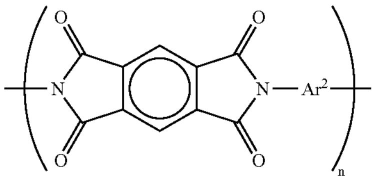
(IV)
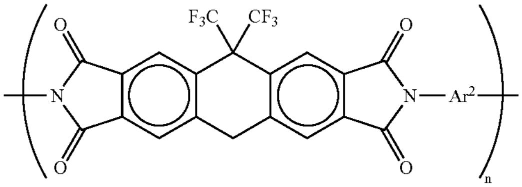
In the above general formulae (III) and (IV), $Ar^2$ represents an aromatic group represented by the following structural formulae (4) to (7); and n represents an integer of 10 to 100.
(4)
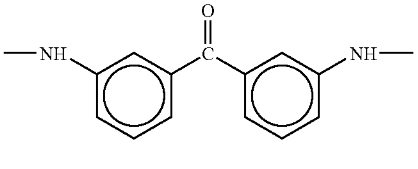
(5)
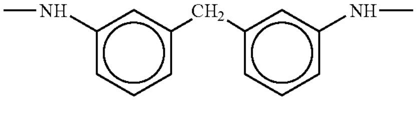
(6)
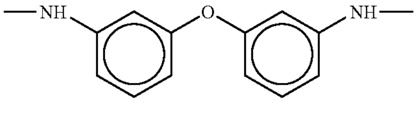
(7)
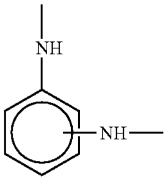
(V)
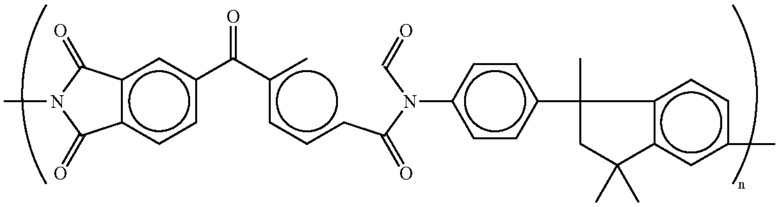

-continued (VI)

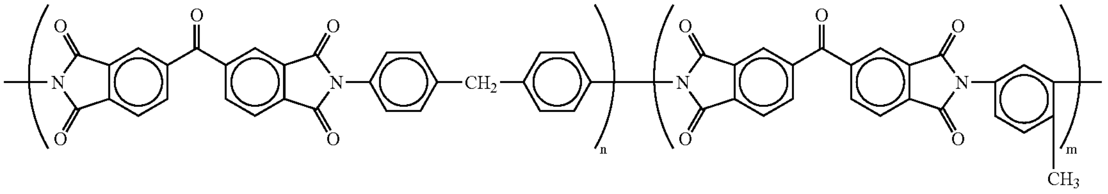

(VII)

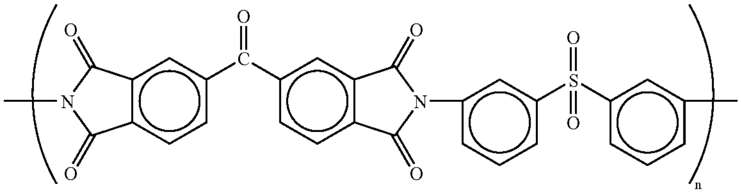

In the above general formulae (V) to (VII), n and m each represents an integer of from 10 to 100. In the formula (VI), the ratio n:m is from 6:4 to 9:1.

When at least 10 parts by mass of a binder resin dissolves in 100 parts by mass of N-methylpyrrolidone at 25° C., the resin can be regarded as soluble in organic solvents. Resins having a solubility of 10 parts by mass or more in 100 parts by mass of N-methylpyrrolidone are preferably used as a binder of the light-heat conversion layer. Resins having a solubility of 100 parts by mass or more in 100 parts by mass of N-methylpyrrolidone are particularly preferred.

The matting agents which can be added to the light-heat conversion layer include fine inorganic or organic particles. Examples of the fine inorganic particles include metal oxides, e.g., silica, titanium oxide, aluminum oxide, zinc oxide, and magnesium oxide, metal salts, e.g., barium sulfate, magnesium sulfate, aluminum hydroxide, magnesium hydroxide, and boron nitride, kaolin, clay, talc, zinc flower, lead white, zeeklite, quartz, diatomaceous earth, pearlite, bentonite, mica, and synthetic mica. Examples of the fine organic particles include particles of fluorine resins, guanamine resins, acrylic resins, styrene-acryl copolymer resins, silicone resins, melamine resins, and epoxy resins.

The matting agent usually has a particle size of 0.3 to 30 μm, preferably 0.5 to 20 μm. It is preferably added in an amount of 0.1 to 100 $mg/m^2$.

If desired, the light-heat conversion layer may further contain surface active agents, thickeners, antistatic agents, and the like.

The light-heat conversion layer is formed by dissolving the light-heat converting substance and a binder in an organic solvent and adding thereto a matting agent and other necessary additives to form a liquid coating composition and then applying it on to a substrate and drying the coating. Organic solvents which can be used to dissolve the binder include n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethyl sulfoxide, dimethylformamide, dimethylacetamide, γ-butyrolactone, ethanol, methanol and so on. Application and drying of the liquid coating composition can be carried out by application and drying methods commonly employed. Drying is usually effected at temperatures of 300° C. or lower, preferably 200° C. or lower. Where a polyethylene terephthalate substrate is used, drying is preferably performed at 80 to 150° C.

In the case where the amount of the binder in the light-heat conversion layer is too small, the light-heat conversion layer has reduced cohesion force and tends to accompany the image forming layer being transferred to the image receiving sheet, which causes image color mixing. In the case of using too much the binder, the light-heat conversion layer has an increased layer thickness for achieving a given absorbance and, in its turn, frequently suffers from a decrease in sensitivity. A preferred solid basis mass ratio of the light-heat converting substance to the binder in the light-heat conversion layer ranges from 1:20 to 2:1, particularly from 1:10 to 2:1.

It is preferred to make the light-heat conversion layer thinner, since the sensitivity of the heat transfer sheet increases as stated previously. The thickness of the light-heat conversion layer preferably ranges from 0.03 to 1.0 μm, still preferably from 0.05 to 0.5 μm. From the stand point of transfer sensitivity of the image forming layer, the optical density of the light-heat conversion layer is preferably from 0.80 to 1.26, still preferably from 0.92 to 1.15, at a wavelength of 808 nm. In the case where the optical density at a laser peak wavelength is less than 0.80, light to heat conversion tends to be insufficient, resulting in reduced transfer sensitivity. On the other hand, an optical density exceeding 1.26 would adversely affect the recording function of the light-heat conversion layer, which sometimes results in fogging. In the present invention, the optical density of the heat transfer sheet refers to the absorbance of the light-heat conversion layer at the peak wavelength of laser light used in recording with the image forming material according to the present invention. The absorbance is measured with a known spectrophotometer. A UV spectrophotometer "UV-240" supplied by Shimadzu Corp. was used in the invention. The optical density is obtained by subtracting the optical density of the substrate from that of the laminate composed of the substrate and the light-heat conversion layer.

(Image Forming Layer)

The image forming layer comprises at least a pigment which is transferred to the image receiving sheet to form an image, together with a binder for forming the layer, and, if desired, other components.

In general, pigments are roughly divided into organic pigments and inorganic ones. Organic pigments are particularly excellent in film transparency, while inorganic pigments are generally excellent in hiding powder. Therefore, appropriate pigments may be selected according to the purpose. In making the above-described heat transfer sheets for color proofing, it is preferred to use organic pigments whose color tones match or approximate the colors generally employed in printing inks, i.e., yellow, magenta, cyan and black. In addition, use may be sometimes made of metallic powders, fluorescent pigments, and the like. Examples of suitable organic pigments include azopigments, phthalocyanine pigments, anthraquinone pigments, dioxazine pigments, quinacridone pigments, isoindolinone pigments, and nitro pigments. The pigments usable in the image-forming layer are listed below for illustrative purposes only but not for limitation.

1) Yellow Pigment

Pigment Yellow 12 (C.I. No. 21090):
- Example: Permanent Yellow DHG (from Clariant (Japan) KK), Lionol Yellow 1212B (from Toyo Ink Mfg. Co., Ltd.), Irgalite Yellow LCT (from Ciba Specialty Chemicals), Symuler Fast Yellow GTF 219 (from Dainippon Ink & Chemicals, Inc.)

Pigment Yellow 13 (C.I. No. 21100):
- Example: Permanent Yellow GR (from Clariant (Japan) KK), Lionol Yellow 1313 (from Toyo Ink Mfg. Co., Ltd.)

Pigment Yellow 14 (C.I. No. 21095):
- Example: Permanent Yellow G (from Clariant (Japan) KK), Lionol Yellow 1401-G (from Toyo Ink Mfg. Co., Ltd.), Seika Fast Yellow 2270 (from Dainichiseika Colour & Chemicals Mgf. Co., Ltd.), Symuler Fast Yellow 4400 (from Dainippon Ink & Chemicals, Inc.)

Pigment Yellow 17 (C.I. No. 21105):
- Example: Permanent Yellow GG02 (from Clariant (Japan) KK), Symuler Fast Yellow 8GF (from Dainippon Ink & Chemicals, Inc.)

Pigment Yellow 155:
- Example: Graphtol Yellow 3GP (from Clariant (Japan) KK)

Pigment Yellow 180 (C.I. No. 21290):
- Example: Novoperm Yellow P-HG (from Clariant (Japan) KK.), PV Fast Yellow HG (from Clariant (Japan) KK.)

Pigment Yellow 139 (C.I. No. 56298):
- Example: Novoperm Yellow M2R 70 (from Clariant (Japan) KK.)

2) Magenta Pigment

Pigment Red 57:1 (C.I. No. 15850:1):
- Example: Graphtol Rubine L6B (from Clariant (Japan) KK), Lionol Red 6B-4290G (from Toyo Ink Mfg. Co., Ltd.), Irgalite Rubine 4BL (from Ciba Specialty Chemicals), Symuler Brilliant Carmine 6B-229 (from Dainippon Ink & Chemicals, Inc.)

Pigment Red 122 (C.I. No. 73915):
- Example: Hosterperm Pink E (from Clariant (Japan) KK.), Lionogen Magenta 5790 (from Toyo Ink Mfg. Co., Ltd.), Fastogen Super Magenta RH (from Dainippon Ink & Chemicals, Inc.)

Pigment Red 53:1 (C.I. No. 15585:1):
- Example: Permanent Lake Red LCY (from Clariant (Japan) KK), Symuler Lake Red C conc (from Dainippon Ink & Chemicals, Inc.)

Pigment Red 48:1 (C.I. No. 15865:1):
- Example: Lionol Red 2B3300 (from Toyo Ink Mfg. Co., Ltd.), Symuler Red NRY (from Dainippon Ink & Chemicals, Inc.)

Pigment Red 48:2 (C.I. No. 15865:2):
- Example: Permanent Red W2T (from Clariant (Japan) KK), Lionol Red LX235 (from Toyo Ink Mfg. Co., Ltd.), Symuler Red 3012 (from Dainippon Ink & Chemicals, Inc.)

Pigment Red 48:3 (C.I. No. 15865:3):
- Example: Permanent Red 3RL (from Clariant (Japan) KK), Symuler Red 2BS (from Dainippon Ink & Chemicals, Inc.)

Pigment Red 177 (C.I. No. 65300):
- Example: Cromophtal Red A2B (from Ciba Specialty Chemicals)

3) Cyan Pigment

Pigment Blue 15 (C.I. No. 74160):
- Example: Lionol Blue 7027 (from Toyo Ink Mfg. Co., Ltd.), Fastogen Blue BB (from Dainippon Ink & Chemicals, Inc.)

Pigment Blue 15:1 (C.I. No. 74160):
- Example: Hosterperm Blue A2R (from Clariant (Japan) KK), Fastogen Blue 5050 (from Dainippon Ink & Chemicals, Inc.)

Pigment Blue 15:2 (C.I. No. 74160):
- Example: Hosterperm Blue AFL (from Clariant (Japan) KK), Irgalite Blue BSP (from Ciba Specialty Chemicals), Fastogen Blue GP (from Dainippon Ink & Chemicals, Inc.)

Pigment Blue 15:3 (C.I. No. 74160):
- Example: Hosterperm Blue B2G (from Clariant (Japan) KK.), Lionol Blue FG7330 (from Toyo Ink Mfg. Co., Ltd.), Cromophtal Blue 4GNP (from Ciba Specialty Chemicals), Fastogen Blue FGF (from Dainippon Ink & Chemicals, Inc.)

Pigment Blue 15:4 (C.I. No. 74160):
- Example: Hosterperm Blue BFL (from Clariant (Japan) KK), Cyanine Blue 700-10FG (from Toyo Ink Mfg. Co., Ltd.), Irgalite Blue GLNF (from Ciba Specialty Chemicals), Fastogen Blue FGS (from Dainippon Ink & Chemicals, Inc.)

Pigment Blue 15:6 (C.I. No. 74160):
- Example: Lionol Blue ES (from Toyo Ink Mfg. Co., Ltd.)

Pigment Blue 60 (C.I. No. 69800):
- Example: Hosterperm Blue RL01 (from Clariant (Japan) KK.), Lionogen Blue 6501 (from Toyo Ink Mfg. Co., Ltd.)

4) Black Pigment

Pigment Black 7 (Carbon Black C.I. No. 77266):
- Example: Mitsubishi Carbon Black MA100 (from Mitsubishi Chemicals Co., Ltd.), Mitsubishi Carbon Black #5 (from Mitsubishi Chemicals Co., Ltd.), Black Pearls 430 (from Cabot Co.)

The pigments usable in the present invention can be chosen from commercially available products by referring to Nippon Ganryo Gijutsu Kyokai (ed.), *Ganryo Binran*, Seibundo Shinko-Sha (1989), and *COLOUR INDEX, THE SOCIETY OF DYES* & *COLOURIST,* 3rd Ed. (1987).

The image forming layer preferably contains from 30 to 70% by mass, still preferably from 30 to 50% by mass, of the pigments as described above.

The above-described pigments preferably have an average particle size of 0.03 to 1 μm, particularly 0.05 to 0.5 μm.

In the case where the average particle size is smaller than 0.03 μm, pigment dispersing cost tends to increase, and dispersions tend to gel. In the case where the average particle size exceeds 1 μm, on the other hand, coarse particles in the pigments sometimes inhibit the adhesion between the image forming layer and the image receiving layer or injure the transparency of the image forming layer.

The binder to be contained in the image forming layer preferably includes amorphous organic polymers having a softening point of 40 to 150° C. Examples of such amorphous organic polymers include butyral resins, polyamide resins, polyethylene-imine resins, sulfonamide resins, polyester polyol resins, petroleum resins, homopolymers and copolymers of styrene or derivatives thereof, e.g., styrene, vinyltoluene, α-methylstyrene, 2-methylstyrene, chlorostyrene, vinylbenzoic acid, sodium vinylbenzenesulfonate, and aminostyrene, and homopolymers and copolymers of vinyl compounds, such as methacrylic acid and esters thereof, e.g., methyl methacrylate, ethyl methacrylate, butyl methacrylate, and hydroxyethyl methacrylate, acrylic acid and esters thereof, e.g., methyl acrylate, ethyl acrylate, butyl acrylate, and α-ethylhexyl acrylate, dienes, e.g., butadiene and isoprene, acrylonitrile, vinyl ethers, maleic acid, maleic esters, maleic anhydride, cinnamic acid, vinyl chloride, and vinyl acetate. These resins may be used either individually or as a mixture thereof.

The image forming layer preferably contains 30 to 70% by mass, particularly 40 to 70% by mass, of the resin.

The image forming layer can further contain the following components (1) to (3).

(1) Waxes

Useful waxes include mineral waxes, natural waxes, synthetic waxes and so on. Examples of the mineral waxes are petroleum waxes, such as paraffin wax, microcrystalline wax, ester wax and oxide waxes, montan wax, ozokerite, ceresin, etc. Paraffin wax is preferred above all. The paraffin wax is Separated from petroleum, and various products having different melting points are commercially available.

Examples of the natural waxes include vegetable waxes such as carnauba wax, Japan wax, auriculae wax, and esparto wax, and animal waxes such as beeswax, insect wax, shellac wax, and spermaceti.

The above-described synthetic waxes are commonly used as a lubricant and generally comprise higher fatty acid compounds. Examples thereof are as follows.

1) Fatty Acid Waxes

Straight-chain saturated fatty acids represented by the following general formula:

$$CH_3(CH_2)_nCOOH$$

wherein n is an integer of 6 to 28.

Specific examples thereof include stearic acid, behenic acid, palmitic acid, 12-hydroxystearic acid and azelaic acid.

Moreover, metal (e.g., K, Ca, Zn or Mg) salts of the above fatty acids may be cited as examples.

2) Fatty Acid Ester Waxes

Specific examples of fatty acid esters include ethyl stearate, lauryl stearate, ethyl behenate, hexyl behenate, behenyl myristate and so on.

3) Fatty Acid Amide Waxes

Specific examples of fatty acid amides include stearamide, lauramide and so on.

4) Aliphatic Alcohol Waxes

Straight-chain saturated aliphatic alcohols represented by the following general formula:

$$CH_3(CH_2)_nOH$$

wherein n is an integer of 6 to 28.

Specific examples thereof include stearyl alcohol and so on.

Among the synthetic waxes 1) to 4) as described above, higher fatty acid amides such as stearamide and lauramide are suitable. These wax compounds can be used either alone or in a combination thereof.

(2) Plasticizers

As the above-described plasticizers, it is preferable to use ester compounds. Examples thereof include known plasticizers, e.g., phthalic acid esters such as dibutyl phthalate, di-n-octyl phthalate, di(2-ethylhexyl) phthalate, dinonyl phthalate, dilauryl phthalate, butyllauryl phthalate and butylbenzyl phthalate, aliphatic dibasic acid esters, such as di(2-ethylhexyl) adipate, and di(2-ethylhexyl) sebacate, phosphoric triesters such as tricresyl phosphate and tri(2-ethylhexyl) phosphate, polyol polyesters such as polyethylene glycol esters, and epoxy compounds such as epoxy fatty acid esters. Among them, vinyl monomer esters, particularly acrylic acid esters and methacrylic acid esters are preferred in view of their effects in improving transfer sensitivity, preventing transfer unevenness, and controlling elongation at break.

Examples of the above-described acrylic acid and methacrylic acid esters include polyethylene glycol dimethacrylate, 1,2,4-butanetriol trimethacrylate, trimethylolethane triacrylate, pentaerythritol acrylate, pentaerythritol tetraacrylate, dipentaerythritol polyacrylate and so on.

As the above-described plasticizers, use may be also made of polymeric plasticizers. Polyesters are preferred polymeric plasticizers because of having a favorable addition effect and being hardly diffusibile during storage. As such polyester plasticizers, sebacic acid polyesters, adipic acid polyesters, etc. may be cited.

These plasticizers can be used either individually or as a combination of two or more thereof.

In the case where the additives such as the above-described waxes (1) and the above-described plasticizers (2) are contained in excessively large amounts in the image forming layer, there sometimes arise problems such as lowering in the resolution of a transferred image, lowering in the strength of the image forming layer, or transfer of a non-exposed area of the image forming layer to an image receiving sheet due to lowering in the adhesion between the image forming layer and the light-heat conversion layer. From these viewpoints, it is preferable that the wax content in the image forming layer is from 0.1 to 30% by mass, still preferably 1 to 20% by mass, based on the total solid content of the image forming layer. Likewise, it is preferable that the plasticizer content is 0.1 to 20% by mass, still preferably 0.1 to 10% by mass, based on the total solid content of the image forming layer.

(3) Other Additives

The additives to be added to the image forming layer are not restricted to those described above.

That is, the image forming layer may further contain additives other than the above-described ones, such as surface active agents, organic or inorganic fine particles (e.g., metallic powder and silica gel), oils (e.g., linseed oil and mineral oil), thickeners and antistatic agents. A substance having an absorption at a writing laser wavelength can be added to the image forming layer except for the case where a black image is to be formed, which is beneficial for transfer energy saving. Although such a substance may be either a pigment or a dye, it is desirable for color reproduction in the case of forming a color image to use a recording light source emitting infrared light such as semiconductor laser and to add a dye having a small absorption in the visible region and a large absorption at the wavelength of the light source. As examples of near infrared absorbing dyes, compounds described in JP-A-3-103476 can be cited.

The image forming layer can be formed by dissolving or dispersing the pigment and the binder in a solvent to prepare a liquid coating composition, applying the liquid coating composition on the light-heat conversion layer (or a heat-sensitive release layer if provided on the light-heat conversion layer as described later), and drying the coating. Examples of the solvent for use in the preparation of the liquid coating composition include n-propyl alcohol, methyl ethyl ketone, propylene glycol monomethyl ether (MFG), methanol, water and so on. Coating and drying can be performed according to ordinary coating and drying methods.

Between the light-heat conversion layer and the image forming layer, the heat transfer sheets may each have a heat-sensitive release layer which contains a heat-sensitive material generating gas or releasing adsorption water under the action of the heat generated in the light-heat conversion layer and thereby reducing the adhesive strength between the light-heat conversion layer and the image forming layer. Such a heat-sensitive material includes compounds (including polymers and low-molecular compounds) which decompose or denature by heat to generate gas, compounds (including polymers and low-molecular compounds) which have absorbed or adsorbed a considerable amount of a volatile compound, such as water, etc. Such compounds may be used in combination.

Examples of the polymers which generate gas on thermal decomposition or denaturation include self-oxidizing polymers, such as nitrocellulose, halogen-containing polymers such as chlorinated polyolefin, chlorinated rubber, polychlorinated rubber, polyvinyl chloride, and polyvinylidene chloride, acrylic polymers such as polyisobutyl methacrylate having adsorbed a volatile compound such as water, cellulose esters such as ethyl cellulose having adsorbed a volatile compound such as water, and natural high molecular compounds such as gelatin having adsorbed a volatile compound such as water. Examples of the low-molecular compounds which generate gas on heat decomposition or denaturation include diazo compounds and azide compounds which thermally decompose to generate gas.

It is preferable that decomposition or denaturation of the heat-sensitive material should occur at 280° C. or lower, still preferably 230° C. or lower.

In the case of using a low-molecular heat-sensitive material in the heat-sensitive release layer, it is preferably used in combination with a binder. As the binder, use may be made of one that decomposes or denatures per se to generate gas. Alternatively, use may be made of a commonly employed binder having no such properties. In the case of using a low-molecular weight heat-sensitive compound with a binder in combination, the mass ratio of the former to the latter is preferably from 0.02:1 to 3:1, still preferably 0.05:1 to 2:1. It is preferred that the heat-sensitive release layer is provided on substantially the entire surface of the light-heat conversion layer. The thickness of the heat-sensitive release layer is usually from 0.03 to 1 μm, preferably from 0.05 to 0.5 μm.

In the heat transfer sheet of the layer structure having a light-heat conversion layer, a heat-sensitive release layer, and an image forming layer provided on the substrate in that order, the heat-sensitive release layer decomposes or denatures by heat conducted from the light-heat conversion layer to generate gas. As a result of this decomposition or gas generation, part of the heat-sensitive release layer disappears, or cohesive failure occurs in the heat-sensitive release layer. Thus, the adhesive strength between the light-heat conversion layer and the image forming layer is reduced. Accordingly, depending on the behavior of the heat-sensitive release layer, it is sometimes observed that part of the heat-sensitive release layer accompanies the image forming layer transferred to the image receiving sheet, which causes color mixing in the transfer image. Therefore, it is desirable that the heat-sensitive release layer is substantially colorless so that no perceptible color mixing may occur even if such undesired transfer of the heat-sensitive release layer should happen. In other words, the heat-sensitive release layer should desirably have high transparency to visible rays. Specifically, the absorbance of the heat-sensitive release layer in the visible region is 50% or less, preferably 10% or less.

Instead of providing an independent heat-sensitive release layer, the above-mentioned light-sensitive material may be added to the liquid coating composition for the light-heat conversion layer to form the light-heat conversion layer capable of serving both as a light-heat conversion layer and a heat-sensitive release layer.

It is preferred for the heat transfer sheet to have a coefficient of static friction of 0.35 or smaller, particularly 0.20 or smaller, on its outmost layer in the image forming layer side. By controlling the coefficient of static friction of to 0.35 or smaller, the feed rollers for carrying the heat transfer sheets are prevented from being contaminated, and the qualities of the transfer image can be improved. The coefficient of static friction is measured in accordance with the method taught in JP-A-2001-47753, para. [0011].

The image forming layer preferably has a smooster value of 0.5 to 50 mmHg (≈0.0665 to 6.65 kPa) at 23° C. and 55% RH and an Ra of 0.05 to 0.4 μm. Thus, the microscopic spaces formed between the image receiving layer and the image forming layer are reduced in size and number, which favors to image transfer and image qualities. The surface hardness of the image forming layer is preferably 10 g or more measured with a sapphire stylus. The static dissipation capability of the image forming layer is preferably such that, when the layer is electrically charged according to Federal Test Standard Method 4046 and then grounded, the electrification potential 1 second after grounding is −100 to 100 V. It is preferred that the surface resistivity of the image forming layer at 23° C. and 55% RH be $10^9$ Ω or less.

In the present invention, the ratio of the optical density (OD) of the image forming layer to the film thickness (μm) (OD/film thickness ratio) is 1.50 or more, preferably 1.8 or more and still preferably 2.5 or more. So long as the ratio of the optical density (OD) to the film thickness (μm) fulfills the requirement as described above, an image having a sufficient transfer density and high resolution can be obtained, thereby giving favorable results. The optical density (OD) of the image forming layer preferably ranges from 0.5 to 2.5, still preferably from 0.8 to 2.0. The film thickness (μm) of the image forming layer preferably from 0.1 to 1.0 μm, still preferably from 0.3 to 0.7 μm. The optical density of the image forming layer, which means the image forming layer absorbance at the peak wavelength of the laser beam to be used in recording with the image forming material according to the invention, is measured with a known spectrophotometer. A UV spectrophotometer "V-240" supplied by Shimadzu Corp. was used in the invention. The optical density (OD) of the image forming layer can be controlled by appropriately selecting a pigment or varying the dispersion grain size of the pigment.

The multicolor image recording area achieved by the heat transfer sheet is 515 mm by 728 mm (B2 size) or larger, preferably 594 mm by 841 mm (A1 size) or larger. Thus, large-sized DDCPs can be obtained. The multicolor image recording area of the heat transfer sheet corresponds to the area of the image forming layer.

Next, an image receiving sheet to be used in combination with the heat transfer sheets as described above will be illustrated.

[Image Receiving Sheet]

(Layer Structure)

The image receiving sheet generally comprises a substrate and one or more image receiving layers provided thereon. If desired, the image receiving sheet may additionally have one or more layers selected from a cushioning layer, a release layer, and an intermediate layer provided between the substrate and the image receiving layer. From the viewpoint of smooth pass, it is preferred to provide a backcoating layer in the opposite side of the image receiving layer of the substrate.

(Substrate)

Examples of the substrate includes sheet materials commonly employed such as a plastic sheet, a metal sheet, a glass sheet, resin-coated paper, paper, and various composite laminates. Examples of the plastic sheet include a polyethylene terephthalate sheet, a polycarbonate sheet, a polyethylene sheet, a polyvinyl chloride sheet, a polyvinylidene chloride sheet, a polystyrene sheet, a styrene-acrylonitrile sheet, a polyester sheet and so on. As the paper, use can be made of actual printing paper, coated paper and so on.

It is preferred for the substrate to have micro voids to improve qualities of a transfer image. Such substrates with micro voids can be obtained by, for example, extruding one or more molten mixtures of a thermoplastic resin and a filler, such as an inorganic pigment or a polymer incompatible with the thermoplastic resin, into a single-layer or multilayer film and stretching the extruded film uniaxially or biaxially. The void ratio of the resulting stretched film depends on the kinds of the resin and the filler, the mixing ratio, the stretching conditions, etc.

As a thermoplastic resin as described above, a polyolefin resin, such as polypropylene, or polyethylene terephthalate is preferably used since they are excellent in crystallinity and stretchability and, therefore, make it easy to form voids. A combination of the above-described polyolefin resin or polyethylene terephthalate and a minor proportion of other thermoplastic resin is preferred. An inorganic pigment to be used as a filler as described above preferably has an average particle size of from 1 to 20 μm. Use can be made therefor of calcium carbonate, clay, diatomaceous earth, titanium oxide, aluminum hydroxide, silica and so on. As an incompatible resin to be used as a filler, in using polypropylene as a thermoplastic resin, it is preferable to use polyethylene terephthalate as a filler in combination. For the details of preparation of a substrate with micro voids, reference can be made in JP-A-2001-105752.

The content of the filler, such as an inorganic pigment, in the substrate is usually from about 2 to 30% by volume.

The thickness of the substrate of the image receiving sheet is usually from 10 to 400 μm, preferably 25 to 200 μm. The substrate may be subjected to surface treatment, e.g., corona discharge treatment or glow discharge treatment to improve adhesion to the image receiving layer (or a cushioning layer) or to improve the adhesion between the image receiving layer and the image forming layer of the heat transfer sheet.

(Image Receiving Layer)

To transfer the image forming layer and fix the same, it is preferable that the image receiving sheet has at least one image receiving layer. The image receiving layer is preferably formed of a resin binder matrix. The resin binder is preferably a thermoplastic resin. Examples thereof include homopolymers and copolymers of acrylic monomers, e.g., acrylic acid, methacrylic acid, acrylic esters, and methacrylic esters, cellulosic polymers, e.g., methyl cellulose, ethyl cellulose, and cellulose acetate, homopolymers and copolymers of vinyl monomers, e.g., polystyrene, polyvinylpyrrolidone, polyvinyl butyral, polyvinyl alcohol, and polyvinyl chloride, condensed polymers, e.g., polyester and polyamide, and rubbery polymers, e.g., butadiene-styrene copolymers. To ensure an appropriate adhesion force to the image forming layer, the binder of the image receiving layer is preferably a polymer having a glass transition temperature (Tg) of 90° C. or lower. A plasticizer may be added to the image forming layer for the purpose. The binder resin preferably has a Tg of 30° C. or higher for preventing blocking among sheets. It is particularly preferred that the binder polymer of the image receiving layer and that of the image forming layer are the same or at least analogous to each other so that these layers may be in intimate adhesion during laser writing thereby to improve transfer sensitivity and image strength.

The image receiving layer surface preferably has a smooster value of 0.5 to 50 mmHg (≈0.0665 to 6.65 kPa) measured at 23° C. and 55% RH and an Ra of 0.05 to 0.4 μm. The Ra of the image receiving layer is adjusted so as to satisfy the relationship to Rz as defined above. The static dissipation capability of the image receiving layer is preferably such that, when the image receiving sheet is electrically charged according to Federal Test Standard Method 4046 and then grounded, the electrification potential 1 second after grounding is −100 to 100 V. It is preferred that the surface resistivity of the image receiving layer at 23° C. and 55% RH be $10^9$ Ω or less. The image receiving layer surface preferably has a coefficient of static friction of 0.2 or smaller. It is also preferable that the image receiving layer surface has a surface energy of 23 to 35 $mg/m^2$.

In the case where the transfer image once formed on the image receiving layer is re-transferred to printing paper, etc., it is preferred that at least one image receiving layer is made of a photocuring material. Such a photocuring material includes a combination comprising, for example, (a) at least one photopolymerizable monomer selected from polyfunctional vinyl and/or vinylidene compounds capable of addition polymerization, (b) an organic polymer, and (c) a photopolymerization initiator, and optionally additives such as a thermal polymerization inhibitor. The polyfunctional vinyl monomers (a) include unsaturated esters of polyols, particularly acrylic acid or methacrylic acid esters (e.g., ethylene glycol diacrylate and pentaerythritol tetraacrylate).

As the above-described organic polymer, the polymers recited above for use to form the image receiving layer may be cited. As the photopolymerization initiator, use may be made of ordinary photo-radical polymerization initiators, e.g., benzophenone and Michler's ketone. The initiator is used in an amount of 0.1 to 20% by mass based on the weight of the layer.

The image receiving layer is formed by dissolving a binder optionally together with a photocuring material and other components in an organic solvent to form a liquid coating composition and then applying it on to a substrate and drying the coating. Organic solvents which can be used to dissolve the binder include, for example, n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethyl sulfoxide, dimethylformamide, dimethylacetamide, γ-butyrolactone, ethanol, methanol and so on.

Examples of organic solvents having a boiling point of 70° C. or lower include methanol, acetone, diethyl ether, methyl acetate and so on. As described above, it is preferable to use such an organic solvent in an amount of 30% by mass or more based on the total organic solvents employed.

Application and drying of the liquid coating composition can be carried out by application and drying methods commonly employed. Drying is usually effected at temperatures of 300° C. or lower, preferably 200° C. or lower. Where a polyethylene terephthalate substrate is used, drying is preferably performed at 80 to 150° C.

The thickness of the image receiving layer is generally from 0.3 to 7 μm, preferably from 0.7 to 4 μm. In the case where the thickness is less than 0.3 μm, the sheet tends to be broken in re-transferring to printing paper due to insufficient film strength. In the case where the thickness is too large, glossiness of the image after re-transfer to printing paper is elevated and thus approximation to final prints is worsened.

(Other Layers)

A cushioning layer may be provided between the substrate and the image receiving layer. A cushioning layer can improve adhesion between the image receiving layer and the image forming layer during laser writing, which leads to image quality improvement. Even when foreign matters enter between the heat transfer sheet and the image receiving sheet, the cushioning layer is deformed to minimize the non-contact area of the image receiving layer and the image forming layer. As a result, possible image defects, such as white spots, can be minimized in size. Furthermore, when the transfer image on the image receiving sheet is re-transferred to printing paper, etc., the image receiving layer is deformable with the surface roughness of the paper thereby to improve the transfer capabilities. The cushioning layer is also effective in controlling the glossiness of the re-transfer image and improving approximation to the final prints.

To achieve the above-described effects, the cushion layer, which is liable to be deformed under the application of a force to the image receiving layer, is preferably formed of materials having a low elastic modulus, materials having rubbery elasticity or thermoplastic resins ready to soften on heating. The cushioning layer preferably has an elastic modulus of 0.5 MPa to 1.0 GPa, particularly 1 MPa to 0.5 GPa, especially 10 to 100 MPa, at room temperature. In order for the cushioning layer to have dust or debris sinking, the cushioning layer preferably has a penetration of 10 or more as measured according to JIS K2530 (25° C., 100 g, 5 seconds). The cushioning layer preferably has a glass transition temperature of 80° C. or lower, particularly 25° C. or lower, and a softening point of 50 to 200° C. To control these physical properties, such as the Tg, it is appropriate to add a plasticizer to the polymer binder forming the cushioning layer.

Examples of binders making up the cushioning layer include rubbers, such as urethane rubber, butadiene rubber, nitrile rubber, acrylic rubber, and natural rubber, polyethylene, polypropylene, polyester, styrene-butadiene copolymers, ethylene-vinyl acetate copolymers, ethylene-acrylic copolymers, vinyl chloride-vinyl acetate copolymers, vinylidene chloride resins, vinyl chloride resins containing a plasticizer, polyamide resins, phenol resins and so on.

The thickness of the cushioning layer is usually 3 to 100 μm, preferably 10 to 52 μm, though it varies depending on the kind of the binder and other conditions.

Although the image receiving layer and the cushioning layer must adhere to each other until completion of laser writing, the image receiving layer is preferably releasable when re-transferring the transfer image onto printing paper. To facilitate the release from the cushioning layer, it is preferable that a release layer having a thickness of about 0.1 to 2 μm is provided between the cushioning layer and the image receiving layer. The thickness of the release layer, which can be adjusted by proper choice of material, should be small so as not to impair the effects of the cushioning layer.

Examples of binders used to form the release layer include thermoplastic resins having a Tg of 65° C. or higher, such as polyolefins, polyester, polyvinyl acetal, polyvinyl formal, polyparabanic acid, polymethyl methacrylate, polycarbonate, ethyl cellulose, nitrocellulose, methyl cellulose, carboxymethyl cellulose, hydroxypropyl cellulose, polyvinyl alcohol, polyvinyl chloride, urethane resins, fluorine resins, styrenes such as polystyrene and acrylonitrile-styrene copolymers, crosslinking products of these resins, polyamide, polyimide, polyether-imide, polysulfone, polyether sulfone, and aramid, and hardened products thereof. Commonly employed hardening agents, such as isocyanate and melamine, can be used for hardening.

By taking the physical properties described above into consideration, binders preferred for making the release layer are polycarbonate, acetal resins, and ethyl cellulose for their good storage stability. It is particularly suitable to use acrylic resins in the image receiving layer, since favorable releasability is observed in re-transferring an image after laser heat transfer.

It is also possible to use a layer that extremely reduces in adhesion to the image receiving layer on cooling as a release layer. More specifically speaking, such a layer comprises hot-melt compounds, such as waxes, and thermoplastic resins such as binders as a main ingredient.

Examples of the hot-melt compounds include substances described in JP-A-63-193886. Preferred hot-melt compounds include microcrystalline wax, paraffin wax, carnauba wax and soon. Useful thermoplastic resins include ethylene copolymers, such as ethylene-vinyl acetate copolymers, cellulosic resins and so on.

If desired, the above-described release layer can contain such additives as higher fatty acids, higher alcohols, higher fatty acid esters, higher fatty acid amides, higher aliphatic amines and so on.

Another constitution of a release layer is a layer that melts or softens on heating and undergoes cohesive failure per se. It is preferable that such a release layer contains a supercooling material.

Useful supercooling materials include poly-ε-caprolactone, polyoxyethylene, benzotriazole, tribenzylamine, vanillin and so on.

Still another constitution of a release layer is a layer containing a compound which reduces the adhesion to the image receiving layer. Such compounds include silicone resins, e.g., silicone oil; fluorine resins, e.g., Teflon and fluorine-containing acrylic resins; polysiloxane resins; acetal resins, e.g., polyvinyl butyral, polyvinyl acetal, and polyvinyl formal; solid waxes, e.g., polyethylene wax and amide wax; fluorine type or phosphoric ester type surface active agents, and so on.

The release layer is formed by dissolving or dispersing (as a latex) the above-described material in a solvent and then applying the obtained product to the cushioning layer by various techniques, such as blade coating, roll coating, bar coating, curtain coating, gravure coating, hot-melt extrusion lamination, and the like. Alternatively, the solution or latex may be applied to a carrier film by the above-described application techniques to form a coating film, which is bonded to the cushioning layer, followed by the separation of the carrier film.

The image receiving sheet to be combined with the above-described heat transfer sheet may have a structure wherein the image receiving layer also serves as a cushioning layer. In this case, the image receiving sheet may have a layer structure of substrate/cushioning image receiving layer or another layer structure of substrate/undercoating layer/cushioning image receiving layer. In this case, it is also preferred that the cushioning image receiving layer is provided such that it is ready to be released and transferred to printing paper. In this case, the re-transfer image on the printing paper has excellent gloss.

The cushioning image receiving layer usually has a thickness of 5 to 100 μm, preferably 10 to 40 μm.

It is advisable to provide a backcoating layer on the reverse side (opposite to the image receiving layer side) of the substrate to improve transport properties of the image receiving sheet. The improvement on film transport properties in a recording apparatus is ensured by adding to the backcoating layer an antistatic agent such as a surface active agent or fine tin oxide particles and a matting agent such as silicon oxide or PMMA particles.

If necessary, these additives may be added to not only the backcoating layer but other layers including the image receiving layer. The kind of the additive cannot be determined in general, since it depends on the purpose. In the case of a matting agent, for example, a matting agent having an average particle size of 0.5 to 10 μm is added in an amount of about 0.5 to 80% based on the layer to which it is added. In the case of an antistatic agent, an appropriate compound selected from various surface active agents and electrically conductive agents is added to reduce the surface resistivity of the layer to $10^{12}$ Ω or lower, preferably $10^9$ Ω or less, at 23° C. and 50% RH.

General-purpose polymers can be used as a binder of the backcoating layer, for example, gelatin, polyvinyl alcohol, methyl cellulose, nitrocellulose, acetyl cellulose, aromatic polyamide resins, silicone resins, epoxy resins, alkyd resins, phenol resins, melamine resins, fluorine resins, polyimide resins, urethane resins, acrylic resins, urethane-modified silicone resins, polyethylene resins, polypropylene resins, polyester resins, Teflon resins, polyvinyl butyral resins, vinyl chloride resins, polyvinyl acetate, polycarbonate, organoboron compounds, aromatic esters, polyurethane fluoride, polyether sulfone, and so on.

It is efficacious to use crosslinkable water-soluble resins and crosslink to give a binder, thereby preventing fall-off of matting agent particles, improving scratch resistance of the backcoating layer, and preventing blocking of image receiving sheets during storage.

The crosslinking of the crosslinkable water-soluble resins can be induced by at least one of heat, active light rays, and pressure. In some cases, an arbitrary adhesive layer may be provided on the substrate in the side of forming the backcoating layer.

Organic or inorganic fine particles can be used as a matting agent added to the backcoating layer. Examples of the organic matting agents include particles of polymers obtained by radical polymerization, such as polymethyl methacrylate (PMMA), polystyrene, polyethylene, and polypropylene, and condensed polymers, such as polyester and polycarbonate.

The backcoating layer preferably has a coating amount of about 0.5 to 5 g/$m^2$. In the case where the coating amount is less than 0.5 g/$m^2$, it is difficult to form stable backcoating layer and there arises a tendency to allow matting agent particles to fall off. In the case where the application is made in a coating amount largely exceeding 5 g/$m^2$, the matting agent present therein must have a considerably large particle size which might cause embossing on the surface of the image receiving layer during storage due to the backcoating layer. In heat transfer of transferring an image forming layer of the thin film type, the transfer image on the image receiving layer may suffer from image deficiency or unevenness.

It is preferred that the matting agent used in the backcoating layer has a number-average particle size greater than the thickness of the area of the backcoating layer comprising the binder alone by 2.5 to 20 μm. It is necessary that matting agent particles of 8 μm or greater are present in an amount of 5 mg/$m^2$ or more, particularly 6 to 600 mg/$m^2$, thereby to reduce troubles due to foreign matter. In order to prevent image defects attributed to extraordinary large particles and to obtain desired performance with a reduced amount of a matting agent, it is preferred to use a matting agent whose sizes are narrowly distributed with a coefficient of variation σ/rn (coefficient of variation in particle size distribution) of 0.3 or smaller, preferably 0.15 or smaller.

The backcoating layer preferably contains an antistatic agent to prevent foreign matter attraction due to triboelectricity of the feed roller. A wide range of known antistatic agents can be used, such as cationic, anionic or nonionic surface active agents, polymeric antistatics, electrically conductive particles, and compounds described in 11290 *no Kagaku Syohin*, Kagaku Kogyo Nipposha, 875–876.

Among these substances, antistatic agents suitable for use in the backcoating layer are electrically conductive materials, such as carbon black, metal oxides, e.g., zinc oxide, titanium oxide, and tin oxide, and organic semiconductors. Electrically conductive fine particles are particularly preferred, for they do not separate from the backcoating layer to exert stable and environment-independent antistatic effects.

The backcoating layer can further contain various activators or release agents, such as silicone oil and fluorine resins, for improving coating capabilities or releasability.

It is especially preferable to provide the above-described backcoating layer in the case where the cushioning layer and the image receiving layer have a softening point of 70° C. or lower measured by TMA (hermochemical analysis).

The TMA softening point is obtained by observing the phase of a sample being heated at a given rate of temperature rise with a given load applied thereto. In the present invention, the temperature at which the phase of the sample begins to change is defined as a TMA softening point. Measurement of a TMA softening point can be made with, for example, Thermoflex supplied by Rigaku Denki-Sha.

In image formation, each of the heat transfer sheets and the image receiving sheet are superposed on each other to prepare a laminate with the image forming layer of the former and the image receiving layer of the latter in contact.

In this case, it is preferable that the water contact angles of the image forming layer of the heat transfer sheet and the image receiving layer of the image receiving sheet range from 7.0 to 12.0°. It is also preferable that the ratio of the optical density (OD) and the film thickness (μm) (OD/fim thickness) of the image forming layer of each heat transfer sheet is 1.80 or more and the water contact angle of the image receiving sheet is 86° or less.

A laminate of the heat transfer sheet and the image receiving sheet can be prepared by various methods. For example, the two sheets superposed on each other in the above-described manner are passed through a pair of pressure and heat rollers. The heating temperature of the rollers is 160° C. or lower, preferably 130° C. or lower.

Another method of preparing the laminate is vacuum holding, which has previously been described. In the vacuum holding method, the image receiving sheet is the first wound by suction around a recording drum having a number of suction holes. The heat transfer sheet, which is designed to be slightly larger in size than the image receiving sheet, is then held on the image receiving sheet while the entrapped air is pressed out with a squeeze roller. Still another method of preparing the laminate comprises pulling the image receiving sheet to a recording drum, mechanically fixing the sheet onto the drum, and then fixing the heat transfer sheet thereon in the same manner as for the image receiving sheet. Among these methods, the vacuum holding method is especially advantageous in that temperature control (as required for heat rollers) is unnecessary, and uniform contact of the two sheets is accomplished quickly.

Next, the present invention will be illustrated in greater detail by referring to the following Examples. However, it is to be understood that the present invention is not construed as being restricted thereto. Unless otherwise noted, all “parts” mean “parts by mass”.

EXAMPLE 1-1

Preparation of Heat Transfer Sheet K (Black)

[Formation of Backcoating Layer]

[Preparation of Liquid Coating Solution for First Backcoating Layer]

| | |
|---|---|
| Aqueous dispersion of acrylic resin (Jurymer ET410, available from Nihon Junyaku Co., Ltd.; solid content: 20%) | 2 parts |
| Antistatic agent (aqueous dispersion of tin oxide-antimony oxide; average particle size: 0.1 μm; solid content: 17% by mass) | 7.0 parts |
| Polyoxyethylene phenyl ether | 0.1 part |
| Melamine compound (Sumitex Resin M-3, from Sumitomo Chemical Co., Ltd.) | 0.3 part |
| Distilled water | to make 100 parts |

[Formation of First Backcoating Layer]

A biaxially stretched polyethylene terephthalate (PETP) substrate (Ra of 0.01 μm on both sides) having a thickness of 75 μm was subjected to corona discharge treatment on one side (the back face). The liquid coating composition for first backcoating layer was applied to the corona discharge treated side of the substrate to a dry thickness of 0.03 μm and dried at 180° C. for 30 seconds to form a first backcoating layer. The substrate used had a Young’s modulus of 450 kg/mm$^2$ (≈4.4 GPa) in the machine direction and of 500 kg/mm$^2$ (≈4.9 GPa) in the transverse direction, an F-5 value of 10 kg/mm$^2$ (≈98 MPa) in the machine direction and of 13 kg/mm$^2$ (≈127.4 MPa) in the transverse direction; a thermal shrinkage percentage of 0.3% in the MD and of 0.1% in the TD both after heating at 100° C. for 30 minutes; a breaking strength of 20 kg/mm$^2$ (≈196 MPa) in the machine direction and of 25 kg/mm$^2$ (≈245 MPa) in the transverse direction; and an elastic modulus at 20° C. of 400 kg/mm$^2$ (≈3.9 GPa).

[Preparation of Liquid Coating Solution for Second Backcoating Layer]

| | |
|---|---|
| Polyolefin (Chemipearl S-120, available from Mitsui Chemicals, Inc.; solid content: 27%) | 3.0 parts |
| Antistatic agent (water-born dispersion of tin oxide-antimony oxide; average particle size: 0.1 μm; solid content: 17%) | 2.0 parts |
| Colloidal silica (Snowtex C, available from Nissan Chemical Industries, Ltd.; solid content: 20%) | 2.0 parts |
| Epoxy compound (Denacol EX-614B, from Nagase Chemical Co., Ltd.) | 0.3 part |
| Distilled water To make | 100 parts |

[Formation of Second Backcoating Layer]

The liquid coating composition for second backcoating layer was applied to the first backcoating layer to a dry thickness of 0.03 μm and dried at 170° C. for 30 seconds to form a second backcoating layer.

[Formation of Light-Heat Conversion Layer]

The components shown below were mixed while agitating with a stirrer to prepare a liquid coating composition for light-heat conversion layer.

[Formulation of liquid coating composition for light-heat conversion layer]

Infrared absorbing dye (NK-2014 available from Hayashibara Biochemical Laboratories, Inc.); a cyanine dye of formula: 7.6 parts

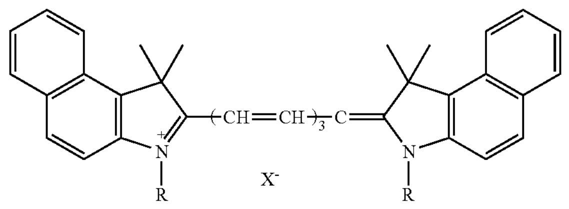

Polyimide resin of the formula shown below (Rikacoat SN-20F available from New Japan Chemical Co., Ltd.; thermal decomposition temperature: 510° C.) 29.3 parts

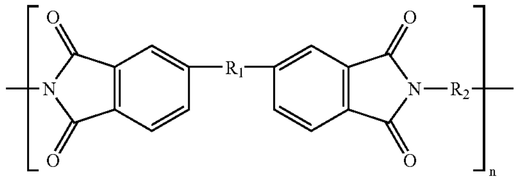

(wherein $R_1$ represents $SO_2$; and $R_2$ represents

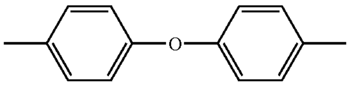

or

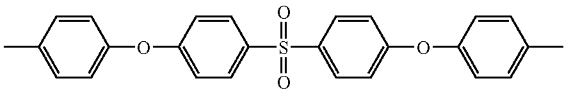

-continued

| | |
|---|---|
| Exxon Naphtha | 5.8 parts |
| N-Methylpyrrolidone (NMP) | 1500 parts |
| Methyl ethyl ketone | 360 parts |
| Fluorine type surface active agent (Magafac F-176PF, from Dainippon Ink & Chemicals, Inc.) | 0.5 part |
| Matting agent dispersion (having the following formulation) | 14.1 parts |
| [Formulation of matting agent dispersion] | |
| N-Methyl-2-pyrrolidone (NMP) | 69 parts |
| Methyl ethyl ketone | 20 parts |
| Styrene acrylic resin (Joncryl 611, from Johnson Polymer Co., Ltd.) | 3 parts |
| $SiO_2$ paticles (Seahostar KE-P150, from Nippon Shokubai Co., Ltd.) | 8 parts |

[Formation of Light-Heat Conversion Layer on Substrate Surface]

The above-described liquid coating composition for light-heat conversion layer was applied to the other side of the PETP substrate having a thickness of 75 μm with a wire bar and dried in an oven at 120° C. for 2 minutes to form a light-heat conversion layer on the substrate. The light-heat conversion layer had an optical density (OD) of 1.03 at 808 nm as measured with a UV spectrophotometer UV-240 supplied by Shimadzu Corp. A cut area of the light-heat conversion layer was observed under a scanning electron microscope (SEM) to find that the average layer thickness was 0.3 μm.

[Formation of Image Forming Layer]

[Preparation of Liquid Coating Composition for Black Image Forming Layer]

The following components were put in a kneader mill and preliminarily dispersed with shear while adding a small amount of the solvent shown. The rest of the solvent was added to the dispersion, followed by further dispersing in a sand mill for 2 hours to prepare a pigment dispersion matrix.

[Preparation of Black Pigment Dispersion Matrix]

| | |
|---|---|
| Formulation 1 | |
| Polyvinyl butyral (S-LEC B BL-SH, available from Sekisui Chemical Co., Ltd.) | 12.6 parts |
| Pigment Black 7 (Carbon Black C.I. No. 77266) (Mitsubishi Carbon Black #5, available from Mitsubishi Chemical Corp.; PVC blackness: 1) | 4.5 parts |
| Dispersant (Solsperse S-20000, from ICI) | 0.8 part |
| n-Propyl alcohol | 79.4 parts |
| Formulation 2 | |
| Polyvinyl butyral (S-LEC B BL-SH, available from Sekisui Chemical Co., Ltd.) | 12.6 parts |
| Pigment Black 7 (Carbon Black C.I. No. 77266) (Mitsubishi Carbon Black MA100; PVC blackness: 10) | 10.5 parts |
| Dispersant (Solsperse S-20000, from ICI) | 0.8 part |
| n-Propyl alcohol | 79.4 parts |

The components shown below were mixed while agitating with a stirrer to prepare a liquid coating composition for black image forming layer.

[Formulation of Liquid Coating Composition for Black Image Forming Layer]

-continued

| | |
|---|---|
| Black pigment dispersion 1/black pigment dispersion 2 = 70/30 by part | 185.7 parts |
| Polyvinyl butyral (SEC-LEC B BL-SH, available from Sekisui Chemical Co., Ltd.) | 11.9 parts |
| Waxes: | |
| (Stearamide (Newtron-2), from Nippon Fine Chemical Co., Ltd.) | 1.7 parts |
| (Behenic acid amide (Diamide BM), from Nippon Kasei Chemical Co., Ltd.) | 1.7 parts |
| (Lauramide (Diamide Y), from Nippon Kasei Chemical Co., Ltd.) | 1.7 parts |
| (Palmitamide (Diamide KP), from Nippon Kasei Chemical Co., Ltd.) | 1.7 parts |
| (Erucamide (Diamide L-200), from Nippon Kasei Chemical Co., Ltd.) | 1.7 parts |
| Oleamide (Diamide O-200, from Nippon Kasei Chemical Co., Ltd.) | 1.7 parts |
| Rosin (KE-311, from Arawaka Chemical Industries, Ltd.) | 11.4 parts |
| Surface active agent (Megafac F-176PF, from Dainippon Ink & Chemicals Inc.; solid content: 20%) | 2.1 parts |
| Inorganic pigment (MEK-K, 30% MEK solution available from Nissan Chemical Industries, Ltd.) | 7.1 parts |
| n-Propyl alcohol | 1050 parts |
| MEK | 295 parts |

The particle size distribution of the resulting coating composition for black image forming layer was measured with a laser scattering particle size distribution analyzer. As a result, the average particle size was 0.25 μm, and the proportion of particles of 1 μm or greater was 0.5%.

[Formation of Black Image Forming Layer on Light-Heat Conversion Layer Surface]

The above-described liquid coating solution for black image forming layer was applied on the surface of the above-described light-heat conversion layer with a wire bar for 1 minutes and then dried in an oven at 100° C. for 2 minutes. Thus, a black image forming layer was formed on the light-heat conversion layer. By the above-described procedure, a heat transfer sheet having a light-heat conversion layer and a black image forming layer formed on a substrate in this order (hereinafter referred to as the heat transfer sheet K; hereinafter those having a yellow image forming layer, a magenta image forming layer and a cyan image forming layer will be referred as respectively to the heat transfer sheet Y, the heat transfer sheet M and the heat transfer sheet C) was constructed.

The optical density (OD) of the heat transfer sheet K measured with Macbeth Densitomether Model TD-904 (W-filter) was 0.91. The layer thickness of the black image forming layer was 0.60 μm on average.

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 9.3 mmHg (≈1.24 kPa) in practice.

The coefficient of static friction of the image receiving layer, which is preferably of 0.2 or smaller, was 0.08 in practice.

-Preparation of Heat Transfer Sheet Y-

A heat transfer sheet Y was prepared in the same manner as for the heat transfer sheet K as described above, except for replacing the liquid coating composition for black image forming layer by a liquid coating composition for yellow image forming layer prepared according to the following formulation. The thickness of the yellow image forming layer of the heat transfer sheet Y was 0.42 μm.

[Formulation of yellow pigment dispersion matrix]

| | |
|---|---|
| Formulation of yellow pigment dispersion 1: | |
| Polyvinyl butyral | 7.1 parts |
| (S-LEC B BL-SH, from Sekisui Chemical Co., Ltd.) | |
| Pigment Yellow 180 (C.I. No. 21290) | 12.9 parts |
| (Novoperm Yellow P-HG, from Clariant (Japan) KK) | |
| Pigment dispersant (Solsperse S-20000, from ICI) | 0.6 part |
| n-Propyl alcohol | 79.4 parts |

[Formulation of yellow pigment dispersion matrix]

| | |
|---|---|
| Formulation of yellow pigment dispersion 2: | |
| Polyvinyl butyral | 7.1 parts |
| (S-LEC B BL-SH, from Sekisui Chemical Co., Ltd.) | |
| Pigment Yellow 139 (C.I. No. 56298) | 12.9 parts |
| (Novoperm Yellow M2R 70, from Clariant (Japan) KK) | |
| Pigment dispersant (Solsperse S-20000, from ICI) | 0.6 parts |
| n-Propyl alcohol | 79.4 parts |

[Liquid coating composition for yellow image forming layer]

| | |
|---|---|
| Yellow pigment dispersion matrix described above Yellow pigment dispersion 1/yellow pigment dispersion 2 = 95/5 (by part) | 126 parts |
| Polyvinyl butyral (S-LEC B BL-SH, available from Sekisui Chemical Co., Ltd.) | 4.6 parts |
| Waxes: | |
| (Stearamide (Newtron-2), from Nippon Fine Chemical Co., Ltd.) | 0.7 part |
| (Behenic acid amide (Diamide BM), from Nippon Kasei Chemical Co., Ltd.) | 0.7 part |
| (Lauramide (Diamide Y), from Nippon Kasei Chemical Co., Ltd.) | 0.7 part |
| (Palmitamide (Daimide KP), from Nippon Kasei Chemical Co., Ltd.) | 0.7 part |
| (Erucamide (Diamide L-200), from Nippon Kasei Chemical Co., Ltd.) | 0.7 part |
| (Oleamide (Diamide O-200), from Nippon Kasei Chemical Co., Ltd.) | 0.7 part |
| Nonionic surface active agent (Chemistat 1100, from Sanyo Chemical Industries, Ltd.) | 0.4 part |
| Rosin (KE-311, from Arawaka Chemical Industries, Ltd.) (composition: resin acid content: 80 to 97%; resin acid composition: abietic acid 30 to 40%, neoabietic acid 10 to 20%, dihydroabietic acid 14%, and tetrahydroabietic acid 14%)) | 2.4 parts |
| Surface active agent (Magafac F-176PF, from Dainippon Ink & Chemicals, Inc.; solid content: 20%) | 0.8 part |
| n-Propyl alcohol | 793 parts |
| MEK | 198 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 2.3 mmHg (≈0.31 kPa) in practice.

The coefficient of static friction of the image receiving layer, which is preferably of 0.2 or smaller, was 0.1 in practice.

-Preparation of Heat Transfer Sheet M-

A heat transfer sheet M was prepared in the same manner as for the heat transfer sheet K as described above, except for replacing the liquid coating composition for black image forming layer by a liquid coating composition for magenta image forming layer prepared according to the following formulation. The thickness of the magenta image forming layer of the heat transfer sheet M was 0.38 μm.

[Formulation of magenta pigment dispersion matrix]

| | |
|---|---|
| Formulation of magenta pigment dispersion 1: | |
| Polyvinyl butyral | 12.6 parts |
| (Denka Butyral #2000-L, available from Denki Kagaku Kogyo KK; Vicat softening point: 57° C.) | |
| Pigment Red 57:1 (C.I. No. 15850:1) (Symuler Brilliant Carmine 6B-229, from Dainippon Ink & Chemicals Inc.) | 15.0 parts |
| Pigment dispersant (Solsperse S-20000, from ICI) | 0.6 part |
| n-Propyl alcohol | 80.4 parts |

[Formulation of magenta pigment dispersion matrix]

| | |
|---|---|
| Formulation of magenta pigment dispersion 2: | |
| Polyvinyl butyral | 12.6 parts |
| (Denka Butyral #2000-L, available from Denki Kagaku Kogyo KK; Vicat softening point: 57° C.) | |
| Pigment Red 57:1 (C.I. No. 15850:1) | 15.0 parts |
| (Lionel Red 6B-4290G, from Toyo Ink Mgf. Co., Ltd.) | |
| Pigment dispersant (Solsperse S-20000, from ICI) | 0.6 part |
| n-Propyl alcohol | 79.4 parts |

[Formulation of Liquid coating composition for magenta image forming layer]

| | |
|---|---|
| Magenta pigment dispersion described above 1/magenta pigment dispersion 2 = 95/5 by part | 163 parts |
| Polyvinyl butyral | 4.0 parts |
| (Denka Butyral #2000-L, available from Denki Kagaku Kogyo KK; Vicat softening point: 57° C.) | |
| Waxes: | |
| (Stearamide (Newtron-2), from Nippon Fine Chemical Co., Ltd.) | 1.0 part |
| (Behenic acid amide (Diamide) BM, from Nippon Kasei Chemical Co., Ltd.) | 2.0 parts |
| (Palmitamide (Daimide) KP, from Nippon Kasei Chemical Co., Ltd.) | 1.0 part |
| (Erucamide (Diamide L-200), from Nippon Kasei Chemical Co., Ltd.) | 1.0 part |
| (Oleamide (Damide O-200), from Nippon Kasei Chemical Co., Ltd.) | 1.0 part |
| Nonionic surface active agent | 0.7 part |
| (Chemistat 1100, from Sanyo Chemical Industries, Ltd.) | |
| Rosin | 4.6 parts |
| (KE-311, from Arawaka Chemical Industries, Ltd.; resin acid content: 80 to 97% (composed of abietic acid 30 to 40%, neoabietic acid 10 to 20%, dihydroabietic acid 14%, and tetrahydroabietic acid 14%)) | |
| Pentaerythritol tetraacrylate (NK Ester A-TMMT, from Shin-Nakamura Chemical Co., Ltd.) | 2.5 parts |
| Surface active agent (Megafac F-176PF, from Dainippon Ink & Chemicals Inc.; solid content: 20%) | 1.3 part |
| n-Propyl alcohol | 848 parts |
| Methyl ethyl ketone | 246 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 3.5 mmHg (≈0.47 kPa) in practice.

The coefficient of static friction of the image receiving layer, which is preferably of 0.2 or smaller, was 0.08 in practice.

-Preparation of Heat Transfer Sheet C-

A heat transfer sheet C was prepared in the same manner as for the heat transfer sheet K as described above, except for replacing the liquid coating composition for black image forming layer by a liquid coating composition for cyan image forming layer prepared according to the following formulation. The thickness of the cyan image forming layer of the heat transfer sheet M was 0.45 μm.

[Formulation of cyan pigment dispersion matrix]

Formulation of cyan pigment dispersion 1:

| | |
|---|---|
| Polyvinyl butyral (S-LEC B BL-SH, available from Sekisui Chemical Co., Ltd.) | 12.6 parts |
| Pigment Blue 15:4 (C.I. No. 74160) (Cyanine Blue 700-10FG, from Toyo Ink Mfg. Co., Ltd.) | 15.0 parts |
| Pigment dispersant (PW-36, from Kusumoto Chemicals Ltd.) | 0.8 part |
| n-Propyl alcohol | 110 parts |

[Formulation of cyan pigment dispersion matrix]

Formulation of cyan pigment dispersion 2:

| | |
|---|---|
| Polyvinyl butyral (S-LEC B BL-SH, available from Sekisui Chemical Co., Ltd.) | 12.6 parts |
| Pigment Red 15 (C.I. No. 74160) (Lionel Blue 7027, from Toyo Ink Mgf. Co., Ltd.) | 15.0 parts |
| Pigment dispersant (PW-36, from Kusumoto Chemicals Ltd.) | 0.8 part |
| n-Propyl alcohol | 110 parts |

[Formulation of liquid coating composition for image forming layer]

| | |
|---|---|
| Cyan pigment dispersion described above 1/cyan pigment dispersion 2 = 90:10 by part | 118 parts |
| Polyvinyl butyral (S-LEC B BL-SH, available from Sekisui Chemical Co., Ltd.) | 5.2 parts |
| Inorganic pigment MEK-ST | 1.3 part |
| Waxes: | |
| (Stearamide (Newtron-2), from Nippon Fine Chemical Co., Ltd.) | 1.0 part |
| (Behenic acid amide (Diamide BM), from Nippon Kasei Chemical Co., Ltd.) | 1.0 part |
| (Lauramide (Diamide Y), from Nippon Kasei Chemical Co., Ltd.) | 1.0 part |
| (Palmitamide (Daimide KP), from Nippon Kasei Chemical Co., Ltd.) | 1.0 part |
| (Erucamide (Diamide L-200), from Nippon Kasei Chemical Co., Ltd.) | 1.0 part |
| (Oleamide (Damide O-200), from Nippon Kasei Chemical Co., Ltd.) | 1.0 part |
| Rosin (KE-311, from Arawaka Chemical Industries, Ltd.; resin acid content: 80 to 97% (composed of abietic acid 30 to 40%, neoabietic acid 10 to 20%, dihydro-abietic acid 14%, and tetrahydroabietic acid 14%)) | 2.8 parts |
| Pentaerythritol tetraacrylate (NK Ester A-TMMT, from Shin-Nakamura Chemical Co., Ltd.) | 1.7 parts |
| Surface active agent (Megafac F-176PF, from Dainippon Ink & Chemicals Inc.; solid content: 20%) | 1.7 parts |
| n-Propyl alcohol | 890 parts |
| Methyl ethyl ketone | 247 parts |

The physical properties of the image forming layer thus obtained were as follows.

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 7.0 mmHg (≈0.93 kPa) in practice.

The coefficient of static friction of the image receiving layer, which is preferably of 0.2 or smaller, was 0.08 in practice.

-Preparation of Image Receiving Sheet-

A liquid coating composition for cushioning layer and a liquid coating composition for image receiving layer were prepared according to the following formulations.

[Formulation of liquid coating composition for cushioning layer]

| | |
|---|---|
| Vinyl chloride-vinyl acetate copolymer (main binder) (MPR-TSL, available from Nisshin Chemical Industry Co., Ltd.) | 20 parts |
| Plasticizer (Paraplex G-40, available from The C. P. Hall Co.) | 10 parts |
| Fluorine-type surface active agent (coating aid) (Megafac F-177, available from Dainippon Ink & Chemicals, Inc.) | 0.5 part |
| Antistatic agent (SAT-5 Supper (IC), quaternary ammonium salt available from Nihon Jynyaku Co., Ltd.) | 0.3 part |
| Methyl ethyl ketone | 60 parts |
| Toluene | 10 parts |
| N,N-Dimethylformamide | 3 parts |

[Formulation of liquid coating composition for image receiving layer]

| | |
|---|---|
| Polyvinyl butyral (Denka Butyral #4000-1, available from Denki Kagaku Kogyo KK; number-average molecular weight: 1000) | 6 parts |
| Antistatic agent (Sanstat 2012A, available from Sanyo Chemical Industries, Ltd.) | 0.7 part |
| n-Propyl alcohol | 23 parts |
| Methanol | 46 parts |
| 1-Methoxy-2-propanol | 23 parts |

The liquid coating composition for cushioning layer as described above was applied to a white PETP (polyethylene terephthalate) substrate having a thickness of 130 μm (Lumirror #130E58, available from Toray Industries, Inc.) with a small-width applicator and dried. Next, the liquid coating composition 1 for image receiving layer was applied and dried to give an image receiving sheet. The coating amounts were controlled so as to give the cushion layer had a dry thickness of about 20 μm and the image receiving layer had a thickness of about 2 μm. The white PETP substrate used as a substrate is a void-containing PETP layer (thickness: 116 μm; void: 20%) laminated on both sides thereof with a titanium oxide-containing PETP layer (thickness: 7 μm; titanium oxide content: 2%) (total thickness: 130 μm; specific gravity: 0.8). The Ra, Rz and Rz/Ra of the obtained image receiving layer were as follows. Each of the thus prepared materials was wound into a roll and stored at room temperature for one week before using in image formation with laser light.

| | |
|---|---|
| Surface tension: | 23 mN/m |
| Viscosity: | 23 mPa · S |
| Solid content: | 6.4% |
| Coating amount: | 57 ml/$m^2$ |
| Content of organic solvents with b.p. of 70° C. or lower (based on total organic solvents) | 50% by mass |

-Formation of Transfer Image-

Using Luxel FINALPROOF 5600 supplied by Fuji Photo Film Co., Ltd. as an image formation system, a transfer image onto printing paper was obtained in accordance with the image formation sequence of the above system and the printing paper transfer method of the system.

The image receiving sheet (56 cm×79 cm) was wound by suction around a recording drum having a diameter of 38 cm through suction holes of 1 mm in diameter of the drum (one hole per 3 cm by 8 cm area).

Next, the above-described heat transfer sheet K (black) cut into a size of 61 cm×84 cm was superposed on the image receiving sheet with its four edges extending evenly from the edges of the image receiving sheet while being squeezed with a squeeze roller so that the two sheets were brought into intimate contact while allowing entrapped air to escape and be sucked. The degree of vacuum of the drum, measured with the suction holes closed, was (atmospheric pressure minus 150) mmHg (≈81.13 kPa). The above-described drum was rotated, and the laminate was scanned with semiconductor laser light having a wavelength of 808 nm and a spot diameter of 7 μm on the surface of the light-heat conversion layer, the laser being moving in a direction (sub scan direction) perpendicular to the drum rotating direction (main scan direction) to carry out recording of a laser image (scanning). The laser irradiation was carried out under the following conditions. The laser beams employed were multibeams arranged in a two-dimensional parallelogram consisting of five lines of laser beams arrayed in the main scan direction and three rows of laser beams arrayed in the sub scan direction.

Laser power: 110 mW

Drum rotation: 500 rpm

Sub scanning pitch: 6.35 μm

Environment: 3 conditions including: (1) 20° C., 40% RH; (2) 23° C., 50% RH; (3) 26° C., 65% RH The exposure drum preferably has a diameter of 360 mm or longer and a drum of 380 mm in diameter was employed in practice.

The recorded image size was 515 mm×728 mm, and the resolution was 2600 dpi.

After completion of laser recording, the laminate was removed from the drum, and the heat transfer sheet K was stripped by hand off the image receiving sheet. As a result, it was confirmed that the irradiated parts of the image forming layer of the heat transfer sheet K had been exclusively transferred from the heat transfer sheet K to the image receiving sheet.

In the same manner as described above, images were transferred from the above-described heat transfer sheet Y, heat transfer sheet M and heat transfer sheet C to the image receiving sheets. The four-color images thus transferred were re-transferred onto printing paper to form a multicolor image. Thus, multicolor images, which showed excellent image qualities and stable transfer densities, could be obtained by high-energy recording with laser light comprising two-dimensionally arranged multibeams under different temperature/humidity conditions.

Transfer to printing paper was performed by using a heat transfer apparatus provided with an insertion table made of a material having a dynamic frictional coefficient against a polyethylene terephthalate of from 0.1 to 0.7. The transporting speed was 15 to 50 mm/sec. The heat rolls were made of a material having a Vickers hardness of 70 (a preferred Vickers hardness of the material is 10 to 100).

The obtained images were retained in favorable state at the three environmental temperatures/humidities.

COMPARATIVE EXAMPLE 1-1

An image receiving sheet was prepared in the same manner as in Example 1-1, except for replacing the liquid coating composition for image receiving layer by a liquid coating composition for image receiving layer of the following formulation. Then, a transfer image was formed.

[Liquid Coating Solution for Image Receiving Layer]

| | |
|---|---|
| Polyvinyl butyral (Denka Butyral #4000-1, available from Denki Kagaku Kogyo KK; number-average molecular weight: 1000) | 6 parts |

-continued

| | |
|---|---|
| Antistatic agent (Sanstat 2012A, available from Sanyo Chemical Industries, Ltd.) | 0.7 part |
| n-Propyl alcohol | 34 parts |
| Methanol | 69 parts |
| 1-Methoxy-2-propanol | 34 parts |

The physical properties, etc. of the liquid coating solution for image receiving layer employed were as follows.

| | |
|---|---|
| Surface tension: | 23 mN/m |
| Viscosity: | 6 mPa · S |
| Solid content: | 4.4% |
| Coating amount: | 74 ml/m$^2$ |
| Content of organic solvents with b.p. of 70° C. or lower (based on total organic solvents) | 50% by mass |

COMPARATIVE EXAMPLE 1-2

An image receiving sheet was prepared in the same manner as in Example 1-1, except for replacing the liquid coating composition for image receiving layer by a liquid coating composition for image receiving layer of the following formulation. Then, a transfer image was formed.

[Liquid Coating Solution for Image Receiving Layer]

| | |
|---|---|
| Polyvinyl butyral (Denka Butyral #4000-1, available from Denki Kagaku Kogyo KK; number-average molecular weight: 1000) | 8 parts |
| Fine acrylic particles (matting agent, average particle size 5 μm) (MX500 available from Soken Kagaku) | 0.2 part |
| Antistatic agent (Sanstat 2012A, available from Sanyo Chemical Industries, Ltd.) | 0.7 part |
| Surface active agent (Megafac F-177, from Dainippon Ink & Chemicals Inc) | 0.1 part |
| n-Propyl alcohol | 20 parts |
| Methanol | 50 parts |
| 1-Methoxy-2-propanol | 20 parts |

The physical properties, etc. of the liquid coating solution for image receiving layer employed were as follows.

| | |
|---|---|
| Surface tension: | 18 mN/m |
| Viscosity: | 28 mPa · S |
| Solid content: | 8.7% |
| Coating amount: | 58 ml/m$^2$ |
| Content of organic solvents with b.p. of 70° C. or lower (based on total organic solvents) | 56% by mass |

COMPARATIVE EXAMPLE 1-3

An image receiving sheet was prepared in the same manner as in Example 1-1, except for replacing the liquid coating composition for image receiving layer by a liquid coating composition for image receiving layer of the following formulation. Then, a transfer image was formed.

[Liquid Coating Solution for Image Receiving Layer]

| | |
|---|---|
| Polyvinyl butyral (Denka Butyral #4000-1, available from Denki Kagaku Kogyo KK; number-average molecular weight: 1000) | 8 parts |
| Fine acrylic particles(matting agent, average particle size 1.5 μm) (MX150 available from Soken Kagaku) | 0.9 part |
| Antistatic agent (Sanstat 2012A, available from Sanyo Chemical Industries, Ltd.) | 0.7 part |
| Surface active agent(Megafac F-177, from Dainippon Ink & Chemicals Inc) | 0.1 part |
| n-Propyl alcohol | 20 parts |
| Methanol | 50 parts |
| 1-Methoxy-2-propanol | 20 parts |

The physical properties, etc. of the liquid coating solution for image receiving layer employed were as follows.

| | |
|---|---|
| Surface tension: | 18 mN/m |
| Viscosity: | 27 mPa · S |
| Solid content: | 9.2% |
| Coating amount: | 58 ml/m$^2$ |
| Content of organic solvents with b.p. of 70° C. or lower (based on total organic solvents) | 22% by mass |

<Evaluation Test on Dot Defects>

Concerning the image receiving sheets used in Example 1-1 and Comparative Examples 1-1 to 1-3, 50% halftone images were printed using the heat transfer sheet M and each of the above-described image receiving sheets. Then defects per halftone visible under a 75-magnifying lens (175 lines/inch). Thus, an average of 10 halftones were counted. Table 1 shows the results.

<Evaluation Test on White Spots>

The images printed in the evaluation test on dot defects were observed with the naked eye and white spots of 1 mm or larger in diameter per A2 size were counted. Table 1 shows the results.

following formulation in preparing the liquid coating composition for light-heat conversion layer. The physical properties of the light-heat conversion layer and the image forming layer of each heat transfer sheet thus obtained were substantially the same as those obtained in Example 1-1. The image forming layer of each heat transfer sheet had the following physical properties in addition to the physical properties shown in Example 1-1. The deformation percentage of each light-heat conversion layer is also shown.

[Matting Agent Dispersion]

10 parts of true spherical silica powder having an average particle size of 1.5 μm (Seahostar KE-P150, from Nippon Shokubai Co., Ltd.), 2 parts of a dispersant polymer (an acrylic ester-styrene copolymer Joncryl 611, from Johnson Polymer Co., Ltd.), 16 parts of methyl ethyl ketone, and 64 parts of N-methylpyrrolidone were put in a 200 ml polyethylene container together with 30 parts of glass beads having a diameter of 2 mm. The mixture in the container was dispersed in a paint shaker supplied by Toyo Seiki Co., Ltd. for 2 hours to prepare a dispersion of fine silica particles.

(Physical Properties of Image Forming Layer of Heat Transfer Sheet K)

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 9.3 mmHg (≈1.24 kPa) in practice.

The coefficient of static friction of the image receiving layer, which is preferably of 0.2 or smaller, was 0.08 in practice.

The surface energy was 29 mJ/m$^2$. The water contact angle was 94.8°. The reflection optical density was 1.82. The layer thickness was 0.60 μm while the OD/layer thickness was 3.03.

| | Ra (μm) on image receiving sheet surface | Rz (μm) on image receiving sheet surface | Rz/Ra | Benard cells on surface | No. of dot defects | No. of white spots |
|---|---|---|---|---|---|---|
| Ex. 1 | 0.23 | 1.19 | 5.0 | Yes | 0 | 1 |
| C. Ex. 1-1 | 0.78 | 3.90 | 5.0 | Yes | 3 | 1 |
| C. Ex. 1-2 | 0.12 | 2.91 | 24.2 | No | 4 | 1 |
| C. Ex. 1-3 | 0.06 | 1.50 | 25.0 | No | 1 | 10 |

As the results given in Table 1 clearly shows, the multicolor image forming material using the image receiving sheet obtained in Example 1 was obviously superior in the multicolor image forming materials using the image receiving sheets obtained in Comparative Examples 1-1 to 1-3 in the results of the evaluation test on dot defects and the evaluation test on white spots. In the image receiving sheets of Comparative Examples 1-2 and 1-3 containing no fluorine type surface active agent showed no Benard cell on surface.

EXAMPLE 2-1

-Preparation of Heat Transfer Sheets K, Y, M and C-

Heat transfer sheets K (black), Y (yellow), M (magenta) and C (cyan) were prepared in the same manner as in Example 1-1, except using a matting agent dispersion of the When irradiated with a laser beam having a light intensity of at least 1000 W/mm$^2$ on the exposed surface at a linear speed of at least 1 m/sec, the deformation percentage of the light-heat conversion layer was 168%.

(Physical Properties of Image Forming Layer of Heat Transfer Sheet Y)

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 2.3 mmHg (≈0.31 kPa) in practice.

The coefficient of static friction of the image receiving layer, which is preferably of 0.2 or smaller, was 0.1 in practice.

The surface energy was 24 mJ/$m^2$. The water contact angle was 108.1°. The reflection optical density was 1.01. The layer thickness was 0.42 μm while the OD/layer thickness was 2.40.

When irradiated with a laser beam having a light intensity of at least 1000 W/$mm^2$ on the exposed surface at a linear speed of at least 1 m/sec, the deformation percentage of the light-heat conversion layer was 150%.

(Physical Properties of Image Forming Layer of Heat Transfer Sheet M)

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 3.5 mmHg (≈0.47 kPa) in practice.

The coefficient of static friction of the image receiving layer, which is preferably of 0.2 or smaller, was 0.08 in practice.

The surface energy was 25 mJ/$m^2$. The water contact angle was 98.8°. The reflection optical density was 1.51. The layer thickness was 0.38 μm while the OD/layer thickness was 3.97.

When irradiated with a laser beam having a light intensity of at least 1000 W/$mm^2$ on the exposed surface at a linear speed of at least 1 m/sec, the deformation percentage of the light-heat conversion layer was 160%.

(Physical Properties of Image Forming Layer of Heat Transfer Sheet C)

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 7.0 mmHg (≈0.93 kPa) in practice.

The coefficient of static friction of the image receiving layer, which is preferably of 0.2 or smaller, was 0.08 in practice.

The surface energy was 25 mJ/$m^2$. The water contact angle was 98.8°. The reflection optical density was 1.59. The layer thickness was 0.45 μm while the OD/layer thickness was 3.03.

When irradiated with a laser beam having a light intensity of at least 1000 W/$mm^2$ on the exposed surface at a linear speed of at least 1 m/sec, the deformation percentage of the light-heat conversion layer was 165%.

-Preparation of Image Receiving Sheet-

A liquid coating composition for cushion layer of the same formulation as in Example 1-1 and a liquid coating composition for image receiving layer of the following formulation were prepared.

[Liquid Coating Composition for Image Receiving Layer]

| | |
|---|---|
| Polyvinyl butyral (PVB)(S-LEC B BL-SH, available from Sekisui Chemical Co., Ltd.) | 5.2 parts |
| Styrene maleic acid half-ester (Oxylac SH-128, available from Nippon Shokubai Co., Ltd.) | 2.8 parts |
| Antistatic agent (Sanstat 2012A, available from Sanyo Chemical Industries, Ltd.) | 0.7 part |
| Surface active agent(Megafac F-177, available from Dainippon Ink & Chemicals Inc) | 0.1 parts |
| n-Propyl alcohol | 20 parts |
| Methanol | 20 parts |
| 1-Methoxy-2-propanol | 50 parts |

The liquid coating composition for cushioning layer as described above was applied to a white PETP (polyethylene terephthalate) substrate having a thickness of 130 μm (Lumirror #130E58, available from Toray Industries, Inc.) with a small-width applicator and dried. Next, the liquid coating composition 1 for image receiving layer was applied and dried. The coating amounts were controlled so as to give the cushion layer had a dry thickness of about 20 μm and the image receiving layer had a thickness of about 2 μm. The white PETP substrate used as a substrate is a void-containing plastic substrate (thickness: 116 μm; void: 20%) laminated on both sides thereof with a titanium oxide-containing PETP layer (thickness: 7 μm; titanium oxide content: 2%) (total thickness: 130 μm; specific gravity: 0.8). The thus prepared material was wound into a roll and stored at room temperature for one week before using in image formation with laser light.

The physical properties of the image receiving layer and the cushion layer thus obtained were as follows.

The surface roughness Ra, which is preferably from 0.4 to 0.01 μm, was 0.02 μm in practice.

The surface waviness of the image receiving layer, which is preferably 2 μm or less, was 1.2 μm in practice.

The smooster value of the image receiving layer, which is preferably 0.5 to 50 mmHg (≈0.0665 to 6.65 kPa) at 23° C. and 55% RH, was 0.8 mmHg (≈0.11 kPa) in practice.

The coefficient of static friction of the image receiving layer, which is preferably of 0.8 or smaller, was 0.37 in practice.

The surface energy of the image receiving layer was 29 mJ/$m^2$ and the water contact angle was 87.00.

The elastic modulus of the image receiving layer was 700 MPa.

The elastic modulus of the cushion layer was 250 MPa.

The elastic moduli of the image receiving layer and the cushion layer were measured in the following method. Measurement of elastic modulus of cushion layer .

Using a multi-purpose tensile-compressive tester Tensilon RTM-100 (available from Orientec), measurement was made at a tensile speed of 10 m/min.

A sample of 16 μm (2 cm×5 cm) in film thickness was formed on a Teflon sheet and tested.

-Formation of Transfer Image-

Using Luxel FINALPROOF 5600 supplied by Fuji Photo Film Co., Ltd. as a recording apparatus in the image formation system as shown in FIG. 4, a transfer image onto printing paper was obtained in accordance with the image formation sequence of the above system and the printing paper transfer method of the system.

The image receiving sheet (56 cm×79 cm) prepared above was wound by suction around a recording drum having a diameter of 38 cm through suction holes of 1 mm in diameter of the drum (one hole per 3 cm by 8 cm area). Next, the above-described heat transfer sheet K (black) cut into a size of 61 cm×84 cm was superposed on the image receiving sheet with its four edges extending evenly from the edges of the image receiving sheet while being squeezed with a squeeze roller so that the two sheets were brought into intimate contact while allowing entrapped air to escape and be sucked. The degree of vacuum of the drum, measured with the suction holes closed, was (atmospheric pressure minus 150) mmHg (≈81.13 kPa). The above-described drum was rotated, and the laminate was scanned with semiconductor laser light having a wavelength of 808 nm and a spot diameter of 7 μm on the surface of the light-heat conversion layer, the laser being moving in a direction (sub scan direction) perpendicular to the drum rotating direction (main scan direction) to carry out recording of a laser image (scanning). The laser irradiation was carried out under the following conditions. The laser beams employed were multibeams arranged in a two-dimensional parallelogram consisting of five lines of laser beams arrayed in the main scan direction and three rows of laser beams arrayed in the sub scan direction.

Laser power: 110 mW

Drum rotation: 500 rpm

Sub scanning pitch: 6.35 μm

Environment: 3 conditions including: (1) 20° C., 40% RH; (2) 23° C., 50% RH; (3) 26° C., 65% RH The exposure drum preferably has a diameter of 360 mm or longer and a drum of 380 mm in diameter was employed in practice.

The recorded image size was 515 mm×728 mm, and the resolution was 2600 dpi.

After completion of laser recording, the laminate was removed from the drum, and the heat transfer sheet K was stripped by hand off the image receiving sheet. As a result, it was confirmed that the irradiated parts of the image forming layer of the heat transfer sheet K had been exclusively transferred from the heat transfer sheet K to the image receiving sheet.

In the same manner as described above, images were transferred from the above-described heat transfer sheet Y, heat transfer sheet M and heat transfer sheet C to the image receiving sheets. The four-color images thus transferred were re-transferred onto printing paper to form a multicolor image. Thus, multicolor images, which showed excellent image qualities and stable transfer densities, could be obtained by high-energy recording with laser light comprising two-dimensionally arranged multibeams under different temperature/humidity conditions.

Transfer to printing paper was performed by using a wood-free paper sheet (Green Daio™). In the transfer, use was made of a heat transfer apparatus provided with an insertion table made of a material having a dynamic frictional coefficient against a polyethylene terephthalate of from 0.1 to 0.7. The transporting speed was 15 to 50 mm/sec. The heat rolls were made of a material having a Vickers hardness of 70 (a preferred Vickers hardness of the material is 10 to 100).

The obtained images were retained in favorable state at the three environmental temperatures/humidities.

Transferability to the wood-free paper using the system as described above, image qualities of the obtained images, etc. were evaluated in accordance with the following method. Table 2 shows the results.

<Transferability to Wood-Free Paper>

○: Completely transferred without any lifting or unevenness.

Δ: Some lifting and glitziness are observed.

X: Untransferred parts remain.

<Stickiness of Image>

After transferring to printing paper, several sheets (5 cm×5 cm) of the wood-free paper were superimposed and a 1.25 kgf load was applied thereon. After allowing to stand in dry environment at 45° C. for 3 days, evaluation was made based on sticking of the sheets.

○: No sticking.

Δ: Some sticking.

X: Serious sticking.

<Defect Due to Dust or Debris>

(Missing or White Spot in Image Caused by Dust or Debris)

○: No defect.

Δ: Defects in some parts.

X: Tremendous defects.

Table 2 shows the results.

EXAMPLES 2-2 TO 2-3

COMPARATIVE EXMAPLES 2-1 TO 2-3

The procedure of Example 2-1 was followed except for changing the type and content of the binder to be added in the liquid coating composition for image receiving layer in Example 2-1 as listed in Table 2. In each case, images were re-transferred to printing paper to form a multicolor image. As a result, it was possible to form a multicolor image, which Showed excellent image qualities and stable transfer densities, by high-energy recording with laser light comprising two-dimensionally arranged multibeams under different temperature/humidity conditions.

Transferability to printing paper (wood-free paper), image qualities of the obtained images, etc. were evaluated as in Example 2-1. Table 2 shows the results.

TABLE 2

| | Binder in image receiving layer | Elastic modulus of image receiving layer (MPa) | Elastic modulus of cushion layer (MPa) | Transferability to wood-free paper | Stickiness of image | Defects due to dust and debris |
|---|---|---|---|---|---|---|
| EX. 2-1 | PVB (BL-1) Oxylac SH-128 | 700 | 250 | ○ | ○ | ○ |
| Ex. 2-2 | PVB (BX-10) | 800 | 250 | ○ | ○ | ○ |
| Ex. 2-3 | PVB (BX-10) Takelac EF-8911 | 950 | 40 | Δ | ○ | ○ |
| C. Ex. 2-1 | PVB (BL-10) Oxylac SH-128 | 750 | 1585 | X | ○ | X |
| C. Ex. 2-3 | Yodosol A5801 | 1 | 73 | Δ to X | X | ○ |

The binders presented in the above Table 2 are as follows.

PVB (BL-1): polyvinyl butyral, S-LEC B BL-SH™, available from Sekisui Chemical Co., Ltd.

PVB (BL-10): polyvinyl butyral, S-LEC BBL-10™, available from Sekisui Chemical Co., Ltd.

PVB (BX-10): polyvinyl butyral, S-LEC B BX-10™, available from Sekisui Chemical Co., Ltd.

Oxylac SH-128: Styrene maleic acid half-ester, available from Nippon Shokubai Co., Ltd.

Takelac EF-8911: polyurethane resin, available from Takeda Chemical Industries, Ltd.

Yodosol A5801: acrylic latex, available from Kanebo NSC, Ltd.

The results given in Table 2 indicate that the multicolor image forming materials according to the present invention satisfying the requirements in the elastic modlui of image receiving layer and cushion layer of image receiving sheet (i.e., each falling within the scope as specified in the present invention) were improved in image transferability form image receiving layer to wood-free paper, showed little stickiness in transferred image and presented high-quality image free from any defects due to dust or debris.

EXAMPLE 3-1

-Preparation of Heat Transfer Sheets K, Y, M and C-

Heat transfer sheets K (black), Y (yellow), M (magenta) and C (cyan) were prepared in the same manner as in Example 1-1, except using a matting agent dispersion of the following formulation in preparing the liquid coating composition for light-heat conversion layer. The physical properties of the light-heat conversion layer and the image forming layer of each heat transfer sheet thus obtained were substantially the same as those obtained in Example 1-1. The image forming layer of each heat transfer sheet had the following physical properties in addition to the physical properties shown in Example 1-1. The deformation percentage of each light-heat conversion layer is also shown.

[Matting Agent Dispersion]

10 parts of true spherical silica powder having an average particle size of 1.5 μm (Seahostar KE-P150, from Nippon Shokubai Co., Ltd.), 2 parts of a dispersant polymer (an acrylic ester-styrene copolymer Joncryl 611, from Johnson Polymer Co., Ltd.), 16 parts of methyl ethyl ketone, and 64 parts of N-methylpyrrolidone were put in a 200 ml polyethylene container together with 30 parts of glass beads having a diameter of 2 mm. The mixture in the container was dispersed in a paint shaker supplied by Toyo Seiki Co., Ltd. for 2 hours to prepare a dispersion of fine silica particles.

(Physical Properties of Image Forming Layer of Heat Transfer Sheet K)

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 9.3 mmHg (≈1.24 kPa) in practice.

The coefficient of static friction of the image receiving layer, which is preferably of 0.2 or smaller, was 0.08 in practice.

The surface energy was 29 mJ/m$^2$. The water contact angle was 94.8°.

The reflection optical density was 1.82. The layer thickness was 0.60 μm while the OD/layer thickness was 3.03.

When irradiated with a laser beam having alight intensity of at least 1000 W/mm$^2$ on the exposed surface at a linear speed of at least 1 m/sec, the deformation percentage of the light-heat conversion layer was 168%.

(Physical Properties of Image Forming Layer of Heat Transfer Sheet Y)

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 2.3 mmHg (≈0.31 kPa) in practice.

The coefficient of static friction of the image receiving layer, which is preferably of 0.2 or smaller, was 0.1 in practice.

The surface energy was 24 mJ/m$^2$. The water contact angle was 108.1°. The reflection optical density was 1.01. The layer thickness was 0.42 μm while the OD/layer thickness was 2.40.

When irradiated with a laser beam having a light intensity of at least 1000 W/mm$^2$ on the exposed surface at a linear speed of at least 1 m/sec, the deformation percentage of the light-heat conversion layer was 150%.

(Physical Properties of Image Forming Layer of Heat Transfer Sheet M)

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 3.5 mmHg (≈0.47 kPa) in practice.

The coefficient of static friction of the image receiving layer, which is preferably of 0.2 or smaller, was 0.08 in practice.

The surface energy was 25 mJ/m$^2$ The water contact angle was 98.8°. The reflection optical density was 1.51. The layer thickness was 0.38 μm while the OD/layer thickness was 3.97.

When irradiated with a laser beam having a light intensity of at least 1000 W/mm$^2$ on the exposed surface at a linear speed of at least 1 m/sec, the deformation percentage of the light-heat conversion layer was 160%.

(Physical Properties of Image Forming Layer of Heat Transfer Sheet C)

The surface hardness of the image forming layer, which is preferably 10 g or more measured with a sapphire stylus, was 200 g or more in practice.

The smooster value of the image forming layer, which is preferably 0.5 to 50 mmHg (≈0.0.0665 to 6.65 kPa) at 23° C. and 55% RH, was 7.0 mmHg (≈0.0.93 kPa) in practice.

The coefficient of static friction of the image receiving layer, which is preferably of 0.2 or smaller, was 0.08 in practice.

The surface energy was 25 mJ/m$^2$. The water contact angle was 98.8°. The reflection optical density was 1.59. The layer thickness was 0.45 μm while the OD/layer thickness was 3.03.

When irradiated with a laser beam having a light intensity of at least 1000 W/mm$^2$ on the exposed surface at a linear speed of at least 1 m/sec, the deformation percentage of the light-heat conversion layer was 165%.

-Preparation of Image Receiving Sheet-

A liquid coating composition for cushion layer and a liquid coating composition for image receiving layer of the following formulations were prepared.

| [Liquid coating composition for cushion layer] | |
|---|---|
| Vinyl chloride-vinyl acetate copolymer (main binder) (MPR-TSL, available from Nisshin Chemical Industry Co., Ltd.) | 10 parts |
| Plasticizer (Paraplex G-40, available from The C. P. Hall Co.) | 10 parts |
| Fluorine-type surface active agent (coating aid) (Megafac F-177, available from Dainippon Ink & Chemicals, Inc.) | 0.5 part |
| Antistatic agent (SAT-5 Supper (IC), quaternary ammonium salt available from Nihon Jynyaku Co., Ltd.) | 0.3 part |
| Methyl ethyl ketone | 60 parts |
| Toluene | 10 parts |
| N,N-Dimethylformamide | 3 parts |

| [Liquid coating composition for image receiving layer] | |
|---|---|
| Polyvinyl butyral (S-LEC B BL-SH, available from Sekisui Chemical Co., Ltd.) | 8 parts |
| Antistatic agent (Sanstat 2012A, available from Sanyo Chemical Industries, Ltd.) | 0.7 part |
| Surface active agent (Megafac F-177, available from Dainippon Ink & Chemicals Inc) | 0.1 parts |
| n-Propyl alcohol | 20 parts |
| Methanol | 20 parts |
| 1-Methoxy-2-propanol | 50 parts |

The liquid coating composition for cushioning layer as described above was applied to a white PETP (polyethylene terephthalate) substrate having a thickness of 130 μm (Lumirror #130E58, available from Toray Industries, Inc.) with a small-width applicator and dried. Next, the liquid coating composition for image receiving layer was applied and dried. The coating amounts were controlled so as to give the cushion layer had a dry thickness of about 20 μm and the image receiving layer had a thickness of about 2 μm. The white PETP substrate used as a substrate is a void-containing plastic substrate (thickness: 116 μm; void: 20%) laminated on both sides thereof with a titanium oxide-containing PETP layer (thickness: 7 μm; titanium oxide content: 2%) (total thickness: 130 μm; specific gravity: 0.8). The thus prepared material was wound into a roll and stored at room temperature for one week before using in image formation with laser light.

The physical properties of the image receiving layer and the cushion layer thus obtained were as follows.

The surface roughness Ra, which is preferably from 0.4 to 0.01 μm, was 0.02 μm in practice.

The surface waviness of the image receiving layer, which is preferably 2 μm or less, was 1.2 μm in practice.

The smooster value of the image receiving layer, which is preferably 0.5 to 50 mmHg (≈0.0665 to 6.65 kPa) at 23° C. and 55% RH, was 0.8 mmHg (≈0.11 kPa) in practice.

The coefficient of static friction of the image receiving layer, which is preferably of 0.8 or smaller, was 0.37 in practice.

The surface energy of the image receiving layer was 29 $mJ/m^2$ and the water contact angle was 87.0°.

The elastic modulus of the cushion layer was 40 MPa.

The interlayer adhesion force between the image receiving layer and the cushion layer was 8.9 g/cm.

The elastic modulus of the cushion layer and the interlayer adhesion force between the image receiving layer and the cushion layer were measured in the following method.

Measurement of Elastic Modulus of Cushion Layer

Using a multi-purpose tensile-compressive tester Tensilon RTM-100 (available from Orientec), measurement was made at a tensile speed of 10 m/min. A sample of 16 μm (2 cm×5 cm) in film thickness was formed on a Teflon sheet and tested.

Measurement of Interlayer Adhesion

Using a tester Model FGX-20-H (available form Sinpo Kogyo), measurement was made at a tensile speed of 1500 m/min. A sample (4.5 cm×12 cm) having Miler tape bonded to the film face was employed in the measurement.

-Formation of Transfer Image-

Using Luxel FINALPROOF 5600 supplied by Fuji Photo Film Co., Ltd. as a recording apparatus in the image formation system as shown in FIG. 4, a transfer image onto printing paper was obtained in accordance with the image formation sequence of the above system and the printing paper transfer method of the system.

The image receiving sheet (56 cm×79 cm) prepared above was wound by suction around a recording drum having a diameter of 38 cm through suction holes of 1 mm in diameter of the drum (one hole per 3 cm by 8 cm area). Next, the above-described heat transfer sheet K (black) cut into a size of 61 cm×84 cm was superposed on the image receiving sheet with its four edges extending evenly from the edges of the image receiving sheet while being squeezed with a squeeze roller so that the two sheets were brought into intimate contact while allowing entrapped air to escape and be sucked. The degree of vacuum of the drum, measured with the suction holes closed, was (atmospheric pressure minus 150) mmHg (≈81.13 kPa). The above-described drum was rotated, and the laminate was scanned with semiconductor laser light having a wavelength of 808 nm and a spot diameter of 7 μm on the surface of the light-heat conversion layer, the laser being moving in a direction (sub scan direction) perpendicular to the drum rotating direction (main scan direction) to carry out recording of a laser image (scanning). The laser irradiation was carried out under the following conditions. The laser beams employed were multibeams arranged in a two-dimensional parallelogram consisting of five lines of laser beams arrayed in the main scan direction and three rows of laser beams arrayed in the sub scan direction.

Laser power: 110 mW

Drum rotation: 500 rpm

Sub scanning pitch: 6.35 μm

Environment: 3 conditions including: (1) 20° C., 40% RH; (2) 23° C., 50% RH; (3) 26° C., 65% RH The exposure drum preferably has a diameter of 360 mm or longer and a drum of 380 mm in diameter was employed in practice.

The recorded image size was 515 mm×728 mm, and the resolution was 2600 dpi.

After completion of laser recording, the laminate was removed from the drum, and the heat transfer sheet K was stripped by hand off the image receiving sheet. As a result, it was confirmed that the irradiated parts of the image forming layer of the heat transfer sheet K had been exclusively transferred from the heat transfer sheet K to the image receiving sheet.

In the same manner as described above, images were transferred from the above-described heat transfer sheet Y, heat transfer sheet M and heat transfer sheet C to the image receiving sheets. The four-color images thus transferred were re-transferred onto printing paper to form a multicolor image. Thus, multicolor images, which showed excellent image qualities and stable transfer densities, could be obtained by high-energy recording with laser light comprising two-dimensionally arranged multibeams under different temperature/humidity conditions.

Transfer to printing paper was performed by using, as printing paper, a reflection paper sheet (coated paper) (smooster value (S mode) at 23° C. and 55% RH: 2.6 Kpa) and a WHITE MATTE SUMMERESET COV (mat coated paper) sheet (smooster value (S mode) at 23° C. and 55% RH: 87 Kpa). In the transfer, use was made of a heat transfer apparatus provided with an insertion table made of a material having a dynamic frictional coefficient against a polyethylene terephthalate of from 0.1 to 0.7. The transporting speed was 15 to 50 mm/sec. The heat rolls were made of a material having a Vickers hardness of 70 (a preferred Vickers hardness of the material is 10 to 100).

The obtained images were retained in favorable state at the three environmental temperatures/humidities.

Transferability to the above-described papers using the system as described above and defect due to dust and debris were evaluated in accordance with the following method.

<Transferability>

○: Completely transferred without any lifting or unevenness.

Δ: Some lifting and glitziness are observed.

X: Untransferred parts remain.

<Defect Due to Dust or Debris>

(Missing or White Spot in Image Caused by Dust or Debris)

○: No defect.

Δ: Defects in some parts.

X: Tremendous defects.

Table 3 shows the results.

Qualities of the images obtained by the system of the above-described constitution were evaluated as follows.

<Evaluation of Black Image Qualities>

Using the four-color heat transfer sheets as described above, the solid black parts and line parts of the transferred images were observed under an optical microscope. As a result, no gap was observed in the solid parts under any environmental conditions and the favorable line resolution was achieved. Thus, environmental-independent black transfer images could be obtained. Image qualities were evaluated with the naked eye in accordance with the following criteria.

-Solid Part-

○: No gap or transfer missing in recording.

Δ: Gaps or transfer missings are partly observed in recording.

X: Gaps or transfer missings are entirely observed in recording.

-Line Image Part-

○: Sharp-edged line image with high resolution.

Δ: Irregular-edged line image with partly bridging.

X: Entirely bridging.

EXAMPLES 3-2 to 3-4

COMPARATIVE EXAMPLES 3-1 TO 3-3

The procedure of Example 3-1 was followed except for changing the type and content of the binder to be added in the liquid coating composition for image receiving layer in Example 3-1 as listed in Table 3. In each case, images were re-transferred to printing paper to form a multicolor image. As a result, it was possible to form a multicolor image, which showed excellent image qualities and stable transfer densities, by high-energy recording with laser light comprising two-dimensionally arranged multibeams under different temperature/humidity conditions.

Images transferred to printing paper were evaluated as in Example 3-1. Table 3 shows the results.

| | Cushion layer | | Interlayer | Image quality | | |
|---|---|---|---|---|---|---|
| | | | | Transferability to wood-free paper (paper smooster) | | Defects due to dust or debris |
| | Binder/ plasticizer (parts) | Elastic modulus (MPa) | adhesion force (g/cm) | 2.6 | 87 | |
| Ex. | | | | | | |
| 3-1 | 10/10 | 40 | 8.9 | ○ | ○ | ○ |
| 3-2 | 11/9 | 197 | 3.6 | ○ | ○ | ○ |
| 3-3 | 12/8 | 342 | 2.3 | ○ | ○ | ○ |
| 3-4 | 13/7 | 986 | 3.3 | ○ | ○ | ○ |
| C. Ex. | | | | | | |
| 3-1 | 16/4 | 1585 | 444 | ○ | X | X |
| 3-2 | 8/12 | 9 | 89 | ○ | X picking | ○ |
| 3-3 | 14/16 | 1384 | 4.0 | ○ | Δ | X |

The results given in Table 3 indicate that the multicolor image forming materials according to the present invention satisfying the requirements in the elastic modlui of image receiving layer and cushion layer of image receiving sheet and the interlayer adhesion force between the image receiving layer and the cushion layer of the image receiving sheet (i.e., each falling within the scope as specified in the present invention) presented improved image qualities.

EXAMPLE 4-1

-Preparation of Heat Transfer Sheets K, Y, M and C-

Heat transfer sheets K (black), Y (yellow), M (magenta) and C (cyan) were prepared in the same manner as in Example 1-1, except using a matting agent dispersion of the following formulation in preparing the liquid coating composition for light-heat conversion layer. The physical properties of the light-heat conversion layer and the image forming layer of each heat transfer sheet thus obtained were substantially the same as those obtained in Example 1-1. The image forming layer of each heat transfer sheet had the following physical properties in addition to the physical properties shown in Example 1-1. The deformation percentage of each light-heat conversion layer is also shown.

[Matting Agent Dispersion]

10 parts of true spherical silica powder having an average particle size of 1.5 μm (Seahostar KE-P150, from Nippon Shokubai Co., Ltd.), 2 parts of a dispersant polymer (an acrylic ester-styrene copolymer Joncryl 611, from Johnson Polymer Co., Ltd.), 16 parts of methyl ethyl ketone, and 64 parts of N-methylpyrrolidone were put in a 200 ml polyethylene container together with 30 parts of glass beads having a diameter of 2 mm. The mixture in the container was dispersed in a paint shaker supplied by Toyo Seiki Co., Ltd. for 2 hours to prepare a dispersion of fine silica particles.

(Physical Properties of Image Forming Layer of Heat Transfer Sheet K)

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 9.3 mmHg (≈1.24 kPa) in practice.

The coefficient of static friction of the image receiving layer, which is preferably of 0.2 or smaller, was 0.08 in practice.

The surface energy was 29 mJ/m$^2$. The water contact angle was 94.8°.

The reflection optical density was 1.82. The layer thickness was 0.60 μm while the OD/layer thickness was 3.03.

When irradiated with a laser beam having a light intensity of at least 1000 W/mm$^2$ on the exposed surface at a linear speed of at least 1 m/sec, the deformation percentage of the light-heat conversion layer was 168%.

(Physical Properties of Image Forming Layer of Heat Transfer Sheet Y)

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 2.3 mmHg (≈0.31 kPa) in practice.

The coefficient of static friction of the image receiving layer, which is preferably of 0.2 or smaller, was 0.1 in practice.

The surface energy was 24 mJ/m$^2$. The water contact angle was 108.1°. The reflection optical density was 1.01. The layer thickness was 0.42 μm while the OD/layer thickness was 2.40.

When irradiated with a laser beam having a light intensity of at least 1000 W/mm$^2$ on the exposed surface at a linear speed of at least 1 m/sec, the deformation percentage of the light-heat conversion layer was 150%.

(Physical Properties of Image Forming Layer of Heat Transfer Sheet M)

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 3.5 mmHg (≈0.47 kPa) in practice.

The coefficient of static friction of the image receiving layer, which is preferably of 0.2 or smaller, was 0.08 in practice.

The surface energy was 25 mJ/m$^2$. The water contact angle was 98.8°. The reflection optical density was 1.51. The layer thickness was 0.38 μm while the OD/layer thickness was 3.97.

When irradiated with a laser beam having a light intensity of at least 1000 W/mm$^2$ on the exposed surface at a linear speed of at least 1 m/sec, the deformation percentage of the light-heat conversion layer was 160%.

(Physical Properties of Image Forming Layer of Heat Transfer Sheet C)

The surface hardness of the image forming layer, which is preferably 10 g or more measured with a sapphire stylus, was 200 g or more in practice.

The smooster value of the image forming layer, which is preferably 0.5 to 50 mmHg (≈0.0665 to 6.65 kPa) at 23° C. and 55% RH, was 7.0 mmHg (≈0.93 kPa) in practice.

The coefficient of static friction of the image receiving layer, which is preferably of 0.2 or smaller, was 0.08 in practice.

The surface energy was 25 mJ/m$^2$. The water contact angle was 98.8°. The reflection optical density was 1.59. The layer thickness was 0.45 μm while the OD/layer thickness was 3.03.

When irradiated with a laser beam having a light intensity of at least 1000 W/mm$^2$ on the exposed surface at a linear speed of at least 1 m/sec, the deformation percentage of the light-heat conversion layer was 165%.

-Preparation of Image Receiving Sheet-

A liquid coating composition for cushion layer of the same formulation as in Example 1-1 and a liquid coating composition for image receiving layer of the following formulation were prepared.

[Liquid Coating Composition for Image Receiving Layer]

| | |
|---|---|
| Polyvinyl butyral (PVB) (S-LEC B BL-1, available from Sekisui Chemical Co., Ltd.) | 5.2 parts |
| Styrene maleic acid half-ester (Oxylac SH-128, available from Nippon Shokubai Co., Ltd.) | 2.8 parts |
| Antistatic agent (Sanstat 2012A, available from Sanyo Chemical Industries, Ltd.) | 0.7 part |
| Surface active agent (Megafac F-177, available from Dainippon Ink & Chemicals Inc) | 0.1 parts |
| n-Propyl alcohol | 20 parts |
| Methanol | 20 parts |
| 1-Methoxy-2-propanol | 50 parts |

The liquid coating composition for cushioning layer as described above was applied to a white PETP (polyethylene terephthalate) substrate having a thickness of 130 μm (Lumirror #130E58, available from Toray Industries, Inc.) with a small-width applicator and dried. Next, the liquid coating composition for image receiving layer was applied and dried. The coating amounts were controlled so as to give the cushion layer had a dry thickness of about 20 μm and the image receiving layer had a thickness of about 2 μm. The white PETP substrate used as a substrate is a void-containing plastic substrate (thickness: 116 μm; void: 20%) laminated on both sides thereof with a titanium oxide-containing PETP layer (thickness: 7 μm; titanium oxide content: 2%) (total thickness: 130 μm; specific gravity: 0.8). The thus prepared material was wound into a roll and stored at room temperature for one week before using in image formation with laser light.

The physical properties of the image receiving sheet, the image receiving layer constituting the image receiving sheet and the cushion layer thus obtained were as follows.

The yield stress in the machine direction (M) of the image receiving sheet was 44 MPa while the yield stress in the transverse direction (T) was 40 MPa. The ratio M/T was 1.1. The elongation in the machine direction of the image receiving sheet was 2.6% while the elongation in the transverse direction thereof was 2.4%.

The surface roughness Ra of the image receiving layer, which is preferably from 0.4 to 0.01 μm, was 0.02 μm in practice.

The surface waviness of the image receiving layer, which is preferably 2 μm or less, was 1.2 μm in practice.

The smooster value of the image receiving layer, which is preferably 0.5 to 50 mmHg (≈0.0665 to 6.65 kPa) at 23° C. and 55% RH, was 0.8 mmHg (≈0.11 kPa) in practice.

The coefficient of static friction of the image receiving layer, which is preferably of 0.8 or smaller, was 0.37 in practice.

The surface energy of the image receiving layer was 29 $mJ/m^2$ and the water contact angle was 87.00°.

The elastic modulus of the cushion layer was 40 MPa.

The elastic modulus of the cushion layer was measured in the following method.

Measurement of Elastic Modulus of Cushion Layer

Using a multi-purpose tensile-compressive tester Tensilon RTM-100 (available from Orientec), measurement was made at a tensile speed of 10 m/min. A sample of 16 μm (2 cm×5 cm) in film thickness was formed on a Teflon sheet and tested.

-Formation of Transfer Image-

Using Luxel FINALPROOF 5600 supplied by Fuji Photo Film Co., Ltd. as a recording apparatus in the image formation system as shown in FIG. 4, a transfer image onto printing paper was obtained in accordance with the image formation sequence of the above system and the printing paper transfer method of the system.

The image receiving sheet (56 cm×79 cm) prepared above was wound by suction around a recording drum having a diameter of 38 cm through suction holes of 1 mm in diameter of the drum (one hole per 3 cm by 8 cm area). Next, the above-described heat transfer sheet K (black) cut into a size of 61 cm×84 cm was superposed on the image receiving sheet with its four edges extending evenly from the edges of the image receiving sheet while being squeezed with a squeeze roller so that the two sheets were brought into intimate contact while allowing entrapped air to escape and be sucked. The degree of vacuum of the drum, measured with the suction holes closed, was (atmospheric pressure minus 150) mmHg (≈81.13 kPa). The above-described drum was rotated, and the laminate was scanned with semiconductor laser light having a wavelength of 808 nm and a spot diameter of 7 μm on the surface of the light-heat conversion layer, the laser being moving in a direction (sub scan direction) perpendicular to the drum rotating direction (main scan direction) to carry out recording of a laser image (scanning) The laser irradiation was carried out under the following conditions. The laser beams employed were multibeams arranged in a two-dimensional parallelogram consisting of five lines of laser beams arrayed in the main scan direction and three rows of laser beams arrayed in the sub scan direction.

Laser power: 110 mW

Drum rotation: 500 rpm

Sub scanning pitch: 6.35 μm

Environment: 3 conditions including: (1) 20° C., 40% RH; (2) 23° C., 50% RH; (3) 26° C., 65% RH The exposure drum preferably has a diameter of 360 mm or longer and a drum of 380 mmin diameter was employed in practice.

The recorded image size was 515 mm×728 mm, and the resolution was 2600 dpi.

After completion of laser recording, the laminate was removed from the drum, and the heat transfer sheet K was stripped by hand off the image receiving sheet. As a result, it was confirmed that the irradiated parts of the image forming layer of the heat transfer sheet K had been exclusively transferred from the heat transfer sheet K to the image receiving sheet.

In the same manner as described above, images were transferred from the above-described heat transfer sheet Y, heat transfer sheet M and heat transfer sheet C to the image receiving sheets. The four-color images thus transferred were re-transferred onto printing paper to form a multicolor image. Thus, multicolor images, which showed excellent image qualities and stable transfer densities, could be obtained by high-energy recording with laser light comprising two-dimensionally arranged multibeams under different temperature/humidity conditions.

Transfer to printing paper was performed by using, as printing paper, a wood-free paper sheet (Kinbishi RA-100, available from Mitsubishi Paper Mills Ltd.). In the transfer, use was made of a heat transfer apparatus provided with an insertion table made of a material having a dynamic frictional coefficient against a polyethylene terephthalate of from 0.1 to 0.7. The transporting speed was 15 to 50 mm/sec. The heat rolls were made of a material having a Vickers hardness of 70 (a preferred Vickers hardness of the material is 10 to 100).

The obtained images were retained in favorable state at the three environmental temperatures/humidities.

Register accuracy and image distortion of the image transferred from the image forming layer of each heat transfer sheet to the image receiving layer of the image receiving sheet were evaluated by the following method.

<Register Accuracy>

Dragonfly images were formed on both faces of an A2 sheet and the shear was evaluated.

○: Shear of from 0 to 20 μm.

Δ: Shear of from 20 to 50 μm.

X: Shear of from 50 to 200 μm.

XX: Shear exceeding 200 μm

<Image Distortion>

The final print was observed with the naked eye to examine cracking thereon.

○: No cracking.

Δ: Trace cracking.

X: Cracking with gaps less than 1 mm.

XX: Cracking with gaps 1 mm or more.

EXAMPLE 4-2

COMPARATIVE EXAMPLES 4-1 TO 4-2

The procedure of Example 4-1 was followed except for replacing the substrate employed in the image receiving sheet in Example 4-1 respectively by a polyethylene terephthalate film (U51L74, available from Teijin Chemicals, Ltd.: Example 4-2), a polyethylene terephthalate film (Lumirror #20P79, available from Toray Industries, Inc.: Comparative Example 4-1) and a linear low-density polyethylene film (Lamilon-II, available from Sekiryo Hoso) and controlling the tensile properties of the image receiving sheet and the elastic modulus of the cushion layer to the values as listed in Table 4.

In each case, transferred images on the image receiving layer were re-transferred to printing paper to form a multicolor image. As a result, it was possible to form a multicolor image, which showed excellent image qualities and stable transfer densities, by high-energy recording with laser light comprising two-dimensionally arranged multibeams under different temperature/humidity conditions, similar to Example 4-1.

Table 4 shows the results of the evaluation of the register accuracies and image distortions of the images transferred from the image forming layer of the heat transfer sheet to the image receiving layer of the image receiving sheet evaluated as in Example 4-1.

TABLE 4

| | Yield stress (MPa) | | | Elongation (%) | | Elongation | Register | Image |
|---|---|---|---|---|---|---|---|---|
| | M | T | M/T | M | T | ratio | accuracy | distortion |
| Ex. | | | | | | | | |
| 4-1 | 44 | 40 | 1.1 | 2.6 | 2.4 | 1.1 | ○ | ○ |
| 4-2 | 78 | 75 | 1.04 | 3.5 | 2.7 | 1.3 | Δ | ○ |
| C. Ex. | | | | | | | | |
| 4-1 | 23 | 25 | 0.92 | 140 | 100 | 1.4 | XX | ○ |
| 4-2 | 4 | 3.7 | 1.08 | 630 | 820 | 0.8 | XX | XX |

The results given in Table 4 indicate that the multicolor image forming materials satisfying the requirements in the tensile strength of image receiving sheet falling within the scope as specified in the present invention presented image being excellent in register accuracy and dimensional stability.

INDUSTRIAL APPLICABILITY

According to the present invention, it is possible to provide contract proofs which are suited for the film-less tendency in the present CTP generation and usable as a substitute for proofsheets or analog color proofs. These color proofs can establish color reproducibility that is acceptable by clients and comparable to prints and analog color proofs. Moreover, it is possible to provide a DDCP system which enables moire-free transfer to printing paper by using the same pigment-type colorants as used in printing inks. Further, the present invention can provide a large size (A2/B2) digital direct color proof system with a high approximation to prints which enables transfer to printing paper by using the same pigment-type colorants as used in printing inks. In the method according to the present invention, transfer to printing paper can be performed by the laser thin film heat transfer system via solid dot printing by using pigment-type colorants. Thus, it is possible to provide a multi color image forming material and a multicolor image formation method enabling the formation of a multicolor image, which showed excellent image qualities and stable transfer densities, on image receiving sheet by high-energy recording with laser light comprising two-dimensionally arranged multibeams under different temperature/humidity conditions. According to the present invention, moreover, it is possible to provide a multicolor image forming material having an image receiving sheet which suffers from little dot defects and white spots caused by unevenness on the recording drum face or dust or debris and is free from the sedimentation of particles in a liquid coating composition to be used in preparing an image receiving layer and shows stable performance compared with the one obtained by the method of adding a matting agent owing to unevenness on the image receiving layer surface constructed by Benard cells. Furthermore, the present invention provides a multicolor image forming material which has favorable transferability to wood-free paper (paper having rough surface) employed as printing paper, shows no stickiness on the image face after transfer to printing paper and has excellent blocking resistance in superposing transferred images each other, a multicolor image forming material suffering from neither image defects caused by dust or debris nor picking due to poor transfer/releasing properties in the step of transferring to printing sheet, and a multicolor image forming material which is excellent in register accuracy and shows no distortion in transferred image. In addition, a multicolor image formation method using these multicolor image forming materials with excellent performance is provided.

The invention claimed is:

1. A multicolor image forming material for laser heat transfer, comprising an image receiving sheet containing an image receiving layer and at least four heat transfer sheets having different colors including yellow, magenta, cyan and black each containing a substrate and at least a light-heat conversion layer and an image forming layer provided thereon, wherein Ra and Rz showing a surface roughness of the image receiving sheet satisfy the following relationships $3 \leqq Rz/Ra \leqq 20$ and $0.5\ \mu m \leqq Rz \leqq 3\ \mu m$, and wherein the surface roughness of the image receiving sheet is formed by Benard cells.

2. The multicolor image forming material according to claim 1, wherein the image receiving layer of the image receiving sheet is formed by using a liquid coating composition for image receiving layer which contains an organic solvent having a boiling point of 70° C. or lower in an amount of 30% by mass or more based on a total organic solvents employed and has a viscosity of 15 mPa·S or more.

3. A multicolor image formation method using a multicolor image forming material comprising an image receiving sheet containing an image receiving layer and at least four beat transfer sheets having different colors including yellow, magenta, cyan and black each containing a substrate and at least a light-heat conversion layer and an image forming layer provided thereon, the method comprising the steps of: superposing each of the heat transfer sheets being on the image receiving sheet with the image forming layer facing the image receiving layer; and irradiating with laser light to transfer an irradiated area of the image forming layer to the image receiving layer to record a multicolor image on the image receiving sheet, wherein the multicolor image forming material is a multicolor image forming material according to claim 1.

* * * * *